US008552420B2

(12) United States Patent
Levermore et al.

(10) Patent No.: US 8,552,420 B2
(45) Date of Patent: Oct. 8, 2013

(54) OLED LIGHT PANEL WITH CONTROLLED BRIGHTNESS VARIATION

(75) Inventors: Peter Levermore, Lambertville, NJ (US); Paul E. Burrows, Chatteroy, WA (US); Huiqing Pang, Newtown, PA (US); Emory Krall, Philadelphia, PA (US); Ruiqing Ma, Morristown, NJ (US)

(73) Assignee: Universal Display Corporation, Ewing, NJ (US)

( * ) Notice: Subject to any disclaimer, the term of this patent is extended or adjusted under 35 U.S.C. 154(b) by 228 days.

(21) Appl. No.: 13/206,145

(22) Filed: Aug. 9, 2011

(65) Prior Publication Data

US 2013/0037827 A1    Feb. 14, 2013

(51) Int. Cl.
*H01L 35/24* (2006.01)
*G09G 5/02* (2006.01)

(52) U.S. Cl.
USPC ................ 257/40; 257/88; 257/443; 345/589

(58) Field of Classification Search
None
See application file for complete search history.

(56) References Cited

U.S. PATENT DOCUMENTS

| | | |
|---|---|---|
| 4,769,292 A | 9/1988 | Tang et al. |
| 5,061,569 A | 10/1991 | VanSlyke et al. |
| 5,247,190 A | 9/1993 | Friend et al. |
| 5,703,436 A | 12/1997 | Forrest et al. |
| 5,707,745 A | 1/1998 | Forrest et al. |
| 5,834,893 A | 11/1998 | Bulovic et al. |
| 5,844,363 A | 12/1998 | Gu et al. |
| 6,013,982 A | 1/2000 | Thompson et al. |
| 6,087,196 A | 7/2000 | Sturm et al. |
| 6,091,195 A | 7/2000 | Forrest et al. |
| 6,097,147 A | 8/2000 | Baldo et al. |

(Continued)

FOREIGN PATENT DOCUMENTS

| | | |
|---|---|---|
| EP | 0650955 | 5/1995 |
| EP | 1725079 | 11/2006 |

(Continued)

OTHER PUBLICATIONS

Kuwabara, Yoshiyuki et al., "Thermally Stable Multilayered Organic Electroluminescent Devices Using Novel Starburst Molecules, 4,4',4"-Tri(N-carbazolyl)triphenylamine (TCTA) and 4,4',4"-Tris(3-methylphenylphenyl-amino)triphenylamine (m-MTDATA), as Hole-Transport Materials," *Adv. Mater.*, 6(9):677-679 (1994).

(Continued)

*Primary Examiner* — Alonzo Chambliss
(74) *Attorney, Agent, or Firm* — Sterne, Kessler, Goldstein & Fox P.L.L.C.

(57) ABSTRACT

Embodiments may provide a light source with a controlled brightness variation. A first device is provided that includes a substrate and a plurality of OLEDs disposed on the substrate. Each of the OLEDs includes a first electrode, a second electrode, and an organic electroluminescent (EL) material disposed between the first and the second electrodes. The plurality of OLEDs comprise a first group and a second group where a first current density is supplied to the first group of the plurality of OLEDs and a second current density that is different from the first current density is supplied to the second group of the plurality of OLEDs. Each of the plurality of OLEDs is commonly addressable and at least one of the OLEDs in the first group of OLEDs has substantially the same device structure as at least one of the OLEDs in the second group of OLEDs.

55 Claims, 27 Drawing Sheets

(56) References Cited

U.S. PATENT DOCUMENTS

| | | | |
|---|---|---|---|
| 6,294,398 B1 | 9/2001 | Kim et al. | |
| 6,303,238 B1 | 10/2001 | Thompson et al. | |
| 6,337,102 B1 | 1/2002 | Forrest et al. | |
| 6,407,408 B1 | 6/2002 | Zhou et al. | |
| 6,468,819 B1 | 10/2002 | Kim et al. | |
| 6,528,187 B1 | 3/2003 | Okada | |
| 6,664,730 B2 | 12/2003 | Weaver | |
| 6,687,266 B1 | 2/2004 | Ma et al. | |
| 6,693,296 B1 | 2/2004 | Tyan | |
| 6,800,999 B1 | 10/2004 | Duggal et al. | |
| 6,835,469 B2 | 12/2004 | Kwong et al. | |
| 6,870,196 B2 | 3/2005 | Strip | |
| 6,909,233 B2 | 6/2005 | Cok et al. | |
| 6,921,915 B2 | 7/2005 | Takiguchi et al. | |
| 7,012,585 B2 | 3/2006 | Agostinelli et al. | |
| 7,034,470 B2 | 4/2006 | Cok et al. | |
| 7,049,757 B2 | 5/2006 | Foust et al. | |
| 7,087,321 B2 | 8/2006 | Kwong et al. | |
| 7,090,928 B2 | 8/2006 | Thompson et al. | |
| 7,154,114 B2 | 12/2006 | Brooks et al. | |
| 7,198,533 B2 * | 4/2007 | Duggal et al. | 445/24 |
| 7,250,226 B2 | 7/2007 | Tokito et al. | |
| 7,279,704 B2 | 10/2007 | Walters et al. | |
| 7,332,232 B2 | 2/2008 | Ma et al. | |
| 7,338,722 B2 | 3/2008 | Thompson et al. | |
| 7,393,155 B2 | 7/2008 | Riccobene | |
| 7,393,599 B2 | 7/2008 | Thompson et al. | |
| 7,396,598 B2 | 7/2008 | Takeuchi et al. | |
| 7,431,968 B1 | 10/2008 | Shtein et al. | |
| 7,445,855 B2 | 11/2008 | Mackenzie et al. | |
| 7,534,505 B2 | 5/2009 | Lin et al. | |
| 7,576,496 B2 | 8/2009 | Duggal et al. | |
| 7,760,165 B2 | 7/2010 | Cok | |
| 2002/0034656 A1 | 3/2002 | Thompson et al. | |
| 2002/0134984 A1 | 9/2002 | Igarashi | |
| 2002/0158242 A1 | 10/2002 | Son et al. | |
| 2003/0138657 A1 | 7/2003 | Li et al. | |
| 2003/0152802 A1 | 8/2003 | Tsuboyama et al. | |
| 2003/0162053 A1 | 8/2003 | Marks et al. | |
| 2003/0175553 A1 | 9/2003 | Thompson et al. | |
| 2003/0230980 A1 | 12/2003 | Forrest et al. | |
| 2004/0036077 A1 | 2/2004 | Ise | |
| 2004/0137267 A1 | 7/2004 | Igarashi et al. | |
| 2004/0137268 A1 | 7/2004 | Igarashi et al. | |
| 2004/0174116 A1 | 9/2004 | Lu et al. | |
| 2005/0025993 A1 | 2/2005 | Thompson et al. | |
| 2005/0112407 A1 | 5/2005 | Ogasawara et al. | |
| 2005/0238919 A1 | 10/2005 | Ogasawara | |
| 2005/0244673 A1 | 11/2005 | Satoh et al. | |
| 2005/0260441 A1 | 11/2005 | Thompson et al. | |
| 2005/0260449 A1 | 11/2005 | Walters et al. | |
| 2006/0008670 A1 | 1/2006 | Lin et al. | |
| 2006/0202194 A1 | 9/2006 | Jeong et al. | |
| 2006/0240279 A1 | 10/2006 | Adamovich et al. | |
| 2006/0251923 A1 | 11/2006 | Lin et al. | |
| 2006/0263635 A1 | 11/2006 | Ise | |
| 2006/0280965 A1 | 12/2006 | Kwong et al. | |
| 2007/0190359 A1 | 8/2007 | Knowles et al. | |
| 2007/0278938 A1 | 12/2007 | Yabunouchi et al. | |
| 2008/0015355 A1 | 1/2008 | Schafer et al. | |
| 2008/0018221 A1 | 1/2008 | Egen et al. | |
| 2008/0106190 A1 | 5/2008 | Yabunouchi et al. | |
| 2008/0124572 A1 | 5/2008 | Mizuki et al. | |
| 2008/0220265 A1 | 9/2008 | Xia et al. | |
| 2008/0297033 A1 | 12/2008 | Knowles et al. | |
| 2009/0008605 A1 | 1/2009 | Kawamura et al. | |
| 2009/0009065 A1 | 1/2009 | Nishimura et al. | |
| 2009/0017330 A1 | 1/2009 | Iwakuma et al. | |
| 2009/0030202 A1 | 1/2009 | Iwakuma et al. | |
| 2009/0039776 A1 | 2/2009 | Yamada et al. | |
| 2009/0045730 A1 | 2/2009 | Nishimura et al. | |
| 2009/0045731 A1 | 2/2009 | Nishimura et al. | |
| 2009/0101870 A1 | 4/2009 | Prakash et al. | |
| 2009/0108737 A1 | 4/2009 | Kwong et al. | |
| 2009/0115316 A1 | 5/2009 | Zheng et al. | |
| 2009/0165846 A1 | 7/2009 | Johannes et al. | |
| 2009/0167162 A1 | 7/2009 | Lin et al. | |
| 2009/0179554 A1 | 7/2009 | Kuma et al. | |
| 2011/0037413 A1 * | 2/2011 | Negley et al. | 315/294 |
| 2013/0082589 A1 * | 4/2013 | So et al. | 313/504 |

FOREIGN PATENT DOCUMENTS

| | | |
|---|---|---|
| EP | 2034538 | 3/2009 |
| JP | 200511610 | 1/2005 |
| JP | 2007123392 | 5/2007 |
| JP | 2007254297 | 10/2007 |
| JP | 2008074939 | 10/2009 |
| WO | WO 0139234 | 5/2001 |
| WO | WO 0202714 | 1/2002 |
| WO | WO 0215645 | 2/2002 |
| WO | WO 03040257 | 5/2003 |
| WO | WO 03060956 | 7/2003 |
| WO | WO 2004093207 | 10/2004 |
| WO | WO 2004107822 | 12/2004 |
| WO | WO 2005014551 | 2/2005 |
| WO | WO 2005019373 | 3/2005 |
| WO | WO 2005030900 | 4/2005 |
| WO | WO 2005089025 | 9/2005 |
| WO | WO 2005123873 | 12/2005 |
| WO | WO 2006009024 | 1/2006 |
| WO | WO 2006056418 | 6/2006 |
| WO | WO 2006072002 | 7/2006 |
| WO | WO 2006082742 | 8/2006 |
| WO | WO 2006098120 | 9/2006 |
| WO | WO 2006100298 | 9/2006 |
| WO | WO 2006103874 | 10/2006 |
| WO | WO 2006114966 | 11/2006 |
| WO | WO 2006132173 | 12/2006 |
| WO | WO 2007002683 | 1/2007 |
| WO | WO 2007004380 | 1/2007 |
| WO | WO 2007063754 | 6/2007 |
| WO | WO 2007063796 | 6/2007 |
| WO | WO 2008101842 | 8/2008 |
| WO | WO 2008132085 | 11/2008 |
| WO | WO 2009000673 | 12/2008 |
| WO | WO 2009003898 | 1/2009 |
| WO | WO 2009008311 | 1/2009 |
| WO | WO 2009018009 | 2/2009 |
| WO | WO 2009050290 | 4/2009 |
| WO | WO 2008056746 | 5/2009 |
| WO | WO 2009021126 | 5/2009 |
| WO | WO 2009062578 | 5/2009 |
| WO | WO 2009063833 | 5/2009 |
| WO | WO 2009066778 | 5/2009 |
| WO | WO 2009066779 | 5/2009 |
| WO | WO 2009086028 | 7/2009 |
| WO | WO 2009100991 | 8/2009 |

OTHER PUBLICATIONS

Paulose, Betty Marie Jennifer S. et al., "First Examples of Alkenyl Pyridines as Organic Ligands for Phosphorescent Iridium Complexes," *Adv. Mater.*, 16(22):2003-2007 (2004).

Tung, Yung-Liang et al., "Organic Light-Emitting Diodes Based on Charge-Neutral Ru$^{II}$ PHosphorescent Emitters," *Adv. Mater.*, 17(8):1059-1064 (2005).

Huang, Jinsong et al., "Highly Efficient Red-Emission Polymer Phosphorescent Light-Emitting Diodes Based on Two Novel Tris(1-phenylisoquinolinato-C2,N)iridium(III) Derivatives," *Adv. Mater.*, 19:739-743 (2007).

Wong, Wai-Yeung, "Multifunctional Iridium Complexes Based on Carbazole Modules as Highly Efficient Electrophosphors," *Angew. Chem. Int. Ed.*, 45:7800-7803 (2006).

Tang, C.W. and VanSlyke, S.A., "Organic Electroluminescent Diodes," *Appl. Phys. Lett.*, 51(12):913-915 (1987).

Adachi, Chihaya et al., "Organic Electroluminescent Device Having a Hole Conductor as an Emitting Layer," *Appl. Phys. Lett.*, 55(15):1489-1491 (1989).

Ma, Yuguang et al., "Triplet Luminescent Dinuclear-Gold(*I*) Complex-Based Light-Emitting Diodes with Low Turn-On voltage," *Appl. Phys. Lett.*, 74(10):1361-1363 (1999).

(56) References Cited

OTHER PUBLICATIONS

Gao, Zhigiang et al., "Bright-Blue Electroluminescence From a Silyl-Substituted ter-(phenylene-vinylene) derivative," *Appl. Phys. Lett.*, 74(6):865-867 (1999).

Lee, Chang-Lyoul et al., "Polymer Phosphorescent Light-Emitting Devices Doped with Tris(2-phenylpyridine) Iridium as a Triplet Emitter," *Appl. Phys. Lett.*, 77(15):2280-2282 (2000).

Hung, L.S. et al., "Anode Modification in Organic Light-Emitting Diodes by Low-Frequency Plasma Polymerization of $CHF_3$," *Appl. Phys. Lett.*, 78(5):673-675 (2001).

Ikai, Masamichi and Tokito, Shizuo, "Highly Efficient Phosphorescence From Organic Light-Emitting Devices with an Exciton-Block Layer," *Appl. Phys. Lett.*, 79(2):156-158 (2001).

Wang, Y. et al., "Highly Efficient Electroluminescent Materials Based on Fluorinated Organometallic Iridium Compounds," *Appl. Phys. Lett.*, 79(4):449-451 (2001).

Kwong, Raymond C. et al., "High Operational Stability of Electrophosphorescent Devices," *Appl. Phys. Lett.*, 81(1):162-164 (2002).

Holmes, R.J. et al., "Blue Organic Electrophosphorescence Using Exothermic Host-Guest Energy Transfer," *Appl. Phys. Lett.*, 82(15):2422-2424 (2003).

Sotoyama, Wataru et al., "Efficient Organic Llght-Emitting Diodes with Phosphorescent Platinum Complexes Containing N^ C^ N-Coordinating Tridentate Ligand," *Appl. Phys. Lett.*, 86:153505-1-153505-3 (2005).

Okumoto, Kenji et al., "Green Fluorescent Organic Light-Emitting Device with External Quantum Efficiency of Nearly 10%," *Appl. Phys. Lett.*, 89:063504-1-063504-3 (2006).

Kanno, Hiroshi et al., "Highly Efficient and Stable Red Phosphorescent Organic Light-Emitting Device Using bis[2-(2-benzothiazoyl)phenolato]zinc(II) as host material," *Appl. Phys. Lett.*, 90:123509-1-123509-3 (2007).

Aonuma, Masaki et al., "Material Design of Hole Transport Materials Capable of Thick-Film Formation in Organic Light Emitting Diodes," *Appl. Phys. Lett.*, 90:183503-1-183503-3 (2007).

Sun, Yiru and Forrest, Stephen R., "High-Efficiency White Organic Light Emitting Devices with Three Separate Phosphorescent Emission Layers," *Appl. Phys. Lett.*, 91:263503-1-263503-3 (2007).

Adachi, Chihaya et al., "High-Efficiency Red Electrophosphorescence Devices," *Appl. Phys. Lett.*, 78(11):1622-1624 (2001).

Wong, Keith Man-Chung et al., A Novel Class of Phosphorescent Gold(III) Alkynyl-Based Organic Light-Emitting Devices with Tunable Colour, *Chem. Commun.*, 2906-2908 (2005).

Hamada, Yuji et al., "High Luminance in Organic Electroluminescent Devices with Bis(10-hydroxybenzo[h]quinolinato)beryllium as an Emitter," *Chem. Lett.*, 905-906 (1993).

Nishida, Jun-ichi et al., "Preparation, Characterization, and Electroluminescence Characteristics of α-Diimine-type Platinum(II) Complexes with Perfluorinated Phenyl Groups as Ligands," *Chem. Lett.*, 34(4):592-593 (2005).

Mi, Bao-Xiu et al., "Thermally Stable Hole-Transporting Material for Organic Light-Emitting Diode: an Isoindole Derivative," *Chem. Mater.*, 15(16):3148-3151 (2003).

Huang, Wei-Sheng et al., "Highly Phosphorescent Bis-Cyclometalated Iridium Complexes Containing Benzoimidazole-Based Ligands," *Chem. Mater.*, 16(12):2480-2488 (2004).

Niu, Yu-Hua et al., "Highly Efficient Electrophosphorescent Devices with Saturated Red Emission from a Neutral Osmium Complex," *Chem. Mater.*, 17(13):3532-3536 (2005).

Lo, Shih-Chun et al., "Blue Phosphorescence from Iridium(III) Complexes at Room Temperature," *Chem. Mater.*, 18(21):5119-5129 (2006).

Takizawa, Shin-ya et al., "Phosphorescent Iridium Complexes Based on 2-Phenylimidazo[1,2-α]pyridine Ligands: Tuning of Emission Color toward the Blue Region and Application to Polymer Light-Emitting Devices," *Inorg. Chem.*, 46(10):4308-4319 (2007).

Lamansky, Sergey et al., "Synthesis and Characterization of Phosphorescent Cyclometalated Iridium Complexes," *Inorg. Chem.*, 40(7):1704-1711 (2001).

Ranjan, Sudhir et al., "Realizing Green Phosphorescent Light-Emitting Materials from Rhenium(I) Pyrazolato Diimine Complexes," *Inorg. Chem.*, 42(4):1248-1255 (2003).

Noda, Tetsuya and Shirota,Yasuhiko, "5,5'-Bis(dimesitylboryl)-2,2'-bithiophene and 5,5"-Bis(dimesitylboryl)-2,2':5',2"-terthiophene as a Novel Family of Electron-Transporting Amorphous Molecular Materials," *J. Am. Chem. Soc.*, 120 (37):9714-9715 (1998).

Sakamoto,Youichi et al., "Synthesis, Characterization, and Electron-Transport Property of Perfluorinated Phenylene Dendrimers," *J. Am. Chem. Soc.*, 122(8)1832-1833 (2000).

Adachi, Chihaya et al., "Nearly 100% Internal Phosphorescence Efficiency in an Organic Light Emitting Device," *J. Appl. Phys.*, 90(10):5048-5051 (2001).

Shirota, Yasuhiko et al., "Starburst Molecules Based on π-Electron Systems as Materials for Organic Electroluminescent Devices," *Journal of Luminescence*, 72-74:985-991 (1997).

Inada, Hiroshi and Shirota, Yasuhiko, "1,3,5-Tris[4-(diphenylamino)phenyl]benzene and its Methylsubstituted Derivatives as a Novel Class of Amorphous Molecular Materials," *J. Mater. Chem.*, 3(3):319-320 (1993).

Kido, Junji et al., 1,2,4-Triazole Derivative as an Electron Transport Layer in Organic Electroluminescent Devices, *Jpn. J. Appl. Phys.*, 32:L917-L920 (1993).

Van Slyke, S. A. et al., "Organic Electroluminescent Devices with Improved Stability," *Appl. Phys. Lett.*, 69(15 ):2160-2162 (1996).

Guo, Tzung-Fang et al., "Highly Efficient Electrophosphorescent Polymer Light-Emitting Devices," *Organic Electronics*, 1:15-20 (2000).

Palilis, Leonidas C., "High Efficiency Molecular Organic Light-Emitting Diodes Based on Silole Derivatives and Their Exciplexes," *Organic Electronics*, 4:113-121 (2003).

Ikeda, Hisao et al., "P-185: Low-Drive-Voltage OLEDs with a Buffer Layer Having Molybdenum Oxide," *SID Symposium Digest*, 37:923-926 (2006).

T. Östergård et al., "Langmuir-Blodgett Light-Emitting Diodes of Poly(3-Hexyithiophene): Electro-Optical Characteristics Related to Structure," *Synthetic Metals*, 87:171-177 (1997).

Hu, Nan-Xing et al., "Novel High $T_g$ Hole-Transport Molecules Based on Indolo[3,2-b]carbazoles for Organic Light-Emitting Devices," *Synthetic Metals*, 111-112:421-424 (2000).

Salbeck, J. et al., "Low Molecular Organic Glasses for Blue Electroluminescence," *Synthetic Metals*, 91:209-215 (1997).

Anil R Duggal et al., "OLEDs for Lighting: New Approaches" GE, Proc. SPIE vol. 5214, p. 241-247 (SPIE, Bellingham., WA, 2004).

OLED100 Newsletter Apr. 2011, OLED100.eu Newsletter—Apr. 2011, "Lighting the way with OLEDs", May 23-29, 2011, http://www.oledsummerschool2011.eu.

Weisstein, Eric W., *Tessellation* [online], from MathWorld [retrieved on Jul. 25, 2011], http://mathworld.wolfram.com/Tessellation.html.

Dutch, Steven, *Penrose Tiles* [online], 1999 [retrieved Jul. 25, 2011], http://www.uwgb.edu/DutchS/SYMMETRY/penrose.htm.

David, Hollister, *17 Wallpaper Groups* [online], [retrieved on Jul. 25, 2011], http://clowder.net/hop/17walppr/17walppr.htm.

Baldo et al., "Highly Efficient Phosphorescent Emission from Organic Electroluminescent Devices," Nature, vol. 395, 151-154, (1998).

Baldo et al., "Very high-efficiency green organic light-emitting devices based on electrophosphorescence," Appl. Phys. Lett., vol. 75, No. 3, 4-6 (1999).

Orbeos for OLED Lighting, Lead (Pb) Free Product—RoHS Compliant, Opto Semiconductors, Nov. 18, 2009.

Levermore et al., "Phosphorescent OLEDs: Lighting the way for energy-efficient solid-state light sources" Frontline technology, Information Display 10/10, SID 2010.

U.S. Appl. No. 61/391,862, filed Oct. 11, 2010.

* cited by examiner

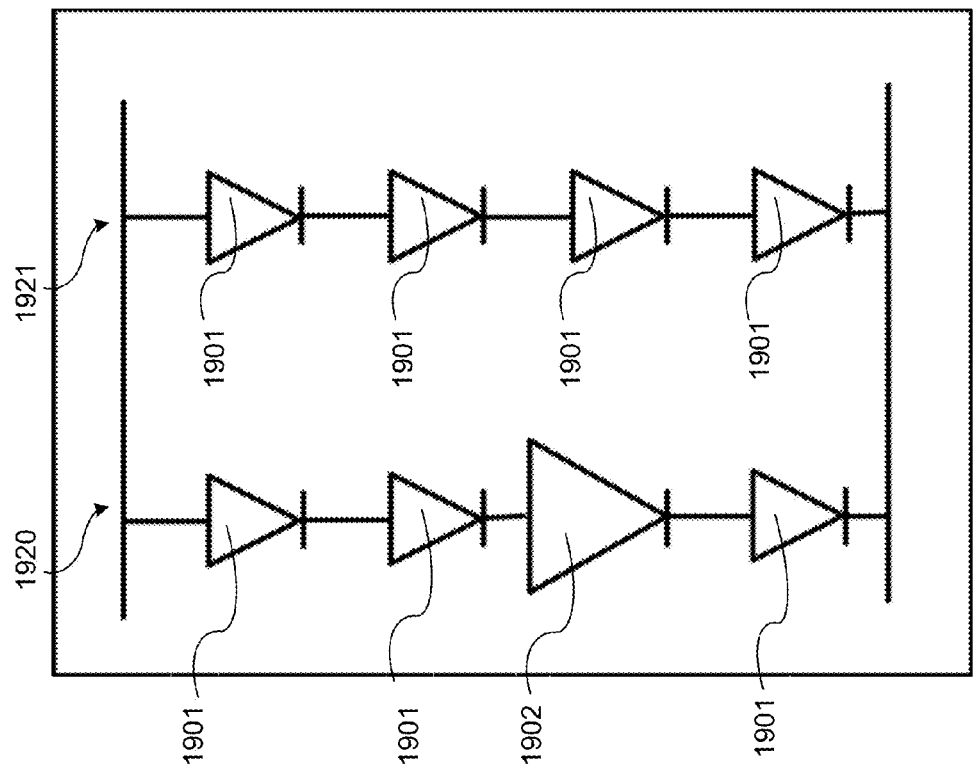
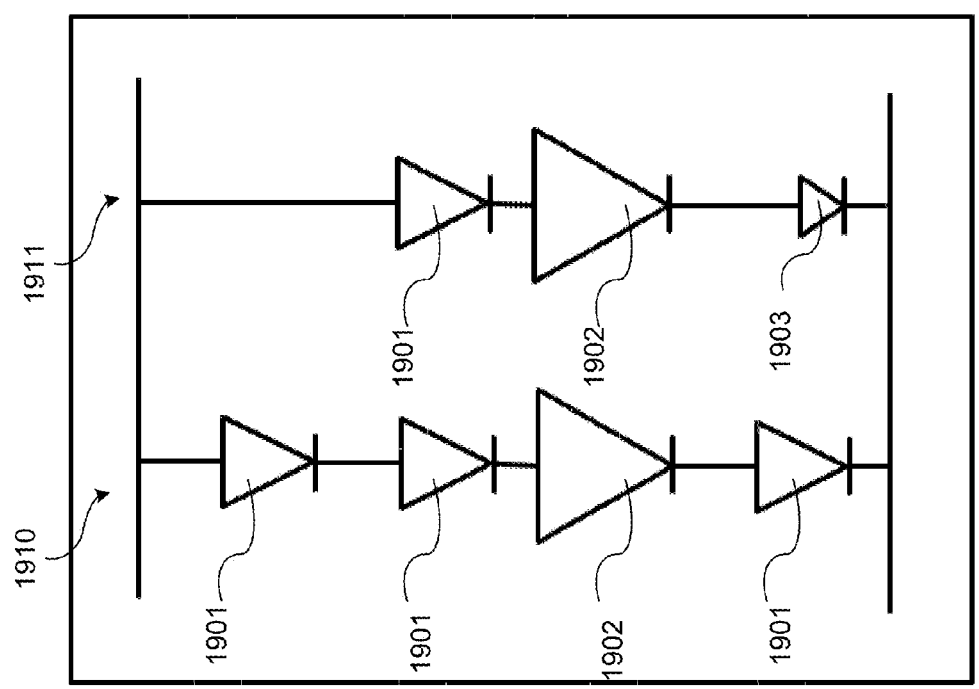
Fig. 19(b)
Fig. 19(a)

OLED LIGHT PANEL WITH CONTROLLED BRIGHTNESS VARIATION

BACKGROUND OF THE INVENTION

The claimed invention was made by, on behalf of, and/or in connection with one or more of the following parties to a joint university corporation research agreement: Regents of the University of Michigan, Princeton University, The University of Southern California, and the Universal Display Corporation. The agreement was in effect on and before the date the claimed invention was made, and the claimed invention was made as a result of activities undertaken within the scope of the agreement.

Opto-electronic devices that make use of organic materials are becoming increasingly desirable for a number of reasons. Many of the materials used to make such devices are relatively inexpensive, so organic opto-electronic devices have the potential for cost advantages over inorganic devices. In addition, the inherent properties of organic materials, such as their flexibility, may make them well suited for particular applications such as fabrication on a flexible substrate. Examples of organic opto-electronic devices include organic light emitting devices (OLEDs), organic phototransistors, organic photovoltaic cells, and organic photodetectors. For OLEDs, the organic materials may have performance advantages over conventional materials. For example, the wavelength at which an organic emissive layer emits light may generally be readily tuned with appropriate dopants.

OLEDs make use of thin organic films that emit light when voltage is applied across the device. OLEDs are becoming an increasingly interesting technology for use in applications such as flat panel displays, illumination, and backlighting. Several OLED materials and configurations are described in U.S. Pat. Nos. 5,844,363, 6,303,238, and 5,707,745, which are incorporated herein by reference in their entirety.

One application for phosphorescent emissive molecules is a full color display. Industry standards for such a display call for pixels adapted to emit particular colors, referred to as "saturated" colors. In particular, these standards call for saturated red, green, and blue pixels. Color may be measured using CIE coordinates, which are well known to the art.

One example of a green emissive molecule is tris(2-phenylpyridine) iridium, denoted Ir(ppy)$_3$, which has the structure of Formula I:

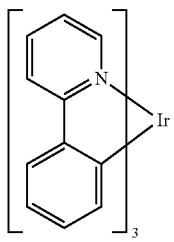

In this, and later figures herein, we depict the dative bond from nitrogen to metal (here, Ir) as a straight line.

As used herein, the term "organic" includes polymeric materials as well as small molecule organic materials that may be used to fabricate organic opto-electronic devices. "Small molecule" refers to any organic material that is not a polymer, and "small molecules" may actually be quite large. Small molecules may include repeat units in some circumstances. For example, using a long chain alkyl group as a substituent does not remove a molecule from the "small molecule" class. Small molecules may also be incorporated into polymers, for example as a pendent group on a polymer backbone or as a part of the backbone. Small molecules may also serve as the core moiety of a dendrimer, which consists of a series of chemical shells built on the core moiety. The core moiety of a dendrimer may be a fluorescent or phosphorescent small molecule emitter. A dendrimer may be a "small molecule," and it is believed that all dendrimers currently used in the field of OLEDs are small molecules.

As used herein, "top" means furthest away from the substrate, while "bottom" means closest to the substrate. Where a first layer is described as "disposed over" a second layer, the first layer is disposed further away from substrate. There may be other layers between the first and second layer, unless it is specified that the first layer is "in contact with" the second layer. For example, a cathode may be described as "disposed over" an anode, even though there are various organic layers in between.

As used herein, "solution processible" means capable of being dissolved, dispersed, or transported in and/or deposited from a liquid medium, either in solution or suspension form.

A ligand may be referred to as "photoactive" when it is believed that the ligand directly contributes to the photoactive properties of an emissive material. A ligand may be referred to as "ancillary" when it is believed that the ligand does not contribute to the photoactive properties of an emissive material, although an ancillary ligand may alter the properties of a photoactive ligand.

As used herein, and as would be generally understood by one skilled in the art, a first "Highest Occupied Molecular Orbital" (HOMO) or "Lowest Unoccupied Molecular Orbital" (LUMO) energy level is "greater than" or "higher than" a second HOMO or LUMO energy level if the first energy level is closer to the vacuum energy level. Since ionization potentials (IP) are measured as a negative energy relative to a vacuum level, a higher HOMO energy level corresponds to an IP having a smaller absolute value (an IP that is less negative). Similarly, a higher LUMO energy level corresponds to an electron affinity (EA) having a smaller absolute value (an EA that is less negative). On a conventional energy level diagram, with the vacuum level at the top, the LUMO energy level of a material is higher than the HOMO energy level of the same material. A "higher" HOMO or LUMO energy level appears closer to the top of such a diagram than a "lower" HOMO or LUMO energy level.

As used herein, and as would be generally understood by one skilled in the art, a first work function is "greater than" or "higher than" a second work function if the first work function has a higher absolute value. Because work functions are generally measured as negative numbers relative to vacuum level, this means that a "higher" work function is more negative. On a conventional energy level diagram, with the vacuum level at the top, a "higher" work function is illustrated as further away from the vacuum level in the downward direction. Thus, the definitions of HOMO and LUMO energy levels follow a different convention than work functions.

More details on OLEDs, and the definitions described above, can be found in U.S. Pat. No. 7,279,704, which is incorporated herein by reference in its entirety.

BRIEF SUMMARY OF THE INVENTION

Embodiments may provide a light source with a controlled brightness variation. A first device is provided that includes a substrate and a plurality of OLEDs disposed on the substrate. Each of the OLEDs includes a first electrode, a second electrode, and an organic electroluminescent (EL) material disposed between the first and the second electrodes. Each of the plurality of OLEDs is commonly addressable. The plurality of OLEDs comprises a first group and a second group, where each of the OLEDs in the first group of the plurality of OLEDs is patterned and electrically connected such that each OLED in the first group is driven at a first current density, and where each of the OLEDs in the second group of the plurality of OLEDs is patterned and electrically connected such that each OLED in the second group is driven at a second current density that is different from the first current density. At least one of the OLEDs in the first group of the plurality of OLEDs emits light having a first point on the CIE 1976 (L*, u*, v*) color space chromaticity diagram and at least one of the OLEDs in the second group of the plurality of OLEDS emits light having a second point on the CIE 1976 (L*, u*, v*) color space chromaticity diagram. The difference between the first point and the second point has a duv value that is less than approximately 0.10. In some embodiments, the difference between the first point and the second point has a duv value that is less than approximately 0.05.

In some embodiments, in the first device as described above, at least one of the OLEDs in the first group of the plurality of OLEDs has substantially the same device structure as at least one of the OLEDs in the second group of the plurality of OLEDs. In some embodiments, the OLED stack of at least one of the OLEDs in the first group consists essentially of the same layers as the OLED stack of at least one of the OLEDs in the second group. In some embodiments, the OLED stack of at least one of the OLEDs in the first group is structurally equivalent to the OLED stack of at least one of the OLEDs in the second group. In some embodiments, the OLED stack of at least one of the OLEDs in the first group is functionally equivalent to the OLED stack of at least one of the OLEDs in the second group.

In some embodiments, in the first device as described above, each of the first group and the second group of the plurality of OLEDs comprises a plurality of OLEDs. In some embodiments, in the first device as described above, at least one of the first group or the second group of the plurality of OLEDs comprises only a single OLED.

In some embodiments, in the first device as described above, each of the plurality of OLEDs has substantially the same device structure. In some embodiments, in the first device as described above, the organic EL material of each of the plurality of OLEDs is common to substantially all of the plurality of OLEDs. In some embodiments, in the first device as described above, each of the plurality of OLEDs emits approximately white light having Duv that is less than approximately 0.010.

In some embodiments, in the first device as described above, each of the OLEDs of the plurality of OLEDs has an emissive area that is approximately within the range of 0.1 $cm^2$ to 100 $cm^2$. In some embodiments, each of the OLEDs has an emissive area that is greater than approximately 0.5 $cm^2$. In some embodiments, each of the OLEDs has an emissive area that is greater than approximately 2 $cm^2$.

In some embodiments, in the first device as described above, the first current density is at least approximately 20% greater than the second current density. In some embodiments, the first current density is at least approximately 50% greater than the second current density. In some embodiments, the first current density is at least approximately 100% greater than the second current density. In some embodiments, the first current density is at least between approximately 20% and 100% greater than the second current density.

In some embodiments, in the first devices as described above, the luminance of each of the OLEDs in the first group of the plurality of OLEDs is greater than the luminance of each of the OLEDs in the second group of the plurality of OLEDs. In some embodiments, the luminance of each of the OLEDs in the first group of the plurality of OLEDs is at least 20% greater than the luminance of each of the OLEDs in the second group of the plurality of OLEDs. In some embodiments, the luminance of each of the OLEDs in the first group of the plurality of OLEDs is at least 50% greater than the luminance of each of the OLEDs in the second group of the plurality of OLEDs.

In some embodiments, in the first device as described above, the first group and the second group of the plurality of OLEDs are electrically connected in series. In some embodiments, each OLED has an emissive area and the emissive area of each OLED in the first group of the plurality of OLEDs is different than the emissive area of each OLED in the second group of the plurality of OLEDs. In some embodiments, the emissive area of each OLED in the first group is at least 20% larger than the emissive area of each OLED in the second group. In some embodiments, the emissive area of each OLED in the first group is at least 50% larger than the emissive area of each OLED in the second group.

In some embodiments, in the first device as described above where the first group and the second group of the plurality of OLEDs are electrically connected in series, the emissive area of each OLED in the first group of the plurality of OLEDs comprises a first shape and the emissive area of each OLED in the second group of the plurality of OLEDs comprises a second shape that is different than the first shape.

In some embodiments, in the first device as described above where the first group and the second group of the plurality of OLEDs are electrically connected in series on a first series string, the first device further includes one or more series strings that are electrically connected in parallel with the first series string. In some embodiments, where the first device includes a plurality of series strings, each of the plurality of series strings is substantially the same as the first series string.

In some embodiments, in the first device as described above, where the first group and the second group of the plurality of OLEDs are electrically connected in series on a first series string, the first device further comprises a plurality of series strings wherein at least one of the series string is different than the first series string. In some embodiments, the first series string is connected in parallel with a second series string that has a plurality of OLEDs having substantially the same emissive area. In some embodiments, the second series string comprises a plurality of OLEDs and at least two of the OLEDs in the second series string have different emissive areas.

In some embodiments, in the first device as described above, the first device further comprises a bus line and one or more control resistors electrically coupled to the bus line. At least one of the plurality of OLEDs may be electrically connected in series to one of the control resistors. In some embodiments, each of the control resistors that are electrically connected in series with each of the OLEDs in the first group of the plurality of OLEDs has a different resistance than the control resistors electrically connected in series with each of the OLEDs in the second group of the plurality of OLEDs. In some embodiments, the resistance of the control resistors that are electrically connected in series with each of the OLEDs in the first group of the plurality of OLEDs is at least 1% greater than the resistance of the control resistors that are electrically connected in series with each of the OLEDs in the second group of the plurality of OLEDs. In some embodiments, the resistance of the control resistors that are electrically connected in series with each of the OLEDs in the first group of the plurality of OLEDs is at least 5% greater than the resistance of the control resistors that are electrically connected in series with each of the OLEDs in the second group of the plurality of OLEDs. In some embodiments, the resistance of the control resistors that are electrically connected in series with each of the OLEDs in the first group of the plurality of OLEDs is at least 10% greater than the resistance of the control resistors that are electrically connected in series with each of the OLEDs in the second group of the plurality of OLEDs. In some embodiments, each of the control resistors that are electrically connected in series with each of the OLEDs in the first group of the plurality of OLEDs has the same resistance as the control resistors electrically connected in series with each of the OLEDs in the second group of the plurality of OLEDs. The emissive area of each of the OLEDs in the first group and the second group of the plurality of OLEDs may be different.

In some embodiments, in the first device as described above that further includes a bus line, the first device comprises a plurality of control resistors, and the plurality of control resistors comprises a first control resistor electrically connected to the first group of the plurality of OLEDs and a second control resistor electrically connected to the second group of the plurality of OLEDs. The first and the second control resistors comprise different resistances. In some embodiments, the first resistor has a resistance that is at least 1% greater than the resistance of the second resistor. In some embodiments, the first resistor has a resistance that is at least 5% greater than the resistance of the second resistor. In some embodiments, the first resistor has a resistance that is at least 10% greater than the resistance of the second resistor.

In some embodiments, in the first device as described above that further includes a bus line and a plurality of control resistors electrically coupled to the bus line, where each of the plurality of OLEDs is electrically connected in series to one of the control resistors, the emissive area of each of the OLEDs in the first group is approximately the same as the emissive area of each of the OLEDs in the second group. In some embodiments, the emissive area of each of the OLEDs in the first group is not the same as the emissive area of each of the OLEDs in the second group. In some embodiments, the emissive area of each of the OLEDs in the first group of the plurality of OLEDs is within 5% of the emissive area of each of the OLEDs in the second group of the plurality of OLEDs.

In some embodiments, in the first device as described above that further includes a bus line and a plurality of control resistors electrically coupled to the bus line, where each of the plurality of OLEDs is electrically connected in series to one of the control resistors, each of the of the control resistors has a resistance between $1\Omega$ and $30\ k\Omega$. In some embodiments, each of the control resistors has a resistance that is greater than $15\Omega$. In some embodiments, each of the control resistors has a resistance that is greater than $25\Omega$. In some embodiments, each of the control resistors has a resistance that is greater than $50\Omega$.

In some embodiments, in the first device as described above that further includes a bus line and a plurality of control resistors electrically coupled to the bus line, where each of the plurality of OLEDs is electrically connected in series to one of the control resistors, each of the control resistors is connected to a fuse. In some embodiments, each of the control resistors is a fuse.

In some embodiments, in the first device as described above, the OLEDs that comprise the first group of the plurality of OLEDs are electrically connected in series, the OLEDs that comprise the second group of the plurality of OLEDs are electrically connected in series, and the first group and the second group of the plurality of OLEDs are electrically connected in parallel. In some embodiments, the first group of the plurality of OLEDs and the second group of the plurality of OLEDs include a different number of OLEDs. In some embodiments, where the first group and the second group include a different number of OLEDs, the first group of the plurality of OLEDs includes a plurality of OLEDs each having approximately the same emissive area, the second group of the plurality of OLEDs includes a plurality of OLEDs each having approximately the same emissive area, and the emissive areas of each of the OLEDs in the first and second groups are approximately the same. In some embodiments, where the first group and the second group include a different number of OLEDs, the first group of the plurality of OLEDs includes a plurality of OLEDs each having approximately the same emissive area, the second group of the plurality of OLEDs includes a plurality of OLEDs each having approximately the same emissive area, and the emissive areas of each of the OLEDs in the first and second groups are different.

In some embodiments, the first device as described above further includes at least one individually addressable OLED that is not a part of the first group or the second group of the plurality of OLEDs.

In some embodiments, the first device as described above further includes at least one commonly addressable OLED that is not a part of the first group or the second group of the plurality of OLEDs.

In some embodiments, the first device as described above further includes a plurality of OLEDs electrically connected in parallel and at least one OLED electrically connected in series with the plurality of OLEDs that are electrically connected in parallel. In some embodiments, the first group of the plurality of OLEDs comprises at least one of the plurality of OLEDs electrically connected in parallel.

In some embodiments, in the first device as described that includes a plurality of OLEDs electrically connected in parallel and at least one OLED electrically connected in series with the plurality of OLEDs that are electrically connected in parallel, and where the first group of the plurality of OLEDs comprises at least one of the plurality of OLEDs electrically connected in parallel, the emissive area of each of the plurality of OLEDs that are electrically connected in parallel is approximately the same. In some embodiments, the emissive area of each of the plurality of OLEDs that are electrically connected in parallel is within 5% of the emissive area of each of the other OLEDs electrically connected in parallel. In some embodiments, the emissive area of at least one OLED of the plurality of OLEDs that are electrically connected in parallel is different from at least one other OLED of the plurality of OLEDs that are electrically connected in parallel.

In some embodiments, in the first device as described that includes a plurality of OLEDs electrically connected in parallel and at least one OLED electrically connected in series with the plurality of OLEDs that are electrically connected in parallel. In some embodiments, the first group of the plurality of OLEDs comprises at least one of the plurality of OLEDs electrically connected in parallel, the second group of the plurality of OLEDs comprise at least one OLED electrically connected in series with the plurality of OLEDs that are electrically connected in parallel.

In some embodiments, in the first device as described above, each of the plurality of OLEDs comprises an emissive area and the emissive area of the plurality OLEDs is disposed over at least 30% of a surface of the substrate. In some embodiments, the emissive area of the plurality OLEDs is disposed over at least 50% of a surface of the substrate. In some embodiments, in the first device as described above, the OLEDs in the first group of the plurality of OLEDs are tessellated with the OLEDs in the second group of the plurality of OLEDs.

A lighting device comprising a plurality of OLEDs having a controlled brightness variation across the device may be provided in some embodiments. As used herein, "brightness" may be measured in candelas per unit area, and not just in lumens. The lighting device may comprise a lighting panel that combines brighter emissive regions and dimmer emissive regions. Brightness variation may be enabled by controlling the current density through multiple OLEDs (which may also be referred to as. "pixels" or "OLED pixels" herein) having similar device structures and emissive characteristics on a light panel. It may thereby be preferred in some embodiments to utilize a common organic layer stack for the plurality of OLEDs so that the device structures are substantially the same (although as described below, this need not be the case). The difference in current densities that the OLEDs are driven at in some embodiments to enable the brightness variation between the OLEDs or groups of OLEDs may be created using any method, including, but not limited to, those described in detail below. For instance, in some exemplary embodiments, multiple OLEDs may be substantially the same (e.g. have the same or similar emissive properties) and may be connected in a series string on a panel, where at least two of the OLEDs in the series string have different emissive areas (i.e. difference sizes and/or shaped emissive areas). In this situation, the larger OLED will have the same total current as the smaller OLED, but a smaller current density and therefore a lower brightness. In some exemplary embodiments, multiple OLEDs may be connected in parallel on a device (such as a lighting panel), where the potential drop in delivering current to the OLEDs is controlled to create brightness variation (e.g. through the use of one or more control resistors electrically connected to one or more OLEDs). In some exemplary embodiments, one or more OLEDs are electrically connected in a plurality of series strings on a panel, where the series strings are electrically connected in parallel, and, for instance, the number and/or emissive area of the OLEDs in some of the series strings differs from those of the OLEDs in one or more of the other series strings. In some embodiments, multiple OLEDs may be disposed on a panel, and the OLEDs may be driven at different current density by supplying a different current to each OLED, and where the current may be alternated (thereby varying the current density in the individual OLEDs) so as to prevent differential aging.

It should be understood that in some embodiments, two or more of the exemplary methods mentioned above may be combined in a single device so as to achieve differential brightness across the device. Moreover, although exemplary embodiments are provided herein for illustration purposes, embodiments are not so limited. Indeed, it is contemplated that any method for creating a differential current density in two or more substantially similar OLEDs that are commonly addressable may be utilized. In so doing, some embodiments may provide for devices that have some advantages, such as the ability to control the distribution of the light and/or provide additional aesthetic advantages related to adding tonal variation in a lighting device (such as a lighting panel).

BRIEF DESCRIPTION OF THE DRAWINGS

FIGS. 19(a) and (b) show an exemplary configuration of OLEDs electrically connected in series and in parallel in accordance with some embodiments.

DETAILED DESCRIPTION OF THE INVENTION

Generally, an OLED comprises at least one organic layer disposed between and electrically connected to an anode and a cathode. When a current is applied, the anode injects holes and the cathode injects electrons into the organic layer(s). The injected holes and electrons each migrate toward the oppositely charged electrode. When an electron and hole localize on the same molecule, an "exciton," which is a localized electron-hole pair having an excited energy state, is formed. Light is emitted when the exciton relaxes via a photoemissive mechanism. In some cases, the exciton may be localized on an excimer or an exciplex. Non-radiative mechanisms, such as thermal relaxation, may also occur, but are generally considered undesirable.

The initial OLEDs used emissive molecules that emitted light from their singlet states ("fluorescence") as disclosed, for example, in U.S. Pat. No. 4,769,292, which is incorporated by reference in its entirety. Fluorescent emission generally occurs in a time frame of less than 10 nanoseconds.

More recently, OLEDs having emissive materials that emit light from triplet states ("phosphorescence") have been demonstrated. Baldo et al., "Highly Efficient Phosphorescent Emission from Organic Electroluminescent Devices," Nature, vol. 395, 151-154, 1998; ("Baldo-I") and Baldo et al., "Very high-efficiency green organic light-emitting devices based on electrophosphorescence," Appl. Phys. Lett., vol. 75, No. 3, 4-6 (1999) ("Baldo-II"), which are incorporated by reference in their entireties. Phosphorescence is described in more detail in U.S. Pat. No. 7,279,704 at cols. 5-6, which are incorporated by reference.

Figure 1:
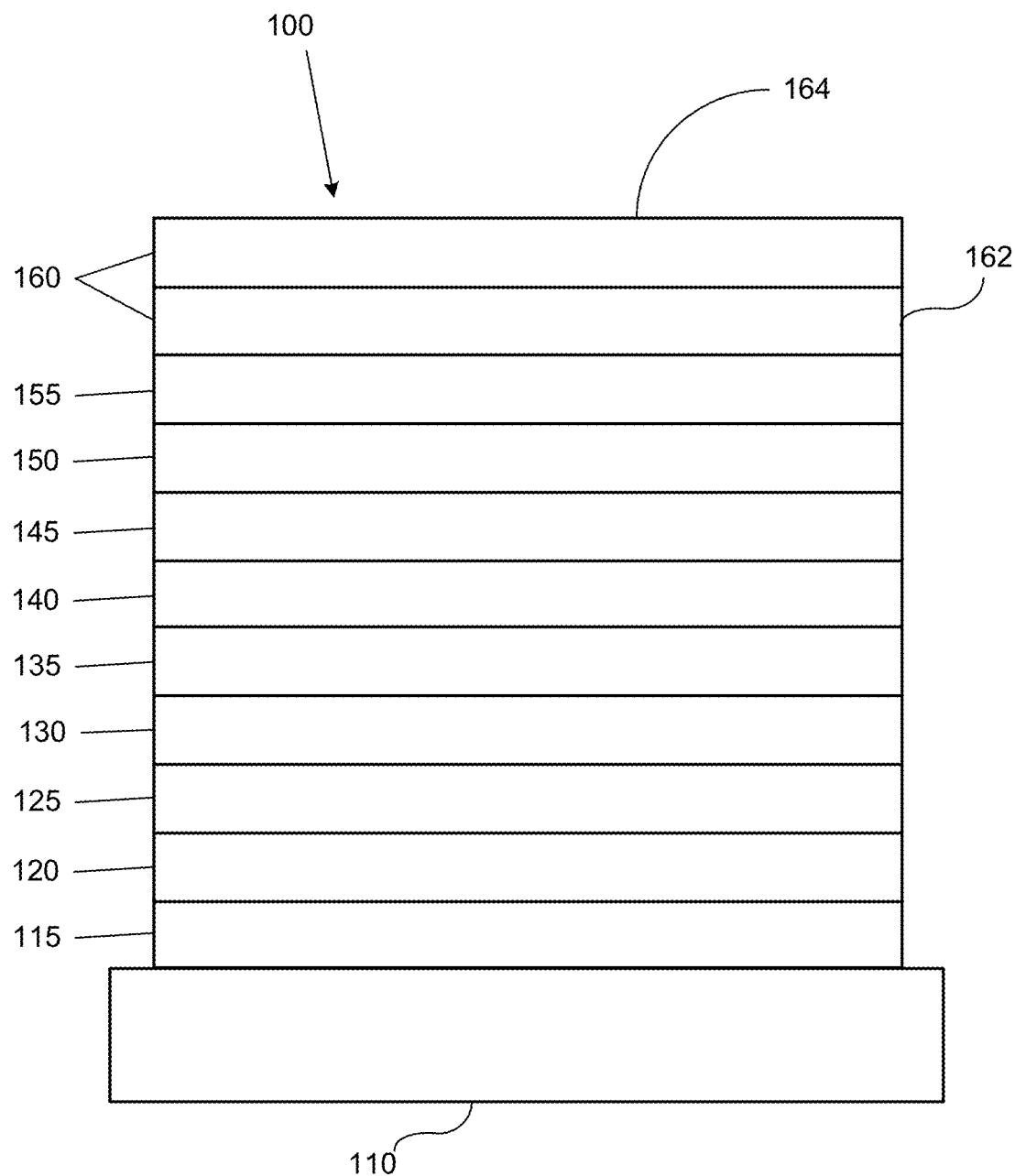
FIG. 1 shows an organic light emitting device.

FIG. 1 shows an organic light emitting device 100. The figures are not necessarily drawn to scale. Device 100 may include a substrate 110, an anode 115, a hole injection layer 120, a hole transport layer 125, an electron blocking layer 130, an emissive layer 135, a hole blocking layer 140, an electron transport layer 145, an electron injection layer 150, a protective layer 155, and a cathode 160. Cathode 160 is a compound cathode having a first conductive layer 162 and a second conductive layer 164. Device 100 may be fabricated by depositing the layers described, in order. The properties and functions of these various layers, as well as example materials, are described in more detail in U.S. Pat. No. 7,279,704 at cols. 6-10, which are incorporated by reference.

More examples for each of these layers are available. For example, a flexible and transparent substrate-anode combination is disclosed in U.S. Pat. No. 5,844,363, which is incorporated by reference in its entirety. An example of a p-doped hole transport layer is m-MTDATA doped with $F_4$-TCNQ at a molar ratio of 50:1, as disclosed in U.S. Patent Application Publication No. 2003/0230980, which is incorporated by reference in its entirety. Examples of emissive and host materials are disclosed in U.S. Pat. No. 6,303,238 to Thompson et al., which is incorporated by reference in its entirety. An example of an n-doped electron transport layer is BPhen doped with Li at a molar ratio of 1:1, as disclosed in U.S. Patent Application Publication No. 2003/0230980, which is incorporated by reference in its entirety. U.S. Pat. Nos. 5,703,436 and 5,707,745, which are incorporated by reference in their entireties, disclose examples of cathodes including compound cathodes having a thin layer of metal such as Mg:Ag with an overlying transparent, electrically-conductive, sputter-deposited ITO layer. The theory and use of blocking layers is described in more detail in U.S. Pat. No. 6,097,147 and U.S. Patent Application Publication No. 2003/0230980, which are incorporated by reference in their entireties. Examples of injection layers are provided in U.S. Patent Application Publication No. 2004/0174116, which is incorporated by reference in its entirety. A description of protective layers may be found in U.S. Patent Application Publication No. 2004/0174116, which is incorporated by reference in its entirety.

Figure 2:
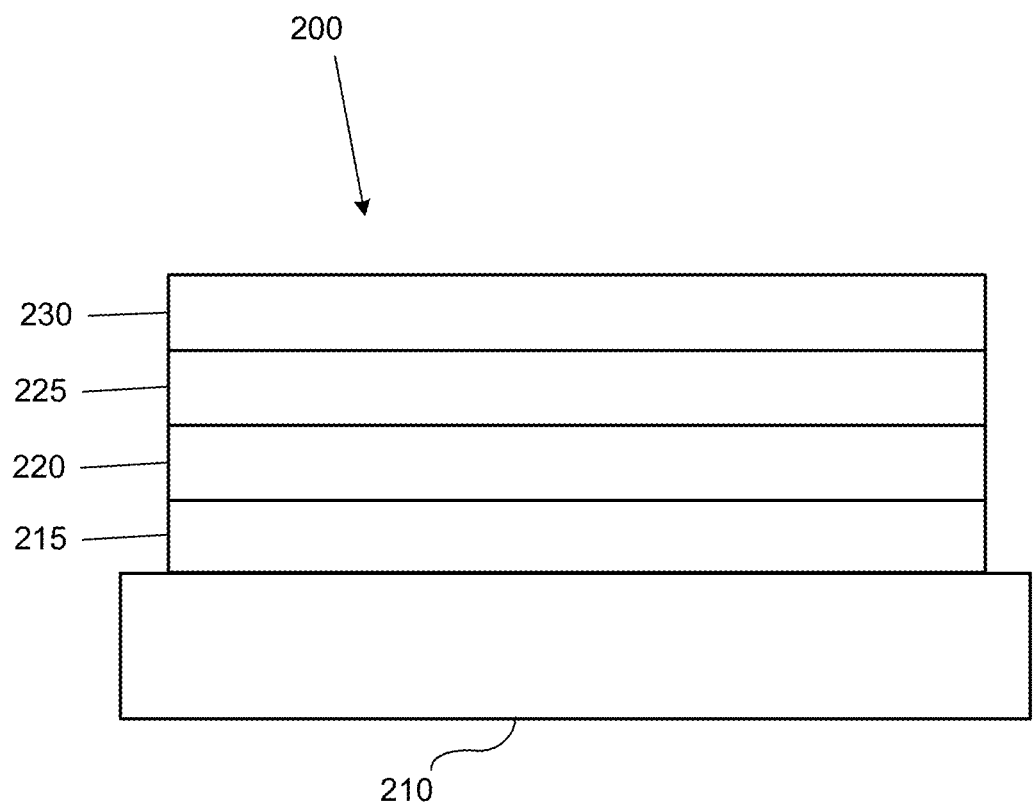
FIG. 2 shows an inverted organic light emitting device that does not have a separate electron transport layer.

FIG. 2 shows an inverted OLED 200. The device includes a substrate 210, a cathode 215, an emissive layer 220, a hole transport layer 225, and an anode 230. Device 200 may be fabricated by depositing the layers described, in order. Because the most common OLED configuration has a cathode disposed over the anode, and device 200 has cathode 215 disposed under anode 230, device 200 may be referred to as an "inverted" OLED. Materials similar to those described with respect to device 100 may be used in the corresponding layers of device 200. FIG. 2 provides one example of how some layers may be omitted from the structure of device 100.

The simple layered structure illustrated in FIGS. 1 and 2 is provided by way of non-limiting example, and it is understood that embodiments of the invention may be used in connection with a wide variety of other structures. The specific materials and structures described are exemplary in nature, and other materials and structures may be used. Functional OLEDs may be achieved by combining the various layers described in different ways, or layers may be omitted entirely, based on design, performance, and cost factors. Other layers not specifically described may also be included. Materials other than those specifically described may be used. Although many of the examples provided herein describe various layers as comprising a single material, it is understood that combinations of materials, such as a mixture of host and dopant, or more generally a mixture, may be used. Also, the layers may have various sublayers. The names given to the various layers herein are not intended to be strictly limiting. For example, in device 200, hole transport layer 225 transports holes and injects holes into emissive layer 220, and may be described as a hole transport layer or a hole injection layer. In one embodiment, an OLED may be described as having an "organic layer" disposed between a cathode and an anode. This organic layer may comprise a single layer, or may further comprise multiple layers of different organic materials as described, for example, with respect to FIGS. 1 and 2.

Structures and materials not specifically described may also be used, such as OLEDs comprised of polymeric materials (PLEDs) such as disclosed in U.S. Pat. No. 5,247,190 to Friend et al., which is incorporated by reference in its entirety. By way of further example, OLEDs having a single organic layer may be used. OLEDs may be stacked, for example as described in U.S. Pat. No. 5,707,745 to Forrest et al, which is incorporated by reference in its entirety. The OLED structure may deviate from the simple layered structure illustrated in FIGS. 1 and 2. For example, the substrate may include an angled reflective surface to improve out-coupling, such as a mesa structure as described in U.S. Pat. No. 6,091,195 to Forrest et al., and/or a pit structure as described in U.S. Pat. No. 5,834,893 to Bulovic et al., which are incorporated by reference in their entireties.

Unless otherwise specified, any of the layers of the various embodiments may be deposited by any suitable method. For the organic layers, preferred methods include thermal evaporation, ink-jet, such as described in U.S. Pat. Nos. 6,013,982 and 6,087,196, which are incorporated by reference in their entireties, organic vapor phase deposition (OVPD), such as described in U.S. Pat. No. 6,337,102 to Forrest et al., which is incorporated by reference in its entirety, and deposition by organic vapor jet printing (OVJP), such as described in U.S. patent application Ser. No. 10/233,470, which is incorporated by reference in its entirety. Other suitable deposition methods include spin coating and other solution based processes. Solution based processes are preferably carried out in nitrogen or an inert atmosphere. For the other layers, preferred methods include thermal evaporation. Preferred patterning methods include deposition through a mask, cold welding such as described in U.S. Pat. Nos. 6,294,398 and 6,468,819, which are incorporated by reference in their entireties, and patterning associated with some of the deposition methods such as ink jet and OVJD. Other methods may also be used. The materials to be deposited may be modified to make them compatible with a particular deposition method. For example, substituents such as alkyl and aryl groups, branched or unbranched, and preferably containing at least 3 carbons, may be used in small molecules to enhance their ability to undergo solution processing. Substituents having 20 carbons or more may be used, and 3-20 carbons is a preferred range. Materials with asymmetric structures may have better solution processibility than those having symmetric structures, because asymmetric materials may have a lower tendency to recrystallize. Dendrimer substituents may be used to enhance the ability of small molecules to undergo solution processing.

Devices fabricated in accordance with embodiments of the invention may be incorporated into a wide variety of consumer products, including flat panel displays, computer monitors, televisions, billboards, lights for interior or exterior illumination and/or signaling, heads up displays, fully transparent displays, flexible displays, laser printers, telephones, cell phones, personal digital assistants (PDAs), laptop computers, digital cameras, camcorders, viewfinders, micro-displays, vehicles, a large area wall, theater or stadium screen, lighting fixtures, or a sign. Various control mechanisms may be used to control devices fabricated in accordance with the present invention, including passive matrix and active matrix. Many of the devices are intended for use in a temperature range comfortable to humans, such as 18 degrees C. to 30 degrees C., and more preferably at room temperature (20-25 degrees C.).

The materials and structures described herein may have applications in devices other than OLEDs. For example, other optoelectronic devices such as organic solar cells and organic photodetectors may employ the materials and structures. More generally, organic devices, such as organic transistors, may employ the materials and structures.

The terms halo, halogen, alkyl, cycloalkyl, alkenyl, alkynyl, arylalkyl, heterocyclic group, aryl, aromatic group, and heteroaryl are known to the art, and are defined in U.S. Pat. No. 7,279,704 at cols. 31-32, which are incorporated herein by reference.

Additional definitions for terms as used in this application are provided as follows:

As used herein, the term "commonly addressable" may refer to configurations in which the current in one device (or group of devices) cannot be changed without changing the current in another device (or group of devices). The current and/or current density supplied to each device or group of devices need not be the same. This may be the case, for instance, when a voltage is applied across a plurality of devices (or groups of devices) that have a different resistance or emissive area, when a resistor is electrically connected in series or in parallel with a device or group of devices that is different from a resistor electrically connected in series or parallel with another device or group of devices, or any other manner of establishing different currents and/or current densities to components within a device. However, once the current is established for one device or group of devices, this also sets the current for the other groups. That is, "commonly addressable" may refer to configurations in which there is essentially a single switch that controls whether the devices are "on" or "off" (i.e. whether the devices are driven by a current). The devices or groups of devices may not thereby be individually activated and/or deactivated. In this regard, the OLEDs may also be dimmed (e.g. by reducing the current supplied to the device or portions thereof), but in such a case, each of the OLEDs are dimmed together. That is, if one OLED is dimmed, each of the other OLEDs is also dimmed, though not necessarily by the same proportion. This may be in contrast to devices or groups of devices that are individually addressable.

As used herein, "duv" is a general term that may be used to quantify the difference in chromaticity between different lighting devices (such as OLED displays or components of OLED displays). This can quantified in terms of $duv=\sqrt{(\Delta u'^2+\Delta v'^2)}$, where (u', v') are the coordinates of the different lighting devices in CIE 1976 (L*, u*, v*) color space chromaticity diagram. The CIE 1976 (L*, u*, v*) color space is used in preference over the CIE 1931 XYZ color space because in the CIE 1976 (L*, u*, v*) color space chromaticity diagram, distance is approximately proportional to perceived difference in color. An alternative name for the CIE 1976 (L*, u*, v*) color space chromaticity diagram is the CIE 1976 UCS (uniform chromaticity scale) diagram. The conversion between coordinates in these color spaces is very simple: $u'=4x/(-2x+12y+3)$ and $v'=9y/(-2x+12y+3)$, where (x, y) are the coordinates of the CIE 1931 XYZ color space chromaticity diagram.

The term "Duv" is a specific example of "duv." In this regard, Duv refers to the minimum distance in the CIE 1976 (L*, u*, v*) color space chromaticity diagram of the lighting device chromaticity from the blackbody curve. That is, Duv is a measure of the difference in chromaticity between a lighting device and a blackbody radiator of equivalent correlated color temperature. This can be quantified in terms of $Duv=\sqrt{(\Delta u'^2+\Delta v'^2)}=\sqrt{((u1'-u2')^2+(v1'-v2')^2)}$, where (u1', v1') are the coordinates of the lighting device, and (u2', v2') are the coordinates of the blackbody curve at the minimum distance from the lighting device in the CIE 1976 (L*, u*, v*) color space chromaticity diagram.

As used herein, the "emissive area" of an organic device may refer to the area where recombination occurs and/or photons are generated, which may correspond to the area of overlap of the first electrode and the second electrode. The "area" of overlap of the first and second electrode may refer to the surface area that is substantially perpendicular to the propagation direction of the majority of the light that passes though the electrode.

As used herein, the term "substantially the same device structure" may refer to the vertical layered structure of two or more OLEDs being similar, but allowing for different emissive areas. For instance, a first device structures may be "substantially the same" as a second device structure if (1) the OLED stack of the first device consists essentially of the same layers of the OLED stack of the second device; (2) the OLED stack of the first device is structurally equivalent to the OLED stack of the second device; and/or (3) the OLED stack of the first device is functionally equivalent to the OLED stack of the second device. The OLED stack may include the electrodes and the organic layers.

As used herein, the organic stack of a first device "consists essentially of" the organic layers of the organic stack of a second device if the first and second stack include the same materials and layers, but one or both of the stacks may additionally include one or more materials that the other stack does not comprise but which does not appreciably affect the light emission characteristics of the device. Again, it should be noted that the emissive area of each of the devices may be different.

As used herein, a first organic stack is "structurally equivalent" to a second organic stack if the first organic stack comprises materials that are the same as the second organic stack, and the thickness and concentrations levels of these materials (while not necessarily precisely identical) are within experimental error. For instance, the thickness and concentrations of each of the layers of the first organic stack may be within 5% of the corresponding layers in the second organic stack. Again, it should be noted that the emissive area of each of the devices may be different.

As used herein, a first organic stack is "functionally equivalent" to a second organic stack if the first organic stack comprises the same layers as the second organic stack, with only variations that do not significantly affect the JV characteristics or the light emission characteristics of the organic stack. The variations may be in any form, by way of example, differences in thickness, concentrations, and/or material. By using this terminology, it is intended to encompass a situation where devices are not exactly identical, but the differences comprise, for instance, only a slight change to the thickness of a layer; a slight modification to a concentration of one of the layers; a material substitution with a material known to behave in the same way, and/or other small modifications such that a person of ordinary skill in the art would understand that the devices would function the same way for purposes of an illumination source. If one of skill in the art believes that light emissions from one device can reasonably be used to replace the light emissions of another device without altering the characteristics of the light emissions from an illumination device (e.g. the duv between the first device and the second device is less than 0.05 or, preferably within 0.01), the devices are "functionally equivalent." These situations, and other differences that do not materially affect the characteristics and function of the device, are intended to be covered by this language. Again, it should be noted that the emissive area of each of the devices may be different.

It is often believed that large uniform panels mimic the illumination from an overcast day and may therefore provide for a relatively depressing atmosphere. The inventors have thereby determined that it may therefore be generally desirable to add some tonal variety into a large area lamp (such as an OLED lamp) without separating the individual pixels into their respective red, blue and green components, which could be distracting to an observer.

In general, there have been significant efforts in the OLED lighting field to fabricate uniform lighting devices (such as large area lighting panels). This effort has failed to focus on taking advantage of the non-uniform brightness of OLED lighting. An OLED is a current control diode, and therefore the brightness of an OLED may be reduced, for instance, by reducing the current density that is used to drive the device. This dimming may be achieved without power loss. Where there are multiple OLEDs on a lighting device, a brightness variation can be realized by individually addressing each device. That is, for instance, a brightness variation could be accomplished with a large area display. Although this method may be effective in creating a brightness variation in the device, it may typically add significant complication and cost to the panel associated with this individual addressability functionality. For example, the cost of adding a backplane and drive circuitry may be prohibitive for lighting applications. In addition the emissive area for such a device may be reduced, owing to the need for a backplane and drive circuitry, which may reduce the total light output from the device. The inventors have recognized these issues and have developed embodiments of devices that may create brightness variation in lighting devices that may comprise a plurality of commonly addressable OLEDs. Such devices may be less expensive, less complex, and/or easier and faster to manufacture. The brightness variation may be achieved by controlling the current density delivered to the OLEDs (e.g. to commonly addressable OLEDs, such as those comprising a common organic stack) on a light device. In addition, embodiments may allow for light to be better controlled or directed and/or for certain areas of the panel to be highlighted.

In lighting devices that comprise transparent electrodes for conducting electricity (e.g. devices comprising OLEDs), the conductivity of such transparent electrodes is often limited. As a result, the resistance of the electrode may cause a voltage drop when the current is delivered from a conductor, through the electrode, to an area farther away from the conductor (e.g. to the second electrode). One way to address this resistive loss is to divide the panel into multiple pixels and then connect the pixels together either by series or parallel connections.

In this regard, the use of series connections of OLEDs (i.e. connecting multiple devices in series) have been utilized in lighting applications. This may provide several benefits, including reducing current, which may reduce power consumption by reducing resistive losses in transporting current across the lighting device. Using series connections for devices comprising a plurality of OLEDs may also improve the yield of the lighting device because, for instance, if one device in a series string fails short the others may continue to work. Exemplary embodiments of OLED devices that are connected in series are described in U.S. Pat. No. 6,693,296; U.S. Pat. No. 6,800,999; U.S. Pat. No. 7,012,585; U.S. Pat. No. 7,049,757; U.S. Pat. No. 7,034,470; U.S. Pat. No. 6,870,196; U.S. Pat. No. 7,198,533; U.S. Pat. No. 7,576,496; and U.S. Pat. No. 7,760,165, each of which is hereby incorporated by reference in their entireties. These references do not disclose, at least, driving a plurality of substantially similar devices at different current densities so as to generate deliberate non-uniformity in a panel (e.g. by utilizing different emissive areas for the OLEDs, supplying different current densities to similar devices, etc.). In addition, while U.S. Pat. No. 6,909,233, may discuss OLED pixels of different sizes, it is with reference to OLEDs that are not substantially the same (that is, it focuses on different size OLEDs related to the three color pixels, with the idea of making the blue OLED pixels larger than the other colors so they can be operated at lower brightness) and/or may not be commonly addressable.

Reference may be made below to some of the figures provided in describing four exemplary embodiments of lighting devices that comprise a plurality of OLEDs and that have brightness variation. The exemplary embodiments provided below may illustrate lighting devices that may in some embodiments drive OLEDs that are substantially similar using different current densities to deliberately create non-uniformity of the lighting device. It should be appreciated that although initially described with reference to four particular exemplary embodiments, the concepts and principles recognized and developed by the inventors and as described herein may be broader than the specific examples provided, and should not therefore be limited. Moreover, features described with reference to one exemplary embodiment may be applicable to other embodiments, as a person of ordinary skill in the art would understand after reading this disclosure.

First Exemplary Embodiment

Figure 17:
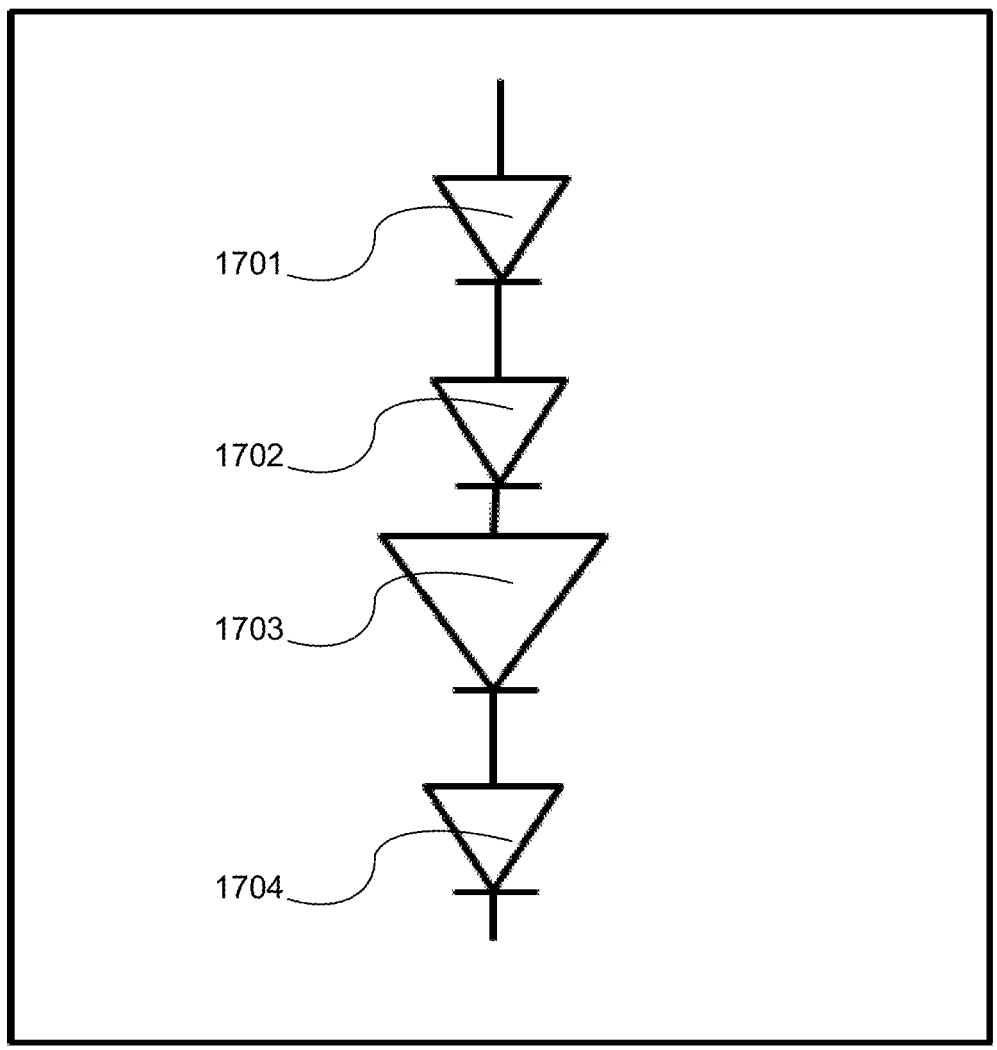
FIG. 17 shows an exemplary configuration of OLEDs electrically connected in series in accordance with some embodiments.

In a first exemplary embodiment, controlled brightness variation may be achieved by utilizing a light panel layout that has one or more strings of OLEDs connected in series, where the individual OLEDs in the series strings have different emissive areas. The OLEDs in a series string are by definition all driven with the same current and therefore the OLEDs having a smaller emissive area are driven with greater current density than the devices with larger emissive areas and are thus brighter (i.e. they have a higher luminance). An example of the first exemplary embodiment is show in FIG. 17 for illustration purposes. As shown in FIG. 17 and the other figures disclosed herein, each triangle in these partial circuit diagrams represents an OLED, and the different size triangles represent OLEDs having different emissive areas. For instance, as shown in FIG. 17, OLEDs 1701, 1702, and 1704 are shown as being smaller than OLED 1703. Thus, in this example, OLED 1703 would have a larger emissive area than OLEDs 1701, 1702, and 1704, and would thereby be driven at a lower current density for the same current supplied to all four OLEDs in the series string (and thus operates at a lower brightness level). As noted above, these brightness variations may in some embodiments add a pleasant tonal variation to the lighting panel without the additional drive electronics associated with a display or other similar type device.

Figure 18:
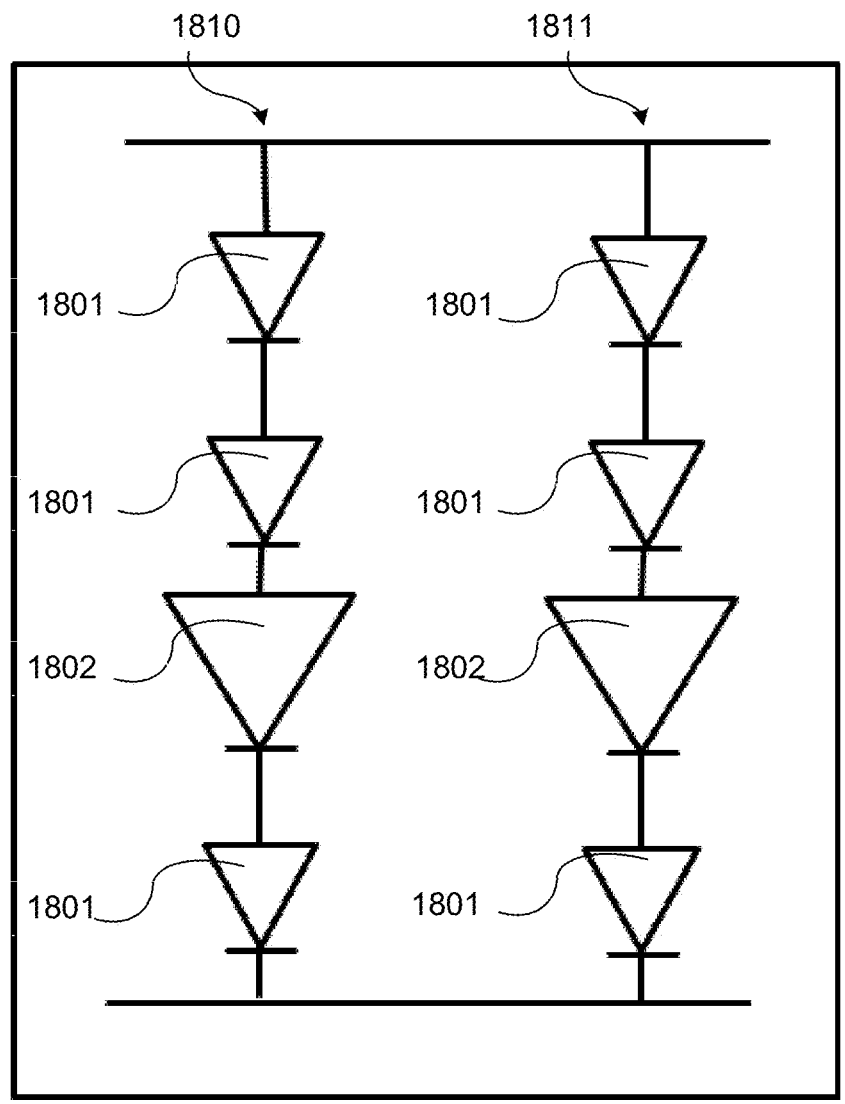
FIG. 18 shows an exemplary configuration of OLEDs electrically connected in series and in parallel in accordance with some embodiments.

In addition, some embodiments may connect multiple substantially similar series strings in parallel on a single device. An example of this is shown in FIG. 18 for illustration purposes. As shown in FIG. 18, each of the OLEDs 1801 are shown as comprising approximately the same emissive area, whereas each of the OLEDs 1802 is shown as comprising a larger emissive area than the OLEDs 1801. Moreover, each of the series strings 1810 and 1811 are shown as comprising the same number of OLEDs 1801 and 1802, arranged in the same order. Thus, each of the series strings 1810 and 1811 are substantially the same and, as shown, are electrically connected in parallel such that the same current may drive each of the series strings. If the same current drives each series string, then each of the OLEDs 1801 on each series string will operate at approximately the same current density and brightness. The same is true for the each of the OLEDs 1802. It should be noted, however, that in some embodiments, the series strings 1810 and 1811 may not be connected in parallel and/or a different current may be supplied to each series strings, which could also result in tonal variation across the device. Note that the position of each OLED within each series string does not affect the current density within each OLED. The same current and therefore the same current density will flow through each OLED regardless of its position. However, the position of each OLED within each series string may affect the visual appearance of the panel (e.g. if the relative positions of two OLEDs—one OLED driven at a first current density and one OLED driven at a second current density—are different between two series strings, then the tonal variation across the series strings may appear different).

In some embodiments (such as those described with reference to the exemplary third embodiment discussed below), multiple series strings that are not substantially the same may be connected in parallel to achieve controlled brightness variation for a lighting device. Examples are provided in FIGS. 19(a) and 19(b) for illustration purposes. Although described in more detail below, FIG. 19(a) shows two series strings 1910 and 1911 of OLEDs that are electrically connected in parallel. The first series string comprises OLEDs 1901 in series with OLED 1902 having a different emissive area than OLED 1901. Series string 1911 comprises OLEDs 1901, 1902, and 1903, each of which has a different emissive area, and thereby when a current is supplied to the series branch 1911, each of the OLEDs 1901-1903 will be driven by a different current density. Similarly, in series string 1910, each of the OLEDs 1901 will be driven by a different current density than OLED 1902. In FIG. 19(b), two series strings 1920 and 1921 of OLEDs are shown as electrically connected in parallel. Series string 1920 comprises three OLEDs 1901 having the same emissive area, and one OLED 1902 having a larger emissive area. Therefore, when a current is supplied to the series string 1920, the OLEDs 1901 having a smaller emissive area will operate at a higher current density (and higher brightness) than the OLED 1902. The series string 1921 comprises OLEDs 1901 that each have the same size emissive area, and thereby when a current is supplied, each OLED 1901 in series string 1921 will operate at the same current density. However, the OLEDs 1901 of series string 1921 may operate at a different current density than the OLEDs 1901 of series string 1920. In the example shown in FIG. 19(b), the OLEDs 1901 of series string 1920 will operate at a higher current density (i.e. also higher brightness) than the OLEDs 1901 of series string 1921. This is because as illustrated the OLED 1902 operates at lower current density, and therefore lower voltage than the OLEDs 1901 of series string 1920. The voltage across the OLEDs 1901 in series string 1920 is therefore greater than the voltage across OLEDs 1901 in series string 1921, which leads to higher current density and higher brightness for OLEDs 1901 in string 1920. It should be understood that any combination of OLEDs having the same or different emissive areas may be used to create tonal variation (based on driving OLEDs at different current densities) across the device in some embodiments.

As noted above, a preferred embodiment to drive an OLED device (such as a light panel) may be to connect a large number of OLEDs in series. When an OLED fails, it tends to fail short (in contrast to LEDs, which tend to fail open). If a device (such as a lamp) comprises a single OLED or a number of OLEDs connected in parallel, then the entire device may fail with one short. However, if, for example, twenty equal sized OLED devices are connected in series, a short in one of the devices may only reduce the total light output by 5% (which for many applications, will allow the device to still function for its intended purpose). In addition, a string of OLEDs connected in series runs at higher voltage and lower current (for the same light output) because the same current passes through all the OLEDs. This reduces $I^2R$ losses in the bus lines and electrodes of the OLEDs, particularly when the electrodes comprise materials such as ITO, which is typically not a very conductive material (i.e. the material has relatively high resistive losses). By connecting the OLED devices in series, the device may have reduced power loss, and may (in typical devices) also tend to lead to improved brightness uniformity (as there is less resistive power losses between devices).

However, as noted above, large lighting panels emitting uniform light (and in particular white light) are not an optimal design based on the impression that an observer may have of the light emitted by such a device. The low level, uniform light output tends to mimic a heavily overcast day and can therefore create a depressing atmosphere. The inventors have thereby recognized that it would be advantageous to include, for example, some specular highlights, or at least some tonal variation, across a large area light panel to alleviate or eliminate this effect.

In this context, "tonal variation" may be used to describe a situation where the brightness of the light source may be varied, but the chromaticity remains substantially the same. Generally speaking, the concept of color may be divided into two parts: brightness and chromaticity. For example, the color white is a bright color, while the color grey is considered to be a less bright version of that same white. In other words, the chromaticity of white and grey are the same, while their brightness differs. Expanding on this concept, the term "grayscale" may be used to describe a situation where there are multiple brightness levels, but substantially no change in chromaticity. It should be understood in this context, that a light source with "tonal variation" may appear to emit light of different colors, but this difference in color arises from a change in brightness rather that a change in chromaticity.

In this regard, as described above, this first exemplary embodiment may introduce tonal variations in a lighting device (such as an OLED light panel) by operating multiple OLEDs in series, but designing at least some of the OLEDs to have a different emissive area. In some embodiments, the devices with different emissive areas may, for instance, alternate down a series string (however, embodiments are not so limited). Each of the pixels in a series string are all supplied with the same current, and therefore the smaller pixels in the string will operate at a higher current density and will be brighter (i.e. will have higher luminance). For example only, to a close approximation, if OLED "B" has an emissive area that is half the size of the emissive area of OLED "A," then OLED B will typically operate at twice the brightness for the same current supplied to each device (though both OLEDs will emit approximately the same total light output). Thus, in this exemplary embodiment, by varying the ratio of emissive areas of at least some of the OLEDs, it is possible to design tonal variation across a lighting device (e.g. a lighting panel) while maintaining some or all of the advantages of an OLED series design.

Furthermore, while many OLED applications typically seek to make the smallest possible pixels (i.e. the smallest emissive area of the OLED) so that the individual pixels cannot be resolved by the eye, embodiments provided herein may utilize OLEDs having emissive areas that are large enough to be individually resolvable to the observer. The size of each OLED emissive area may depend on the lighting application, and in particular, the typical distance of an observer from the light source. For typical room lighting, OLEDs having an emissive area on a scale of about 1 cm$^2$ up to about 10 cm$^2$ may be preferred. However, these sizes are purely exemplary and should not be considered restrictive because lighting applications that are closer (e.g. task lighting) or further away (e.g. large room illumination) from an observer may each have a different optimal OLED emissive area size. For instance, embodiments may also be used in billboard type lighting applications, where observers may be hundreds of feet away, and thereby the emissive area size of the OLEDs could be on the order of 100 cm$^2$. In addition, the largest achievable OLED emissive area size may also depend on the conductivity of the electrodes because, for instance, very large OLED emissive areas may suffer non-uniformity due to resistive losses over the electrode area. In addition, this sort of size range may make it easier to fabricate these OLED structures using shadow masks because high resolution deposition is not required. The use of deposition that utilizes a shadow mask is one method to pattern OLED pixels with different emissive areas in a single low-cost step; however, any method known in the art may be used. It should be understood that many of these considerations (including selection of the size of the emissive area for the OLEDs), although described with reference to the first exemplary embodiment, may be equally applicable to other embodiments, including those described herein.

To obtain greater light output from a panel area, it may be desirable to fill as much of the panel with light emitting structures as possible. A preferred configuration in some embodiments is for the OLEDs to fill space to the maximum extent possible, within the restrictions of patterning, bus line layout, drive circuitry, encapsulation, etc. In mathematical terms, it may be desirable that the OLED emissive areas tessellate—that is, the OLED devices comprise a pattern of plane figures (i.e. the shape of the emissive area) that fills the plane with no overlaps and no gaps. The only regular polygons that tessellate are squares, equilateral triangles and hexagons, but because many exemplary devices may deliberately introduce irregularity into the pattern (e.g. to achieve different current densities and/or variable brightness of the device), there is a vast range of patterns available for use in some embodiments using irregular polygons or combinations of the same. Examples of such embodiments are shown in FIGS. 3-8 and described herein.

Figure 3:
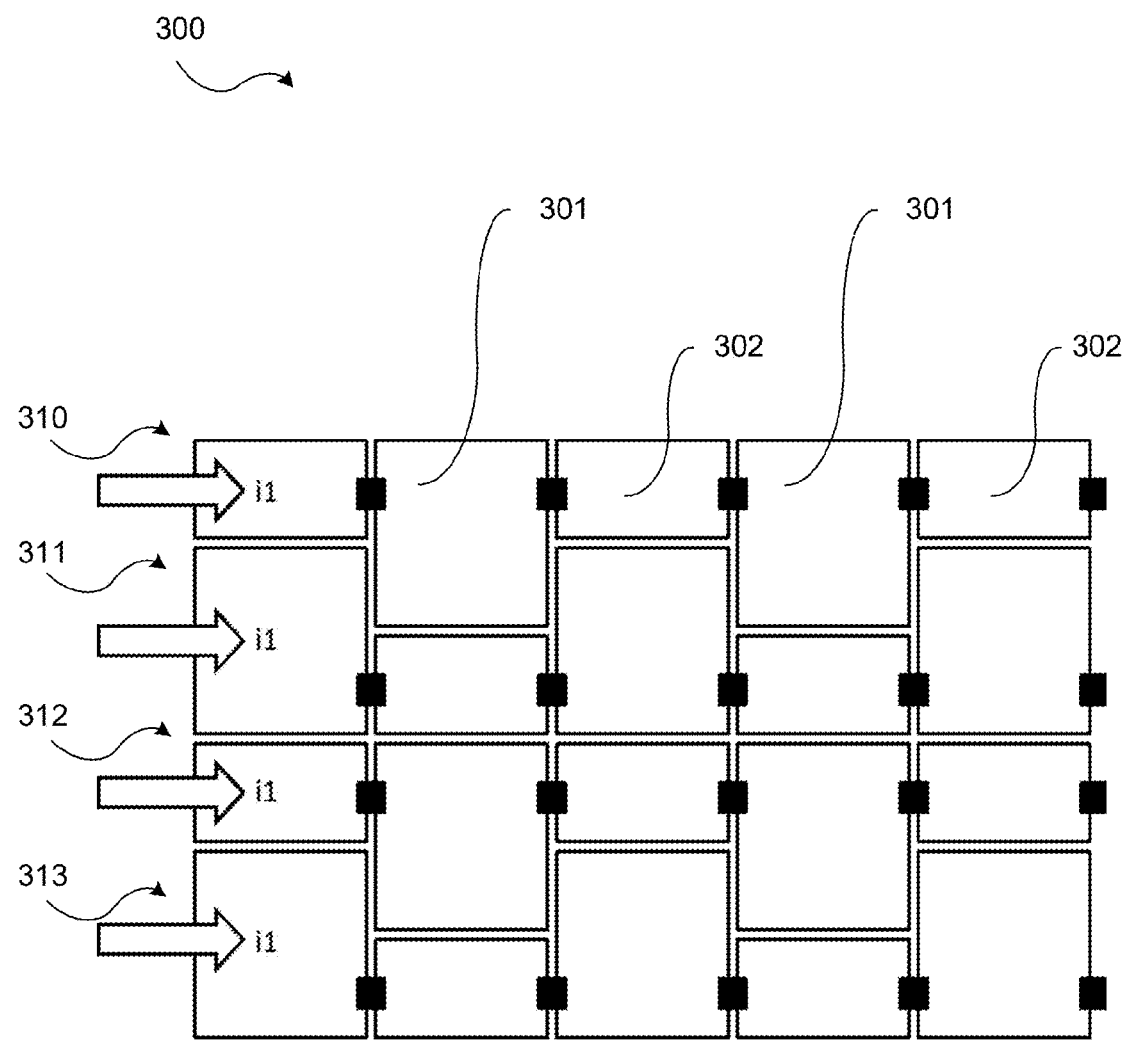
FIG. 3 shows an exemplary device according to some embodiments wherein two or more substantially similar devices having different emissive areas are connected in series.

With reference to FIG. 3, a relatively simple example of a lighting device 300 in accordance with aspects of a first exemplary embodiment as described above is shown. It should be noted that in this and the other figures provided herein, the black outline represents an OLED emitting area and the small black square represents a series connection between adjacent OLEDs. There are multiple ways to accomplish a series connection that are all well described in the art, including those incorporated by reference herein. Moreover, although depicted and explained as comprising series connections, some embodiments may also utilize parallel electrical connections and/or combinations of series and parallel connections.

In the example embodiment shown in FIG. 3, series strings 310-313 of alternating square 301 and rectangular 302 OLEDs are connected in series to a current source, which drives a current ($i_1$) through each series string 310-313. In this exemplary embodiment, each of the OLEDs 301 has substantially the same device structure as each of the OLEDs 302, as that term was defined above. As illustrated in this exemplary embodiment, the OLEDs 302 having a rectangular emissive area have approximately half the emissive area of the OLEDs 301 having a square emissive area. The same current ($i_1$) passes through all of the OLEDs (e.g. OLEDs 301 and 302) in a series string (e.g. series string 310). Therefore, in this exemplary embodiment, the OLEDs 302 having a rectangular emissive area operate at approximately twice the brightness as the OLEDs 301 having a square emissive area. In this manner, the exemplary lighting device 300 may have variable brightness based on the location and arrangement of the OLED devices 301 and 302 having different emissive areas. In the exemplary embodiment shown in FIG. 3, the input current ($i_1$) is the same for all series strings 310-313, however, embodiments are not so limited and any suitable current may be used for each of the series strings 310-313. Moreover, the OLEDs 301 and 302 need not be in a regular pattern, but may be arranged in any suitable manner. Furthermore, in some embodiments, there may be more than two different OLED emissive areas for a device 300 (see, e.g. FIG. 6).

Figure 4:
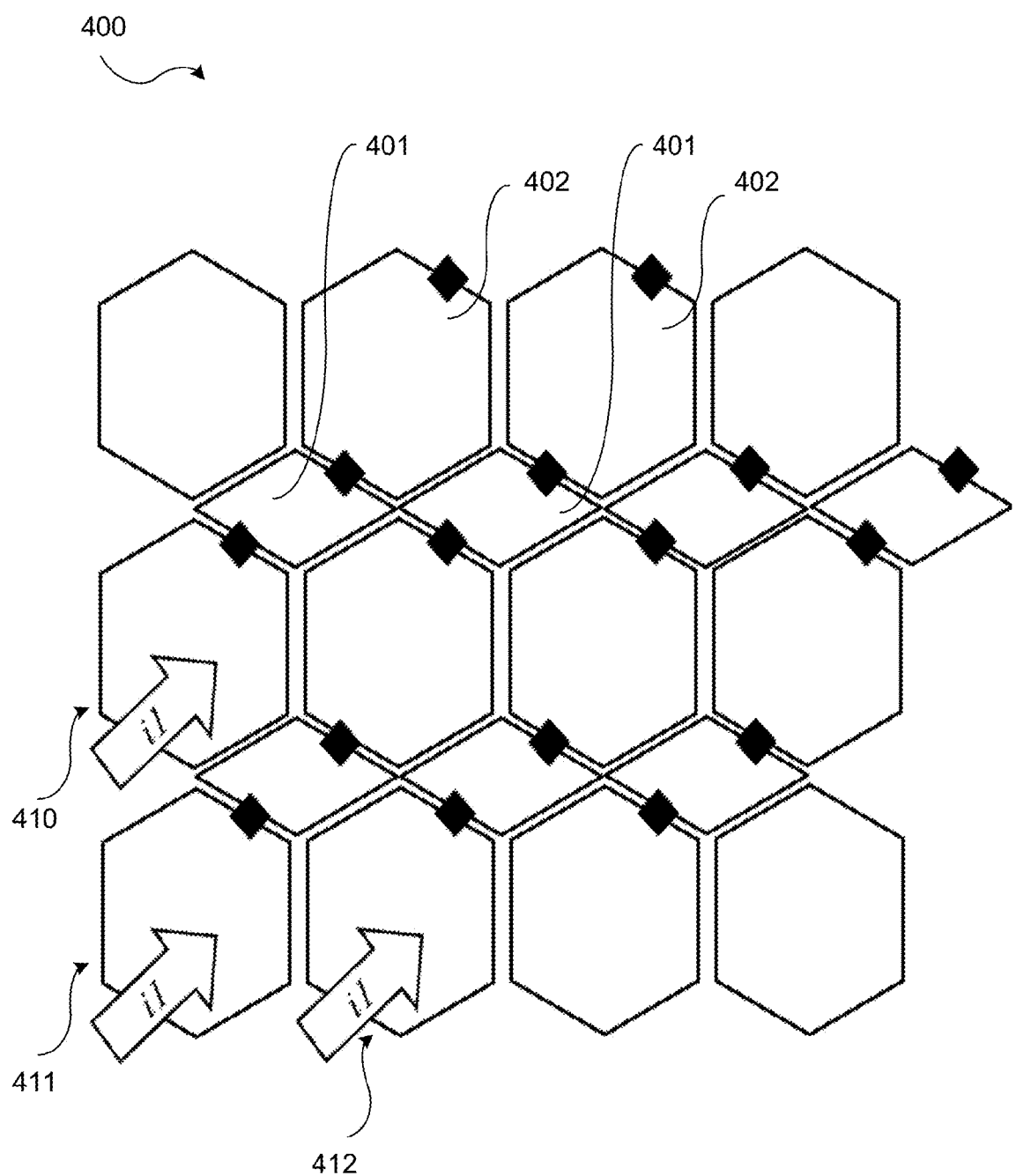
FIG. 4 shows an exemplary device according to some embodiments wherein two or more substantially similar devices having different emissive areas are connected in series.

With reference to FIG. 4, another exemplary embodiment of a lighting device 400 comprising a plurality of OLEDs (e.g. OLEDs 401 and 402) and having a variable brightness across the device is shown in accordance with aspects of the first exemplary embodiment as described above. As noted above, in some embodiments, any polygon or combination of polygons may be used for the emissive areas of the OLEDs. In the exemplary device 400 shown in FIG. 4, two different polygons are used for the emissive area of the OLEDs to achieve a space-filling pixel tessellation. In particular, the OLED emissive areas are alternately regular hexagons 402 and regular parallelograms 401. As noted above with reference to FIG. 3, the OLEDs may be arranged in any suitable manner, and need not alternate or form any pattern. Similar to the device 300 in FIG. 3, the OLEDs are electrically connected in a plurality of series strings 410-412. A current $i_1$ is driven through each of the OLED series strings 410-412. As shown in FIG. 4, the OLEDs 401 and 402 each have different size emissive areas, and therefore because they are each driven at the same current $i_1$ and the devices themselves has substantially the same device structure, each OLED 401 will have a brightness that is greater than the brightness of the OLEDs 402 having the larger emissive area.

Figure 5:
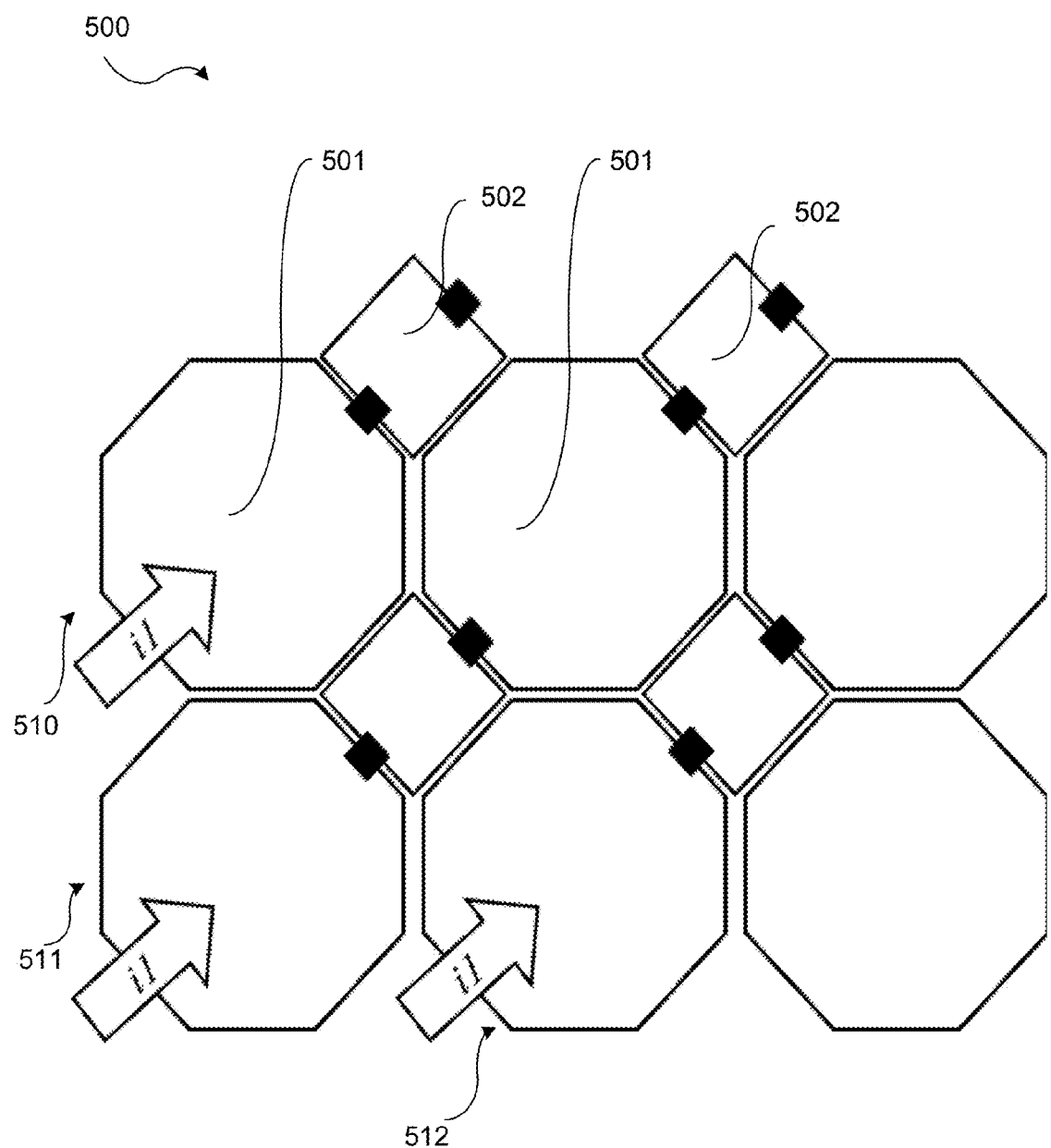
FIG. 5 shows an exemplary device according to some embodiments wherein two or more substantially similar devices having different emissive areas are connected in series.

With reference to FIG. 5, another exemplary embodiment of a lighting device 500 in accordance with aspects of the first exemplary embodiment described above is shown. In particular, the device 500 in FIG. 5 comprises OLEDs having one of two different polygons as the shape of the emissive areas (OLEDs 501 and 502), and specifically comprises a combination of regular octagons 501 and squares 502 electrically connected in a plurality of series strings 510-512. Similar to the embodiments in FIGS. 3 and 4, the device 500 in FIG. 5 supplies the same current $i_1$ to each of the series strings 510-512, however, embodiments are not so limited. As shown, the OLEDs 501 have an emissive area that is larger than the emissive areas of the OLEDs 502, and therefore (assuming that each of the OLEDs 501 and 502 has substantially the same device structure), the OLEDs 502 comprising square emissive areas will be brighter (based on the higher current density) than the OLEDs 501 having an emissive area in the shape of an octagon.

Figure 6:
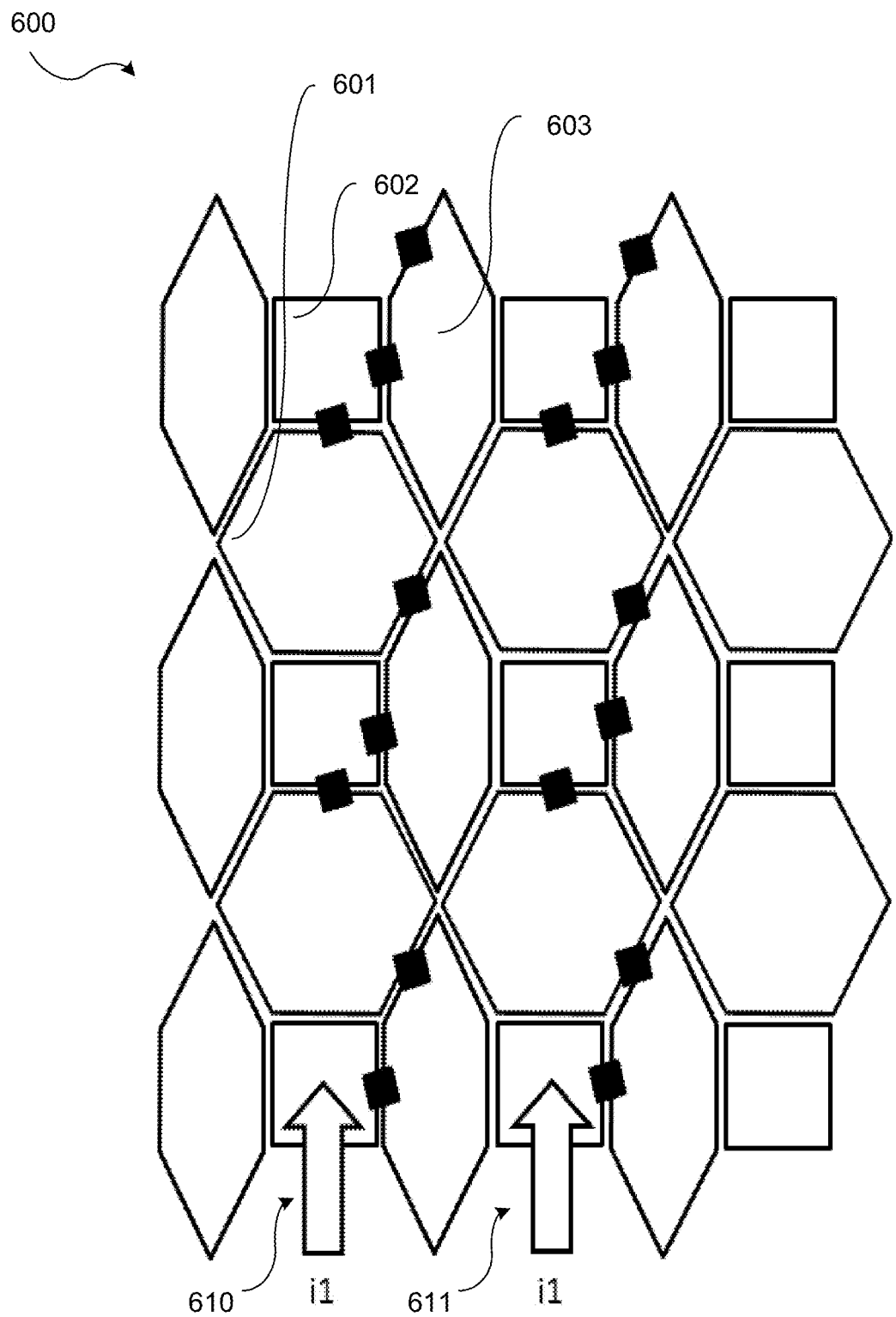
FIG. 6 shows an exemplary device according to some embodiments wherein two or more substantially similar devices having different emissive areas are connected in series.

With reference to FIG. 6, another exemplary embodiment of a device 600 is shown in accordance with aspects of the first exemplary embodiment as described above. The exemplary device 600 is shown as comprising OLEDs 601-603 having three different polygons that are tessellated to produce a desired panel design. It should be understood that embodiments may comprise any number of OLEDs having emissive areas in any number of suitable shapes and sizes, and the device may comprise any combination of such devices. As shown in FIG. 6, in some embodiments, the lighting device 600 may have tonal variation across the lighting device (e.g. a lamp surface) that would yield three different brightness levels. That is, OLEDs 602 are shown has having the smallest emissive area (and thereby the highest current density and brightness for the common current $i_1$), and OLEDs 603 are depicted as having an emissive area that is smaller than the OLEDs 601, and thereby will have a higher current density and brightness for the common current $i_1$ than the OLEDs 601 (assuming that the OLEDs 601-603 have substantially the same device structure). The plurality of series strings 610 and 611 are shown as having the same current $i_1$, although embodiments are not so limited.

As noted above, there is a large set of potential combinations of regular polygons that are space-filling and may thereby satisfy one of the preferred embodiments that has all, or substantially all, of the area of a light panel comprising an OLED emissive area. Such panel designs may utilize designs such as those shown at Weisstein, Eric W., *Tessellation* [online], from MathWorld—A Wolfram Web Resource [retrieved on 2011 Jul. 25], retrieved from the Internet: <URL: http://mathworld.wolfram.com/Tessellation.html>, which is hereby incorporated by reference in its entirety. Embodiments may also encompass non-periodic tilings (because, for instance, any practical light source is finite) such as the designs comprising Kepler or Penrose tilings, examples of which are described in detail in: Dutch, Steven, *Penrose Tiles* [online], 1999 [retrieved 2011 Jul. 25], retrieved from the Internet: <URL: http://www.uwgb.edu/DutchS/SYMMETRY/penrose.htm>, which is hereby incorporated by reference in its entirety. Thus, panel designs comprising OLEDs arranged in any matter such as those listed above may be used.

Figure 7:
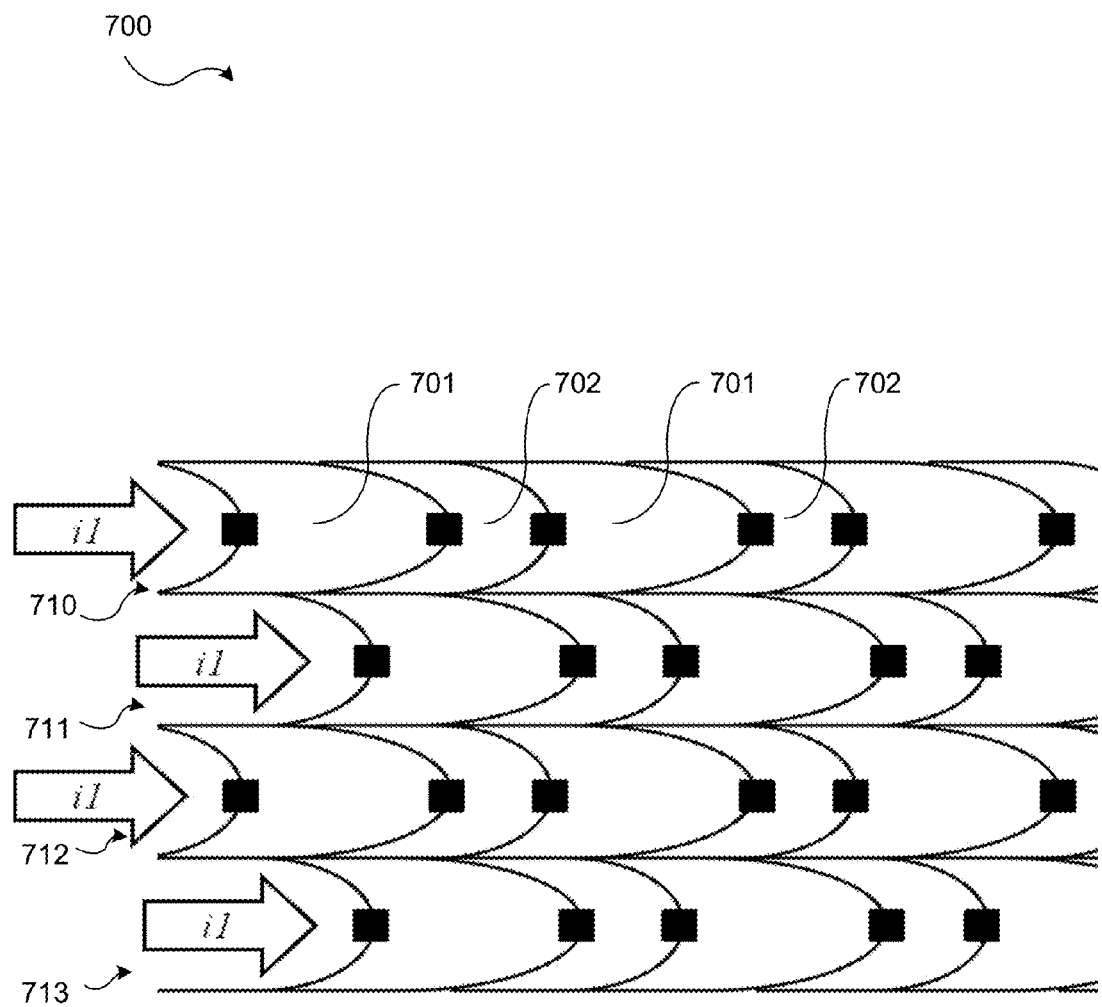
FIG. 7 shows an exemplary device according to some embodiments wherein two or more substantially similar devices having different emissive areas are connected in series.

With reference to FIG. 7, another exemplary embodiment of a device 700 is shown in accordance with aspects of the first exemplary embodiment as described above. The layout of the OLEDs in FIG. 7 shows an example beyond that of emissive areas comprising polygonal shapes and includes emissive areas with curved edges. As shown, the exemplary device 700 comprises a plurality of OLEDs 701 and 702 electrically connected in a plurality of series strings 710-713. The emissive areas of the OLEDs 702 are shown as having an area that is less than the emissive area of the OLEDs 701. As shown, a current $i_1$ is supplied to each of the series strings 710-713. As shown, the OLEDs 702 have an emissive area smaller than the emissive area of the OLEDs 701 and will have a higher current density for the same supplied current $i_1$ (and thereby have a higher brightness assuming that the plurality of OLEDs 701 and 702 have substantially the same device structure), thereby provide the exemplary lighting device 700 with a controlled brightness variation.

It should be understood that the panel design shown in FIG. 7 is exemplary, and that any suitable shape for the emissive area of the OLEDs, including irregular shapes and those with rounded edges, may be used. OLEDs (and devices comprising OLEDs) having such shapes may be readily manufactured using, for example, shadow masks and deposition techniques known in the art. In this manner, a broad array of OLED emissive area designs may be included in embodiments of lighting devices such as the exemplary device 700 shown in FIG. 7, including by way of example, irregular space-filling models such as those described in U.S. Pat. No. 7,393,155 entitled "Irregular Tessellated Building Units," which is hereby incorporated by reference in its entirety. It may be preferred in some embodiments that the panel design and corresponding OLED shapes are amenable to being connected in series. However, this may not always be possible and may need to be considered in choosing the design layout. For example, the pattern of the emissive areas of the OLEDs shown in FIG. 6 may not be connectable in series if the irregular hexagon OLEDs 603 were to be further divided into OLEDs having one square emissive area and two triangle emissive areas. With this in mind, additional shapes that may be used in some embodiments could include some or all of the patterns shown in David, Hollister, 17 *Wallpaper Groups* [online], [retrieved on 2011 Jul. 25], retrieved from the Internet:<URL: http://clowder.net/hop/17walppr/17walppr.html (accessed Jul. 25, 2011)>, which is hereby incorporated by reference in its entirety.

Figure 8:
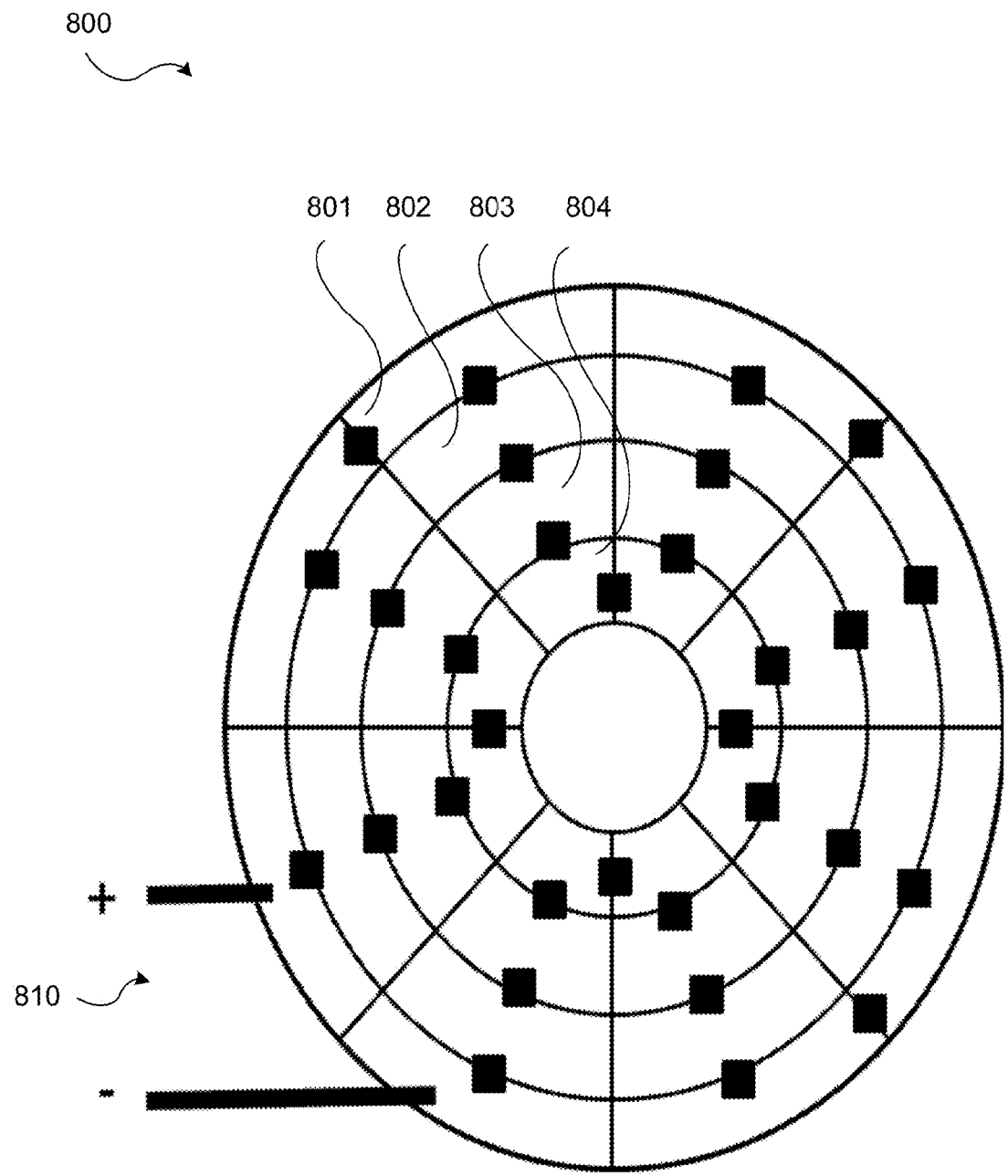
FIG. 8 shows an exemplary device according to some embodiments wherein two or more substantially similar devices having different emissive areas are connected in series.

With reference to FIG. 8, another exemplary embodiment of a device 800 is shown in accordance with aspects of the first exemplary embodiment as described above. As shown in FIG. 8, a circular lighting panel 800 is radially pixilated (i.e. comprises a plurality of OLED devices 801-804) and connected in series, so that the pixels (i.e. the OLED devices 804) closer to the center of the circle are naturally smaller than those near the circumference (i.e. the OLED devices 801). In the exemplary embodiment shown in FIG. 8, the result is a circular lighting device that is brighter near the center than at the edge (assuming the OLEDs 801-804 have substantially the same device structure). As shown, the current may be supplied to the OLEDs 801-804 connected in series by source power supply 810. The degree of tonal variation can be controlled by, for instance, varying the diameter of the concentric rings dividing the pixels (i.e. the plurality of OLED devices 801-804). Note that the same topological layout can be applied to any polygonal shape, including squares, pentagons, hexagons, octagons, star shapes, and higher order polygons, etc.

As noted above with reference to each of the examples used to illustrate the first exemplary embodiment described above, each exemplary device may include multiple series strings of OLED devices having substantially the same device structure on a single panel. However, embodiments are not so limited, and the devices may comprise additional OLEDs that have different device structures. In some embodiments, these series strings could be connected in parallel and driven from a single voltage or current source. The connection of multiple different series strings of OLED devices on a single panel will be described in more detail with respect to the third exemplary embodiment discussed in detail below.

It should be understood that any suitable method of manufacturing a lighting device comprising serially connected OLEDs known in the art may be used in creating some or all of the exemplary embodiments discussed above, including those in the documents that have been incorporated by reference herein. For instance, in some embodiments, traditional deposition techniques may be used with a shadow mask that comprises openings of different sizes corresponding to the different size and/or shape of the OLEDs (and the emissive areas of each of the OLED devices).

Figure 9:
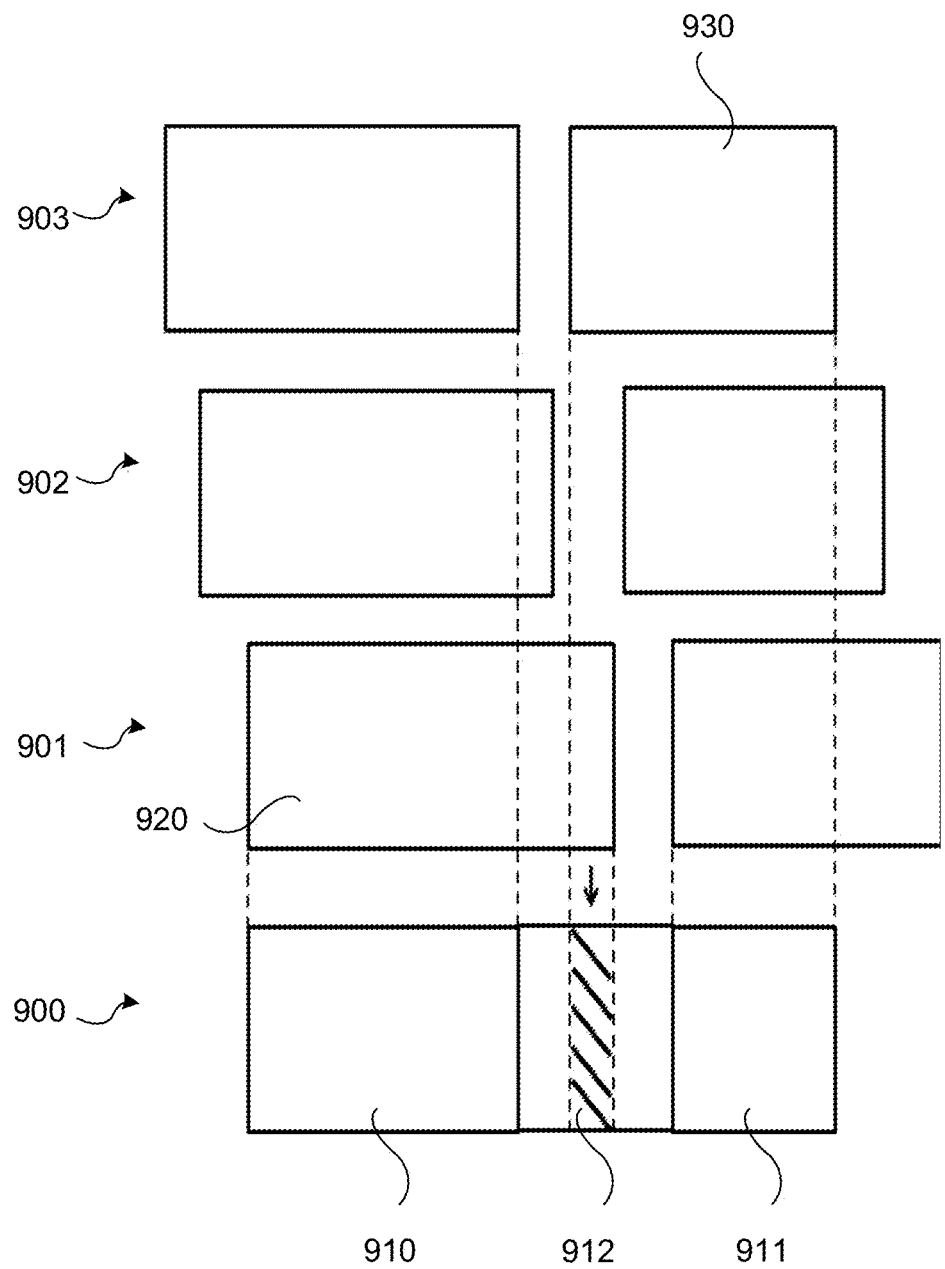
FIG. 9 illustrates an exemplary method of forming series connections between two or more lighting devices.

In this regard, an exemplary deposition method is shown in FIG. 9 involving a patterned anode and the use of shadow masks for the deposition of the organic layers and the cathode layers, respectively. FIG. 9 shows an expanded view of the layers of two exemplary devices, which maintains the relative positions of the layers along the x-axis (i.e. horizontal axis in FIG. 9) so as to show the relative positions of the layers for each OLED. As shown in FIG. 9, the exemplary technique uses a patterned anode layer 901, patterned organics layer 902, and patterned cathode layer 903, resulting in the structure 900 of the OLEDs shown at the bottom of FIG. 9. The region 912 comprises the series connection between the first OLED 910 and the second OLED 911, where the anode 920 of the first OLED 910 makes electrical contact with the cathode 930 of the second OLED 911. As indicated in FIG. 9, neither the anode layers 901 nor the cathode layers 903 of each of the OLEDs are in electrical contact. However, as indicated by the dotted lines in FIG. 9, the cathode 930 of the second OLED 911 overlaps with (i.e. is in electrical contact with) the anode 920 of the first OLED 910. To manufacture (e.g. grow) exemplary structures having different emissive areas such as the embodiments described herein, some exemplary depositions techniques may utilize openings in the shadow mask that have different sizes corresponding to the different OLEDs.

Second Exemplary Embodiment

In a second exemplary embodiment, the brightness variation of a device may be controlled by controlling the potential drop in delivering the current to multiple OLED devices connected in parallel (and/or connected in a plurality of series strings or electrical "branches," which are then connected in parallel) on the device (e.g. on a light panel). By controlling the potential drop in delivering current, the current density and brightness of each OLED (or string of OLEDs) may be controlled. This may be achieved in some embodiments with a minimal loss of efficacy, based in part on the relatively steep OLED current-voltage curve. The OLED devices themselves could have the same or different size emissive areas.

Figure 10:
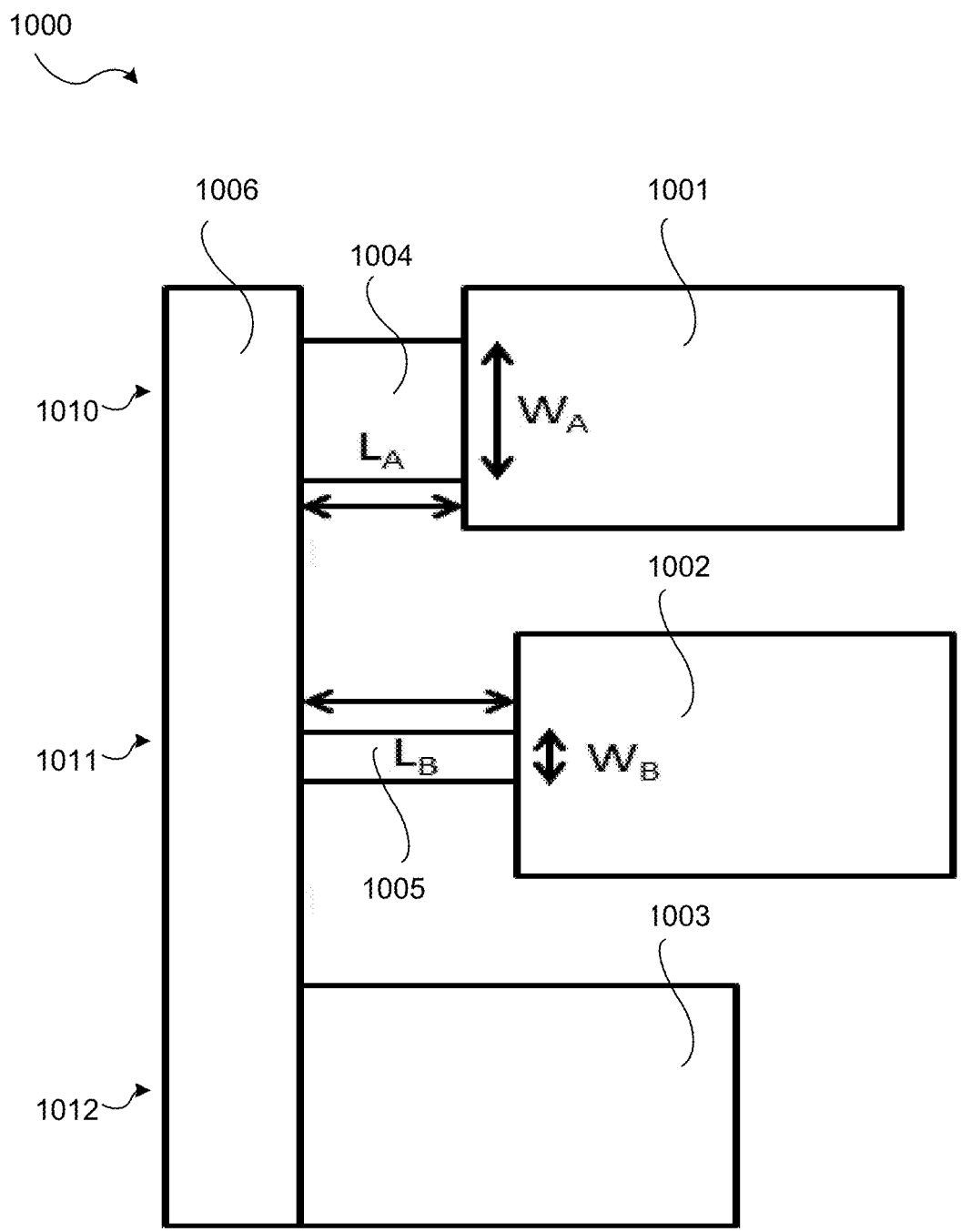
FIG. 10 shows an exemplary device according to some embodiments wherein one or more control resistors are utilized.

Controlling the potential drop across one or more OLEDs may be achieved in any suitable manner. For illustration purposes, an exemplary configuration and embodiment is shown in FIG. 10. As shown, a highly conductive bus line 1006 may be used to distribute current from the electrode contacts of each OLED 1001-1003 across the exemplary device 1000. A control resistor (e.g. resistors 1004 and 1005) may be connected in series with the bus line 1006 and some or all of the OLEDs of the device 1000 (e.g. OLEDs 1001 and 1002 are connected to a control resistor, but OLED 1003 is not connected to a control resistor as shown in FIG. 10). The resistance of the control resistors may determine the potential drop across the corresponding OLED (or OLEDs) connected in series with each control resistor, and therefore may also determine the current (and thereby the current density and brightness) supplied to each OLED. That is, for instance, as shown in the exemplary device 1000, the electrical branches 1010-1012 comprising OLEDs 1001-1003 are shown as electrically connected in parallel (and thereby having the same voltage drop across the branches 1010-1012). However, the difference in the resistance of the control resistors 1004 and 1005 affects the total resistance of each branch and thereby affects the current that drives each OLED based on the relationship Voltage (V)=Current (I)×Resistance (R). In this manner, for instance, a plurality of electrical branches (e.g. branches 1010-1012) could comprise the same number of OLEDs having substantially the same device structure and approximately the same emissive area, but still provide for a varied brightness across the device 1000. It should be understood that embodiments are not so limited, and that the electrical branches 1010-1012 may comprise OLEDs having different emissive areas, different number of OLEDs, OLEDs connected in various combinations of series and parallel electrical connections, etc.

Each control resistor (e.g. 1004 and 1005) may be made of the same material as the electrode of the OLED or a different conducting material with a different resistivity ρ (Ωm) depending on the resistance requirement and the device characteristics desired. For example, in embodiments comprising one or more thin film control resistors, the resistance characteristic could also be characterized in terms of sheet resistance ($R_s$ in Ω/sq.). Each control resistor may have different geometry, including various lengths (L), widths (W) and thickness (t) so as to have the appropriate resistance values. In this regard, FIG. 10 shows various examples of geometries for the resistors (note that the plurality of resistors electrically connected to each branch may or may not comprise the same materials). For instance, control resistor 1004 has a length-to-width ratio ($L_A/W_A$) that is less than 1, while control resistor 1005 is shown as having a length-to-width ratio ($L_B/W_B$) that is greater than 1. As shown, OLED 1003 is connected directly to the bus line 1006 without the use of a control resistor. Thus, as illustrated in FIG. 10, the current delivered to each OLED 1001-1003 (where each OLED is assumed to have the same emissive area size and each is electrically connected in parallel to the other OLEDs) may be controlled and/or varied through the use and characteristics of one or more control resistors.

Provided below is an exemplary method that may be utilized in determining some of the properties of the control resistors in accordance with some embodiments. It should be understood that the methods described below are for illustration purposes only, and other methods and techniques may be used as appropriate for determining the values and configuration of the control resistors in certain embodiments.

To model the potential drop across a control resistor that may be required for a desired brightness variation of a device, it may be necessary to know the current density-voltage-luminance (JVL) relationships for the OLED stack or stacks that are to be used in the exemplary device. In this regard and for illustration purposes only, data for a typical 2 mm² phosphorescent white OLED (WOLED) was used in this model. The JVL data for this exemplary WOLED is summarized in Table 1 below. For purposes of this model, it is assumed for simplicity that the bus line is highly conductive such that the potential drop along the bus line may be neglected. It is also assumed that the control resistor comprises an ITO channel of thickness (t)=1200 A, with a length (L) and a width (W) that may be controlled and varied. The sheet resistance of the ITO is assumed to be ($R_s$)=15 Ω/sq. It is further assumed for the purpose of this model that the potential drop across the electrodes of each WOLED on the exemplary device is negligible.

TABLE 1

JVL data for an equivalent WOLED.

| Voltage [V] | Current Density [mA/cm²] | Luminance [cd/m²] |
|---|---|---|
| 2.74 | 0.00208 | 1.01 |
| 2.879 | 0.00935 | 4.56 |
| 3.018 | 0.0341 | 16.7 |
| 3.157 | 0.0993 | 48.8 |
| 3.296 | 0.236 | 116 |
| 3.434 | 0.477 | 233 |
| 3.572 | 0.852 | 412 |
| 3.71 | 1.38 | 660 |
| 3.848 | 2.08 | 987 |
| 3.985 | 2.97 | 1400 |
| 4.122 | 4.08 | 1900 |
| 4.258 | 5.41 | 2500 |
| 4.394 | 6.98 | 3180 |
| 4.529 | 8.78 | 3950 |
| 4.664 | 10.8 | 4810 |
| 4.799 | 13.1 | 5740 |
| 4.933 | 15.6 | 6750 |
| 5.066 | 18.3 | 7830 |
| 5.199 | 21.3 | 8990 |
| 5.332 | 24.6 | 10200 |
| 5.464 | 28.2 | 11500 |
| 5.595 | 32 | 12900 |
| 5.726 | 36.1 | 14300 |
| 5.856 | 40.5 | 15800 |
| 5.986 | 45.2 | 17400 |
| 6.114 | 50.3 | 19100 |

Figure 11A:
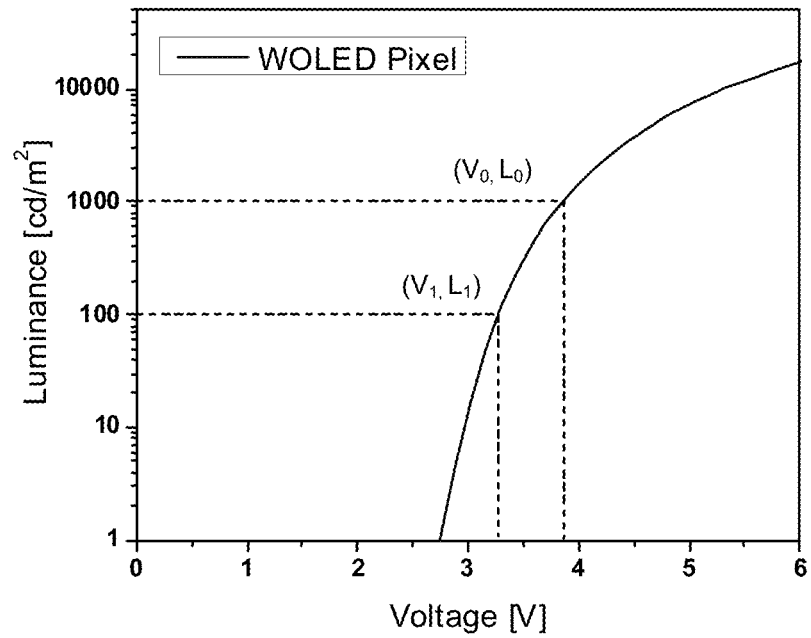
FIGS. 11(a) and (b) show graphs of luminance ($cd/m^2$) vs. voltage (V) and current density ($mA/cm^2$) vs. voltage (V), respectively, for an exemplary OLED.
Figure 11B:
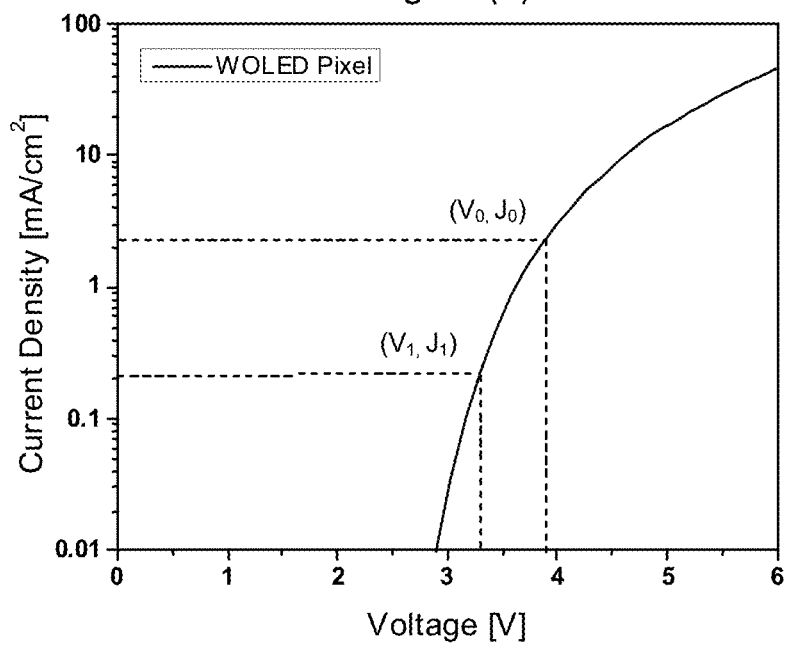

Continuing with this exemplary model, the exemplary WOLED luminance versus voltage curve generated from the data in Table 1 is shown in FIG. 11(a) and may be used to determine the potential drop ($\Delta V = V_0 - V_1$) needed for a required (or desired) brightness variation ($L_0/L_1$), where $V_0$ and $L_0$ are the initial voltage and luminance of the WOLED without a control resistor, and $V_1$ and $L_1$ are the voltage and luminance with a control resistor. This is illustrated in FIG. 11(a) by the dotted lines (corresponding to a luminance of 100 and 1000 cd/m²). Using the corresponding voltage values determined with regards to the desired brightness level, the current density at each voltage may then be calculated using the current density versus voltage relationship for the exemplary WOLED. This is illustrated in FIG. 11(b) by the dotted lines showing the initial current density and voltage ($V_0$, $J_0$) and the current density and voltage values when using the control resistor ($V_1$, $J_1$).

At this point in the exemplary process for determining the characteristics of the control resistors, it may be necessary to define the emissive area for the exemplary WOLED (or WOLEDs) in use because, for instance, a larger emissive area requires a higher current to have the same current density as an WOLED having a smaller emissive area. In some embodiments, there could be multiple WOLEDs having emissive areas of different sizes that are each connected in parallel to single bus line, which is yet another factor that may need to be considered in determining the resistance of the control resistor (or resistors) to be electrically connected with each WOLED.

Continuing with the exemplary process, after the emissive area of each WOLED is defined, the required resistance of the control resistor for each WOLED may then be calculated using the relationship given by $R = \Delta V / I_0$, where R is the resistance of the control resistor, and $I_0 = J_0 \times A$, where A is the emissive area of each WOLED, is the initial current supplied to each WOLED before a control resistor is used. Finally, the length-to-width ratio (L/W) of the control resistor (for a given sheet resistance) is calculated using the relationship defined by: $R = R_s \times (L/W)$. It should be noted that, in some embodiments, the thickness (t) of the control resistor could also be varied to provide the desired resistance by using the relationship defined by: $R = \rho \times L/(W \times t)$, where $\rho$ is the resistivity and t is the thickness of the control resistor. However, it is typically more efficient to fabricate a plurality of control resistors having the same thickness and to vary the dimensions of the length and width, as those dimensions are shown in FIG. 10. In this manner, the appropriate control resistor may be chosen and/or defined to achieve a desired brightness variation for a device comprising a plurality of the exemplary WOLEDs.

The inventors have utilized the exemplary method described above to conduct a simulation to further illustrate this exemplary method. In this regard, provided below in Tables 2 and 3 are the results of the exemplary simulation for a 1 cm×1 cm=1 cm² WOLED, and for 5 cm×5 cm=25 cm² WOLEDs, respectively. Columns 1 and 2 in these tables show the WOLED brightness $L_1$ and WOLED brightness variation=$L_0/L_1$, where $L_0$ is the reference brightness for the WOLED without the use of a control resistor (for instance, the OLED configuration 1003 in FIG. 10), which can be determined from the JVL relationships of an equivalent small area pixel, such as shown in Table 1. Each of the calculations for this exemplary simulation were performed at a reference luminance of $L_0$=2,002 cd/m² without any light extraction enhancement. This may therefore be approximately equivalent to a luminance of 3,000 cd/m² using a relatively conservative 1.5× light extraction enhancement. Column 3 in Tables 2 and 3 show the voltage required across the OLED ($V_{OLED}$) to provide for each brightness level, while column 4 shows the Voltage drop required across the control resistor ($\Delta V$) for each of the WOLED brightness levels. Column 5 shows the current density that is driving the OLEDs ($J_{OLED}$) for each brightness level. Column 6 shows the efficacy of the OLED at each of the brightness levels shown in Column 1. Column 7 shows the efficacy of the same OLED if it had been operating at the brightness given in Column 1 and was not using a control resistor electrically connected in series (that is, if the OLED was simply driven by a lower voltage source). Column 8 shows the Power Loss (in percent) that results from the use of the control resistor, which is calculated based on the values in Columns 6 and 7. That is, the value for the "Reference Efficacy" given in Column 7 of Tables 2 and 3 is reduced by the value of the "Efficacy" given in Column 6 when the control resistor is utilized, and this difference is then divided by the "Reference Efficacy" in Column 7 (i.e. Power Loss= (Reference Efficacy–Efficacy)/Reference Efficacy). Column 9 shows the length-to-width ratio (L/W) that is required for a control resistor having a sheet resistance=15 Ω/sq. to achieve the brightness value indicated in Column 1.

TABLE 2

Simulation results for an exemplary 1 cm × 1 cm WOLED pixel.

| $L_1$ [cd/m$^2$] | $L_0/L_1$ | $V_{OLED}$ [V] | $\Delta V$ [V] | $J_{OLED}$ [mA/cm$^2$] | Efficacy [lm/W] | Reference Efficacy [lm/W] | Power Loss [%] | L/W |
|---|---|---|---|---|---|---|---|---|
| 2002 | 1.000 | 4.138 | 0.000 | 4.286 | 35.46 | 35.46 | 0.0 | 0.0 |
| 1822 | 1.099 | 4.093 | 0.045 | 3.887 | 35.59 | 35.98 | 1.1 | 0.7 |
| 1514 | 1.322 | 4.009 | 0.129 | 3.207 | 35.81 | 36.96 | 3.1 | 2.0 |
| 917 | 2.183 | 3.817 | 0.321 | 1.921 | 36.21 | 39.26 | 7.8 | 5.0 |
| 368 | 5.440 | 3.559 | 0.579 | 0.773 | 36.18 | 42.06 | 14.0 | 9.0 |
| 196 | 10.214 | 3.431 | 0.707 | 0.417 | 35.59 | 42.92 | 17.1 | 11.0 |

TABLE 3

Simulation results for an exemplary 5 cm × 5 cm WOLED pixel.

| $L_1$ [cd/m$^2$] | $L_0/L_1$ | $V_{OLED}$ [V] | $\Delta V$ [V] | $J_{OLED}$ [mA/cm$^2$] | Efficacy [lm/W] | Reference Efficacy [lm/W] | Power Loss [%] | L/W |
|---|---|---|---|---|---|---|---|---|
| 2002 | 1.000 | 4.138 | 0.000 | 4.286 | 35.46 | 35.46 | 0.0 | 0.00 |
| 1810 | 1.106 | 4.090 | 0.048 | 3.860 | 35.60 | 36.02 | 1.2 | 0.03 |
| 1514 | 1.322 | 4.009 | 0.129 | 3.207 | 35.81 | 36.96 | 3.1 | 0.08 |
| 917 | 2.183 | 3.817 | 0.321 | 1.921 | 36.21 | 39.26 | 7.8 | 0.20 |
| 394 | 5.081 | 3.575 | 0.563 | 0.827 | 36.22 | 41.91 | 13.6 | 0.35 |
| 178 | 11.247 | 3.415 | 0.723 | 0.382 | 35.46 | 42.98 | 17.5 | 0.45 |

As illustrated in the simulation results shown in the above tables, brightness variations of greater than two times may be achieved with less than approximately 8% loss in power efficacy. That is, for instance, a difference in brightness from 2002 cd/m$^2$ to 917 cd/m$^2$ results in a power loss of 7.8% in this exemplary simulation. In addition, brightness variations that are greater than ten times may be achieved with less than approximately 18% loss in power efficacy. It should be noted that the power loss only applies to the OLEDs on the panel with a control resistor (for instance, there is no loss for the OLED 1003 in the exemplary device 1000 in FIG. 10). Thus, the power loss shown in this exemplary simulation is relatively low for relatively high brightness variations, which may be based in part on the steep diode curve shown in FIGS. 11(*a*) and (*b*).

Figure 12:
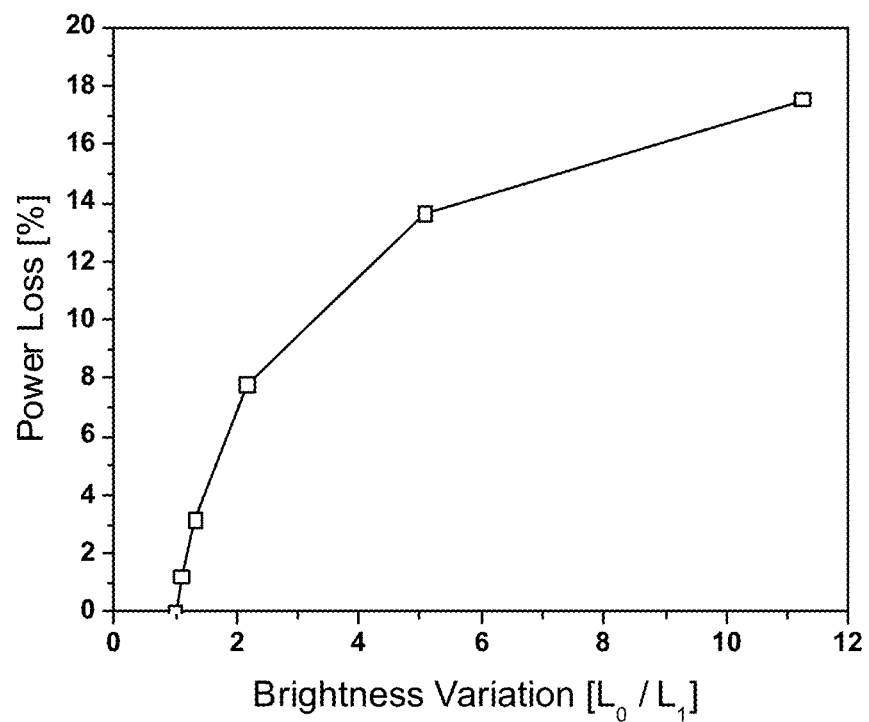
FIG. 12 shows a graph of brightness variation ($L_0/L_1$) vs. power loss (%) for an exemplary device according to some embodiments.

The results of these simulations show that the use of a control resistor or resistors to achieve variable brightness of a lighting device may be feasible without a large decrease in the efficiency of such a device. It should be noted that this exemplary design utilizing control resistors may be preferred in some embodiments to devices such as those with individually addressable OLEDs, where, for instance, the relatively low power loss is balanced or offset by some or all of the advantages associated with the low-cost and simplicity of such device design where a single driver may be used to power OLEDs at varying brightness. The Power Loss for this exemplary simulation is plotted against brightness variation in FIG. 12. It should be noted that to achieve brightness variation of up to ten times for this exemplary WOLED used for the simulations above having an emissive area in the range 1 cm$^2$ to 25 cm$^2$, the length-to-width ration (L/W) was within the range of approximately 0.03 (for the 5 cm by 5 cm WOLED) to approximately 11 (for the 1 cm by 1 cm WOLED). This range of ratios can reasonably be achieved using standard deposition and patterning techniques.

It should also be noted that the Efficacy values in Column 6 of Tables 2 and 3 appear to be practically independent of brightness variation. This may be due, in part, to the luminous efficiency (cd/A) versus luminance curve for the WOLED device being relatively flat across the range of brightness values considered in this exemplary simulation. Additionally, the overall drive voltage remains constant for each brightness value, and therefore the OLED efficacy (lm/W) remains relatively constant even at lower brightness values. Typically, in a standard OLED light panel, lower brightness would be accompanied by reduced operating voltage, and so power efficacy would increase, as shown in Column 7 (which shows the Reference Efficacy of the device having the indicated brightness with no control resistor used). This is the origin of the power loss (i.e., the power loss is the result of the I$^2$R losses across the control resistor).

In some embodiments, the control resistor could also be optimized to act as an electrical fuse, such as those described in U.S. Pat. App. No. 61/431,985 entitled "OLED Device with Short Tolerant Structure," which is hereby incorporated by reference in its entirety. In such embodiments, if a short develops in an OLED, the current (or a substantial portion thereof) from multiple other OLEDs connected in parallel with that OLED may then flow through the control resistor. This may, for example, lead to localized heating and melting of the control resistor, which then opens the electrical contact such that the OLED with the electrical short is not illuminated (i.e. no current is provided to the OLED). However, the remaining OLEDs that are connected in parallel with the shorted OLED may remain illuminated (i.e., after the electrical connection is opened, current may again drive the other OLEDs). In some embodiments, the control resistor may be covered or coated with an insulating layer that could also define the OLED emissive area. This could in turn provide some protection from heating to the OLED panel. In some embodiments, the control resistor could be connected in series with an electrical fuse.

The inventors have also recognized that in some embodiments, in addition to the use of one or more control resistors electrically connected to one or more OLEDs to vary the voltage drop (and thereby the brightness) of a plurality of OLEDs, the size of the emissive area of the OLEDs may also be varied. This is because the potential drop (given by $\Delta V=IR$) and not just the resistance R of the control resistor in combination with an OLED determines the brightness variation across each OLED. Indeed, in this regard, one or more control resistors may be used in conjunction with any suitable combination of OLEDs connected in series or parallel (such as the exemplary embodiments described herein) to obtain a desired tonal variation across the device.

Third Exemplary Embodiment

In a third exemplary embodiment, devices may utilize a plurality of series strings of OLEDs connected in parallel, where the series strings are not identical such that the current that is supplied to each string may be different. For instance, in some embodiments, there could be a different number of OLEDs on each series string and/or the emissive area of one or more of the OLEDs could be different from one series string to the other. In some embodiments, the OLEDs within a single series string could be identical or different.

Figure 13:
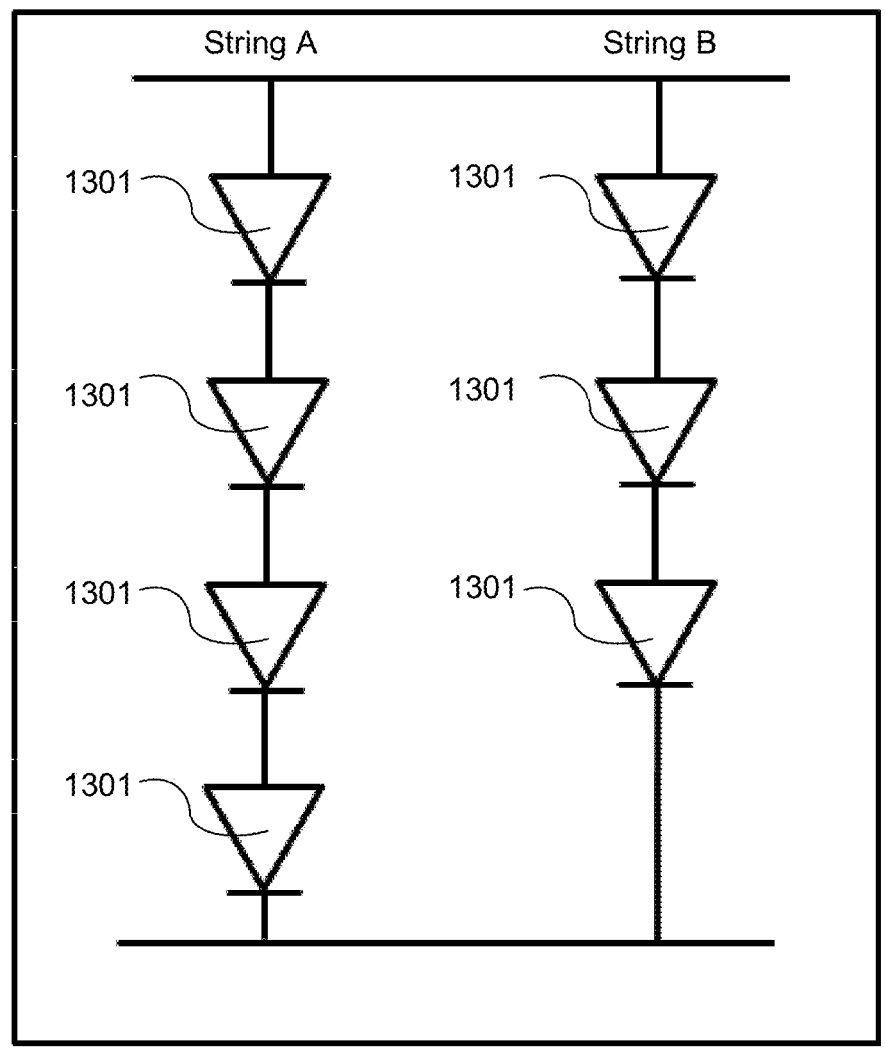
FIG. 13 shows an exemplary device according to some embodiments wherein two or more series strings are connected in parallel.

With reference to FIG. 13, an exemplary device in accordance with some aspects of the third embodiment as described above is shown. As illustrated in FIG. 13, the exemplary device 1300 comprises two series strings (labeled as "String A" and "String B") that are connected in parallel on a single panel. The OLEDs 1301 in this example are shown as having the same emissive area (and it is assumed that they each comprise substantially the same device stack), but as illustrated, there are four OLEDs connected in series in String A, and only three OLEDs connected in series in String B. As noted above, String A and String B are connected in parallel, and therefore the voltage across the series strings should be the same. In this simplified example that is for illustration purposes only, if for instance a potential of 12 V was applied to the panel, then neglecting any potential drops in the series connections or across the resistive electrodes, it is expected that there is a 3 V drop across each OLED in String A, and a 4 V drop across each OLED in String B. This voltage difference can be used in combination with the JVL relationship for the device, such as that shown in FIG. 11, to determine the expected brightness variation from the OLEDs in String A to the OLEDs String B. For instance, in this example and using the WOLED in the simulations above, it is expected that the WOLEDs in String A would operate at approximately 15 cd/m$^2$, while the WOLEDs in String B would operate at 1474 cd/m$^2$. It should be noted that in this exemplary embodiment, the brightness variation may be achieved without any loss of efficiency (which may be in contrast to the second exemplary embodiment that may utilize one or more control resistors).

Figure 20:
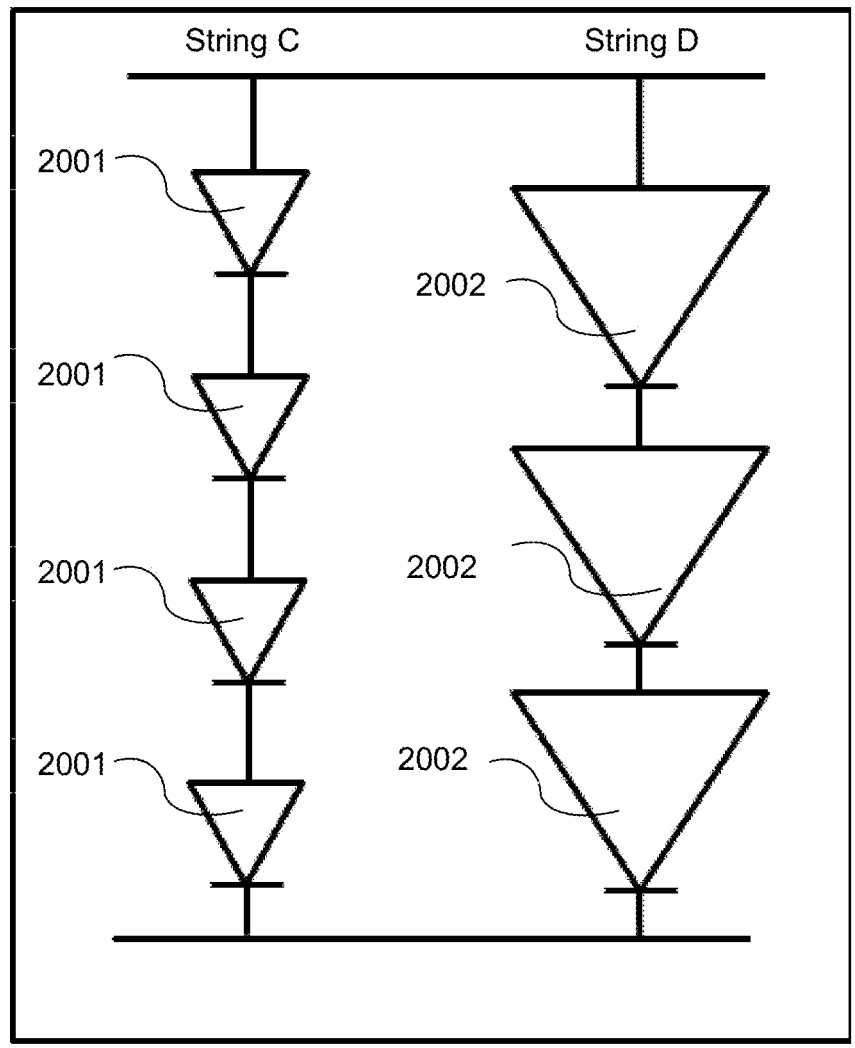
FIG. 20 shows an exemplary configuration of OLEDs electrically connected in series and in parallel in accordance with some embodiments.

With reference to FIG. 20, an exemplary device in accordance with some aspects of the third embodiment as described above is shown. As illustrated in FIG. 20, the exemplary device 2000 comprises two series strings (labeled as "String C" and "String D") that are connected in parallel on a single panel. The OLEDs 2001 in this example are shown as having the same emissive area (and it is assumed that they each comprise substantially the same device stack). The OLEDs 2002 are also shown as having the same emissive area; however, the emissive area of the OLEDs 2002 is larger than the emissive areas of the OLEDs 2001. There are four OLEDs 2001 connected in series in String C, and only three OLEDs 2002 connected in series in String D. As noted above, String C and String D are connected in parallel, and therefore the voltage across the series strings should be the same. In this simplified example that is for illustration purposes only, if for instance a potential of 12 V was applied to the panel, then neglecting any potential drops in the series connections or across the resistive electrodes, it is expected that there is a 3 V drop across each OLED in String C, and a 4 V drop across each OLED in String D. This voltage difference can be used in combination with the JVL relationship for the device, such as that shown in FIG. 11, to determine the expected brightness variation from the OLEDs in String C to the OLEDs String D. For instance, in this example and using the WOLED in the simulations above, it is expected that the WOLEDs in String C would operate at approximately 15 cd/m$^2$, while the WOLEDs in String D would operate at 1474 cd/m$^2$. It should be noted that, despite the fact the String D in FIG. 20 comprises three OLEDs 2002, whereas String B in FIG. 13 comprises three OLEDs 1301 having a different emissive area, each of these OLEDs will still have the same brightness level because for the same applied voltage, the same voltage drop will occur across each of the OLED devices in this exemplary embodiment. However, because the OLEDs 2002 have a larger emissive area, the current that will flow through OLEDs 2002 in Sting D in FIG. 20 will be larger than the current the flows through the OLEDs 1301 in String B in FIG. 13.

Figure 14:
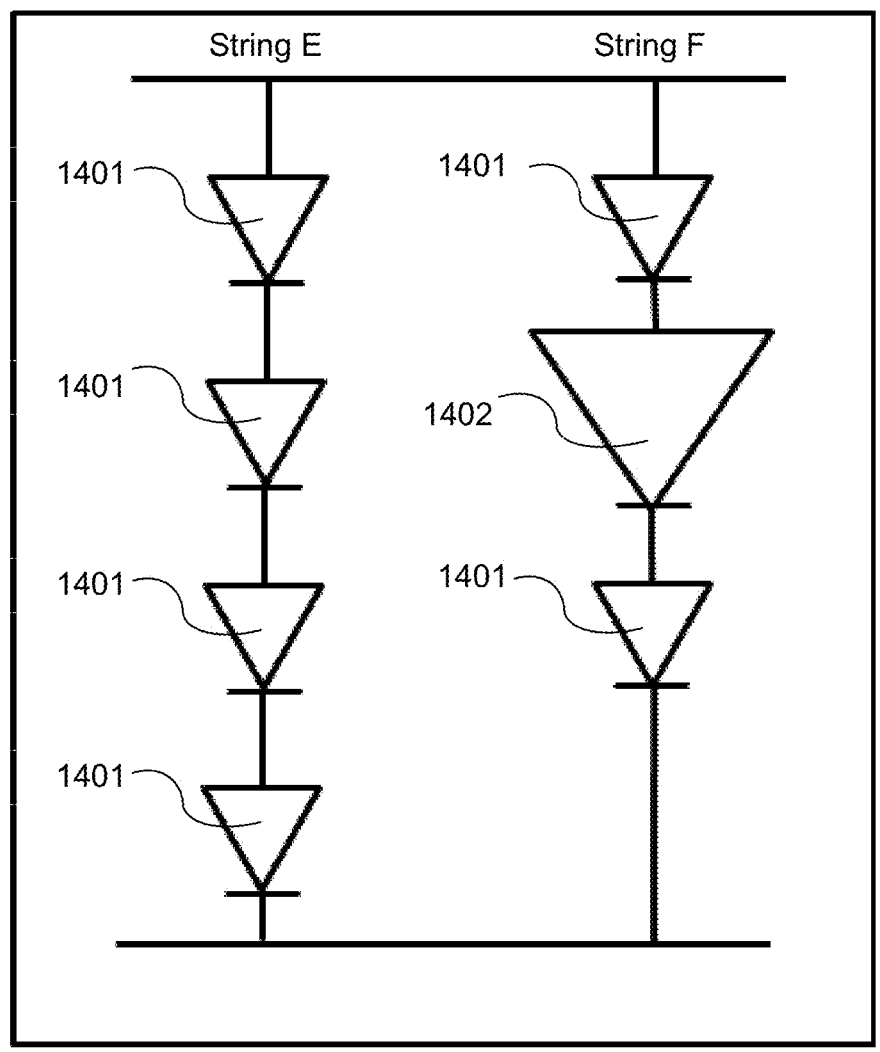
FIG. 14 shows an exemplary device according to some embodiments wherein two or more series strings are connected in parallel.

With reference to FIG. 14, another embodiment in accordance with some aspects of the third exemplary embodiment described above is illustrated. In this example, there are two series strings (labeled "String E" and "String F") that are connected in parallel on a single panel. However, unlike the exemplary device in FIG. 13, in this example the OLEDs within a string do not have the same emissive area. In this regard, String E comprises four OLEDs 1401 connected in series each having the same emissive area (in an identical manner to String A in FIG. 13). In contrast, String F is shown as comprising only three OLEDs connected in series, where two of the OLEDs (e.g. OLEDs 1401) are shown as having the same emissive area as the OLEDs in String E, and one OLED (e.g. OLED 1402) is shown as having a substantially greater emissive area than the other pixels (this is represented by a larger diode in FIG. 14). In this example, there will be brightness variation along String F between the OLEDs 1401 and the OLED 1402 having a different emissive area (similar to brightness difference as discussed above in the first exemplary embodiment and described with reference to FIGS. 3-8). In addition, there may also be brightness variation between the OLEDs 1401 in String E and the OLEDs 1401 in String F, even though some of the OLEDs may comprise the same emissive area. This may be due, in part, to the different currents that may be provided to each string (based on the difference in total resistance of the series strings) as well as the difference in voltage drop across each of the individual OLED devices.

Fourth Exemplary Embodiment

In a fourth exemplary embodiment, devices may be provided that may reduce or offset problems associated with differential aging. That is, for instance, embodiments may provide a device (such as a lighting panel) comprising multiple OLEDs driven at different current densities, where the current density is alternated so as to minimize the effects of differential aging. That is, for instance, devices comprising aspects of the fourth exemplary embodiment may eliminate some of the disadvantages of differential aging by running multiple OLEDs at different current densities, and alternating or changing the current densities between the OLEDs.

Figure 15:
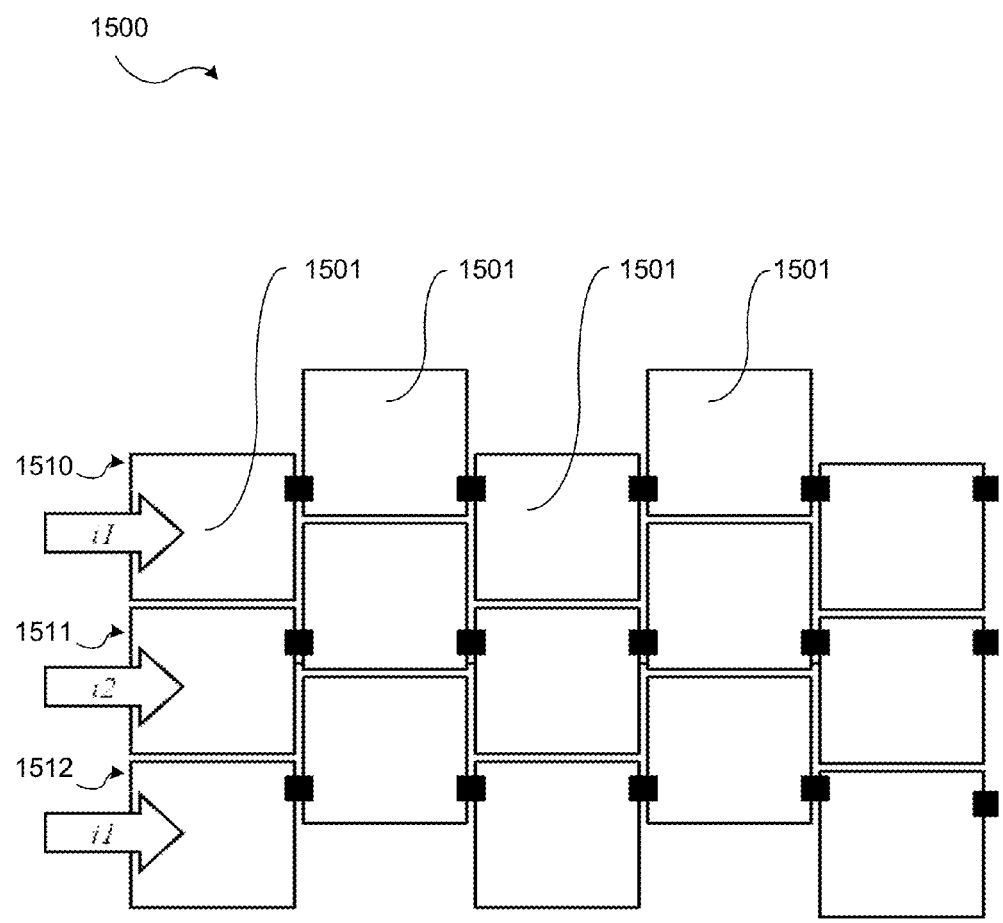
FIG. 15 shows an exemplary device according to some embodiments wherein the current density supplied to two or more series strings of OLEDs may be varied.

With reference to FIG. 15, an example device configuration 1500 is shown as comprising aspects of the fourth exemplary embodiment. As shown, currents $i_1$ and $i_2$ are driven through alternating series strings 1510-1512 of OLEDs 1501 having square emissive areas. The exemplary embodiment shown in FIG. 15 comprises alternating strings of OLEDs being interdigitated. In some embodiments, the relative magnitudes of the currents $i_1$ and $i_2$ can be controlled using drive electronics so that the brighter and dimmer strings (i.e. the series strings that are driven at higher and lower currents) can be alternated, and thereby the strings 1510-1512 will not always be driven by the same current. For example, the first time such a device 1500 is activated (i.e. switched on), the current $i_1$ may be equal to twice the value of the current $i_2$, (e.g. $i_1$ may equal 10 A and $i_2$ may equal 5 A), whereas the second time the device 1500 is activated (i.e. switched on), the current $i_2$ may be equal to twice the value of $i_1$ (e.g. $i_1$ may equal 5 A and $i_2$ may equal 10 A). In this manner, differential degradation may be thereby avoided or reduced because over time the average current density through all of the OLEDs may be configured to be approximately the same. Indeed, in some embodiments, it may be possible to alternate the currents during operation of the device 1500. If done in this manner, it may be preferred to switch the currents on a relatively slow timescale to avoid a flashing "disco" effect. For example, the switching could occur once every hour for embodiments wherein the device comprises room lighting. However, embodiments are not so limited. For instance, in novelty applications, it may be preferred to change the currents supplied to each string, for instance, once every second.

Figure 16:
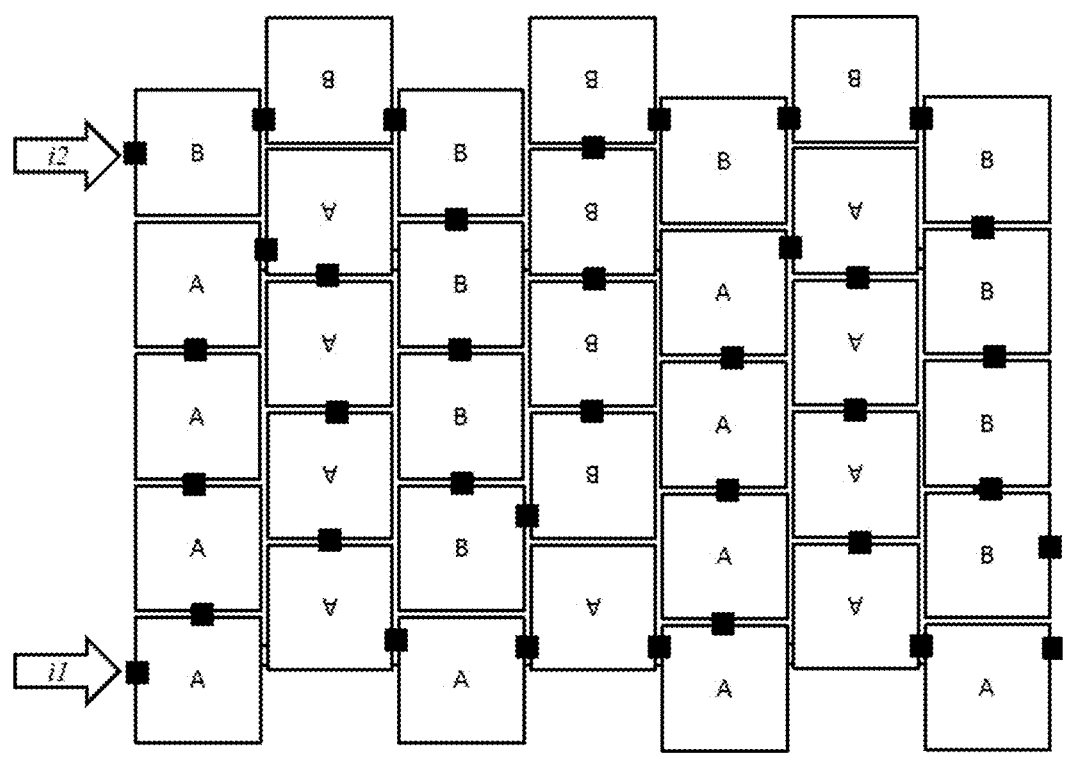
FIG. 16 shows an exemplary device according to some embodiments wherein the current density supplied to two or more series strings of OLEDs may be varied.

In some embodiments, lines of OLEDs (i.e. series strings) having alternating brightness may be less desirable than a more broken or random pattern. An example of such a panel design is shown in FIG. 16 for illustration purposes only. That is, FIG. 16 shows how an interdigitation can be accomplished using multiple OLEDs in series, where the OLEDs in a first series string are labeled with the letter "A" and OLEDs in a second series string are labeled with the letter "B." It should be understood that any combination or configuration may be used depending on the application and the desired effect of the device. By using such designs, the lighting device may appear to an observer as more natural and/or there may not be a noticeable pattern of brightness across the device.

Devices that are consistent with aspects of the fourth exemplary embodiments as described above may comprise a drive scheme for an OLED light panel. In some embodiments, a separate driver may be used for each additional brightness level and/or current level supplied to a string of OLEDs. In some embodiments, each of the OLEDs in the series string may have substantially the same device structure and emissive area size; however, embodiments are not so limited. That is, for instance, one or more series strings may comprise OLEDs having a different size emissive area. In some embodiments, a device could comprise multiple sets of OLEDs, where the OLEDs in each set are connected in parallel, and each set has a separate current driver. In such embodiments, for instance, there could be only a single OLED in each set.

In general, the first and third exemplary embodiments as described above may be preferred in some embodiments as there may, in some instances, be no loss of efficacy associated with these approaches. However, these embodiments may have some issues related to differential aging of the OLEDs related to the difference in current densities for parts of these devices. In addition, some embodiments comprising aspects of the second exemplary embodiment described above may suffer from differential aging, and may have increased costs related to the added components and complexity of the device design and slight loss of power efficiency associated with the use of control resistors. In some embodiments, aspects of the second embodiment may offer the advantage that the use of a control resistor could be used as a fuse to prevent catastrophic shorting of the device. In some instances, embodiments featuring aspects of the fourth exemplary embodiment may not suffer from differential aging, but may add costs associated with the drive electronics.

As noted above, OLEDs that are driven at higher current densities will often degrade faster, and therefore the brightness variation across the panel may ultimately decrease with time. However, it may be assumed that gradual improvements in OLED lifetime may render this effect insignificant, or at least minimize this effect over a reasonable lifetime of lighting devices. In addition, issues related to differential degradation may affect the selection of the size differences in emissive areas of OLEDs (and therefore current density difference) used in various embodiments of lighting devices. In some embodiments, it may be reasonable that a brightness factor of 2 times would provide a striking tonal variation to an observer, however, in some embodiments, a difference of as little as 10-20% may be visible across the panel surface. In some embodiments, an upper limit of 10 times brightness variation may be reasonable, because above this level, it may be difficult to conceive of sufficiently stable OLEDs to prevent rapid degradation of the brighter pixels.

Additional Exemplary Embodiments

Described below are additional exemplary embodiments of devices comprising a plurality of OLEDs that provide controlled brightness variation across the device. The embodiments described below are for illustration purposes only and are not thereby intended to be limiting. Some embodiments may have aspects that are similar to the embodiments discussed above. After reading this disclosure, it may be apparent to a person of ordinary skill that various components as described below may be combined or omitted in certain embodiments, while still practicing the principles described.

Embodiments may provide a light source with a controlled brightness variation. A first device is provided that includes a substrate and a plurality of OLEDs disposed on the substrate. The substrate may comprise any suitable material, such as glass, plastic, and/or metal foil, and may be rigid or flexible. Each of the OLEDs includes a first electrode, a second electrode, and an organic electroluminescent (EL) material disposed between the first and the second electrodes. As described below, some of these components may be common to (i.e. shared by) a plurality of devices.

In the first device, the plurality of OLEDs comprises a first group and a second group. That is, "the plurality of OLEDs" may refer to the OLEDs that comprise the first and the second group. Each of the OLEDs in the first group of the plurality of OLEDs is patterned and electrically connected such that each OLED in the first group is driven at a first current density, whereas each of the OLEDs in the second group of the plurality of OLEDs is patterned and electrically connected such that each OLED in the second group is driven at a second current density that is different from the first current density. That is, within the plurality of OLEDs, there are one or more OLEDs (i.e. the first group) that are driven by a first current density, and there are one or more OLEDs (i.e. the second group) that are driven by a different current density. It should be understood that the current density is determined based on each individual OLED device. Thus, the same current could be supplied to a plurality of OLEDs in series, but if the OLEDs have different emissive areas, the current density for each will not be the same. In addition, a different current supplied to OLEDs having the same emissive area may result in different current densities.

By using the term "patterned and electrically connected" it is meant that the OLEDs of the device are configured such that at least two of the OLEDs are driven by different current densities. For instance, in some embodiments, the shape and/or size of the emissive area of one or more OLEDs may be varied so that the current density of the OLEDs is different across the device (even if the same current flows through each OLED). In some embodiments, the OLEDs may be electrically configured in such a way that a different current density is supplied to at least two different OLEDs (or so that there is a different voltage drop across each OLED). "Electrically configured," may refer to any manner of creating a different voltage drop across one or more OLEDs based on the configurations of the OLEDs in relation to other electrical components (rather than the characteristics, such as size and shape, of the OLED). For instance, in some embodiments OLEDs may be electrically connected in any combination of series connections or parallel connections so as to provide for different current densities across two or more OLEDs. In some embodiments, one or more OLEDs may be electrically connected to different circuit components (such as control resistors) so as to vary the voltage drop across each OLED. In some embodiments, a device may comprise some combination of the characteristics of the OLEDs (e.g. variable size and/or shape) with different electrical connections so as to create a desired brightness variation across a device. That is, in some embodiments, the difference in current density may be created by both a variation in the patterning of a plurality of OLEDs as well as variations created based on the electrical connections. However, embodiments are not so limited, and variations may be based on the difference created by either variable patterning between OLEDs or the electrical connections therein.

Furthermore, in the first device, each of the plurality of OLEDs is commonly addressable, where "commonly addressable" may be as defined above. That is, for instance, at least the OLEDs that comprise the first group and the second group of the plurality of OLEDs are not individually addressable (i.e. at least two OLEDs on the device—one OLED that is driven by the first current density and one OLED that is driven by the second current density—are commonly addressable). Thus, if the first group of OLEDs is driven by a current, the second group is also driven by a current (which may or may not be the same current, depending on the particular patterning and electrical connections that are used). It should be noted that a device may have additional OLEDs that are not included in the first group or the second group, and these OLEDs may be individually or commonly addressable. However, it may be preferred that all or substantially all of the OLEDs are commonly addressable in embodiments where the first device is, for instance, a lighting source because it is typically less expensive and less complex than manufacturing the components necessary to individually address each OLED.

In addition, in the first device, at least one of the OLEDs in the first group of the plurality of OLEDs emits light having a first point on the CIE 1976 (L*, u*, v*) color space chromaticity diagram, and at least one of the OLEDs in the second group of the plurality of OLEDS emits light having a second point on the CIE 1976 (L*, u*, v*) color space chromaticity diagram. The difference between the first point and the second point has a duv value that is less than approximately 0.10. That is, for instance, the light emissions of at least one OLED in the first group (driven at a first current density) and one of the OLEDs in the second group (driven at a second current density) may each emit light having a chromaticity that is similar, but need not be identical (i.e. the light emissions may have a difference corresponding to a duv value of up to approximately 0.10). In this way, embodiments may provide tonal variation based on a difference in current density between two devices having similar chromaticity. It may be preferred in some embodiments that the difference in chromaticity of the light emissions from the OLEDs in the first group and the second group is relatively small such that an observer viewing the light emitted from the first device may not perceive the difference in chromaticity or that the difference in chromaticity does not detract from the purpose or the aesthetic appearance of the light emissions of the device. In this regard, it may be preferred in some embodiments that the difference between the first point (corresponding to the light emissions of an OLED in the first group) and the second point (corresponding to the light emissions of an OLED in the second group) are such that the difference between them corresponds to a duv value that is less than approximately 0.05.

Provided below is a listing of exemplary common colors and their corresponding coordinates in both CIE 1931 XYZ color space chromaticity diagram and CIE 1976 (L*, u*, v*) color space chromaticity diagram. This is provided for illustration purposes only, and it should be understood that the principles discussed may be applicable to colors not shown below. This table shows a comparison between exemplary colors that are similar, but not identical, which may be used in some combinations in a lighting device having tonal variation. For instance, in some embodiments, one or more OLEDs in the first group may emit light having the color "warm white" (i.e. having CIE 1976 (u', v') coordinates (0.249, 0.521) and correlated color temperature (CCT)=3000 K), while one or more OLEDs in the second group may emit light having the color "cool white" (i.e. having CIE 1976 (u', v') coordinates (0.198, 0.465) and correlated color temperature (CCT)=6500 K). While the light emitted by the OLEDs in the first and the second group may thereby have different chromaticities, the difference may be such that, for instance, an observer would not perceive the difference, the difference would add further variation across the panel that may appear similar to the brightness variation (or complement it), and/or the difference could provide some other purpose. The difference in chromaticity may also be the result of, for example, errors in the manufacturing process, including deposition processes, and/or degradation of the device over time.

| Color Description | CIE 1931 (x, y) | CIE 1976 (u', v') |
| --- | --- | --- |
| Warm White | (0.434, 0.403) | (0.249, 0.521) |
| Cool White | (0.312, 0.328) | (0.198, 0.465) |
| Red (sRGB) | (0.64, 0.33) | (0.451, 0.523) |
| Red (NTSC 1971) | (0.67, 0.33) | (0.477, 0.528) |
| Green (sRGB) | (0.30, 0.60) | (0.125, 0.563) |
| Green (NTSC 1971) | (0.21, 0.71) | (0.076, 0.576) |
| Blue (sRGB) | (0.15, 0.06) | (0.175, 0.158) |
| Blue (NTSC 1971) | (0.14, 0.08) | (0.152, 0.196) |

While it may be preferred in some embodiments for one or more OLEDs to have a discrepancy in chromaticity, in some embodiments, too much of a discrepancy (for example, having an OLED in the first group emit "red" light, while having an OLED in the second group emit "blue" light) may be distracting, and may not result in a desired tonal variation across the device perceivable by an observer. Thus, in some embodiments it may be preferred to utilize OLEDs having similar colors (e.g. different values of red, green, blue, white, or some combination thereof) and drive the devices at different current densities so as to create tonal variation across the device. In some embodiments, it may be preferred that the difference in chromaticity in the OLEDs in the first group and the OLEDs in the second group (or in some embodiments, all of the OLEDs of the device) is minimized.

The difference in chromaticity for embodiments comprising tonal variation may be illustrated utilizing the exemplary table of colors shown above. As shown in this example, light emissions having a chromaticity of "warm white" (e.g. CCT=3000 K) and light emissions having a chromaticity of "cool white" (e.g. CCT=6500 K) have a difference in chromaticity that corresponds to a duv value of 0.076. Thus, in some embodiments, OLEDs having such light emissions with similar, but not identical chromaticity, may be utilized so as to provide tonal variation across a device (e.g. as the first and second group of OLEDs). However, the discrepancy between light emissions of different colors may be too great so as to not be preferred in some embodiments. For instance, the color shown above as having a chromaticity closest to either of the "whites" is sRGB Green, which differs from "cool white" by a duv value of approximately 0.126, and from "warm white" by duv value of approximately 0.131. This discrepancy may be noticeable to an observer and may not provide a device having a tonal variation or aesthetic values desired for some embodiments of lighting applications.

The difference in the chromaticity of the OLEDs in the first and the second group may be reduced by, for instance, depositing a common organic layer, which may also reduce the number of depositions processes required to fabricate a device having tonal variation. However, embodiments are not so limited. Indeed, in some embodiments, additional deposition steps may be utilized to create some discrepancy in the coordinates of the light emissions on the CIE 1976 (L*, u*, v*) color space chromaticity diagram of one or more OLEDs in the first and second groups so as to provide further variety to the overall light emissions of the device (or a portion thereof).

In some embodiments, in the first device as described above, at least one of the OLEDs in the first group of OLEDs has substantially the same device structure as at least one of the OLEDs in the second group of OLEDs. That is, only a single OLED in the first group (i.e. an OLED operating at a first current density) need comprise the same device structure as a single device in the second group (i.e. an OLED operated at a second current density). It should be understood that there may be more OLEDs that have substantially the same device structure. "Substantially the same device structure" is a term that may be defined as above. Thus, by comprising devices that have substantially the same device structure and that thereby emit light that has approximately the same chromaticity (e.g. the light emitted by each device is within a duv value of 0.05), driving the OLEDs (or group of OLEDs) at different current densities may provide for tonal variation across the device without substantial chromaticity variation. In contrast, if the device structures of the OLEDs in the first and second group are not substantially the same, then the device may have chromaticity variation, which may not be desirable in some embodiments. Embodiments of the first device may thereby differ from devices where there are a plurality of OLEDs that have different device structures that may have different emissive areas (such as an RGB device that has one pixel (e.g. a blue pixel) having a larger emissive area than the other pixels (e.g. red and green) so that the blue pixel operate at a lower brightness).

For illustration purposes only, there are several examples of exemplary devices comprising a first group and a second group of OLEDs being driven by a different current density in the figures discussed above. For instance and illustration purposes only, in FIG. 3 in the series string 310, each of the OLEDs 301 and 302 are driven at the same current $i_1$. However, OLEDs 301 have a larger emissive area than the OLEDs 302, and therefore will operate at a different current density. The "first group" of OLEDs may thereby comprise the OLEDs 301 in string 310, and the "second group" of OLEDs may comprise the OLEDs 302 in string 310. In addition, as shown in FIG. 3, each of the strings 311-313 is also driven by the same current $i_1$, and each comprises the same OLEDs 301 and 302 (having the same emissive area as the corresponding OLEDs in string 310), so each of these OLEDs may be driven by the same current as the corresponding OLEDs in string 310. Thus, as illustrated, the OLEDs 301 in each of the strings 310-313 may comprise the first group, and the OLEDs 302 in each of the strings 310-313 may comprise the second group. Similar examples are shown in FIGS. 4-8, and were described in detail above.

However, this need not be the case, as in some embodiments only the OLEDs in a single series string may comprise the first group and the second group. For instance, FIG. 8 shows only a single series string having a plurality of OLEDs 801-804, each having a different emissive area and each driven by the same current. Therefore, as shown in FIG. 8, any one of the OLEDs 801-804 may comprise the first group (driven at a first current density based on the current supplied and the size of the emissive area of the first OLEDs) and any of the other OLEDs 801-804 may comprise the second group, commonly addressed, but driven at a second current density (based on the current supplied and the size of the emissive area of the second OLEDs). Additional examples of a first group of OLEDs that is driven by a different current density than a second group of OLEDs are shown at least in the following exemplary device configurations: FIG. 13 (where the OLEDs 1301 in String A are driven at a different current density than the OLEDs 1301 in String B); FIG. 20 (where the OLEDs 2001 in String C are driven at a different current density than the OLEDs 2002 in String D); FIG. 14, where (1) the OLEDs 1401 in String E are driven at a different current density than the OLEDs 1401 in String F; and (2) the OLEDs 1401 in String F have a different emissive area than the OLED 1402 in String F, and therefore despite being driven by the same current, operate at a different current density); FIG. 15 (OLEDs 1501 in series string 1510 driven by current $i_1$, which is different than the current $i_2$ that drives the OLEDs 1501 in series string 1511); FIG. 16 (where the OLEDs "A" are driven by a different current than OLEDs "B"); FIG. 17 (where OLED 1703 has a larger emissive area than OLEDs 1701, 1702, and 1704 and will thereby have a lower current density for the same current supplied to the OLEDs); FIG. 18 (where OLEDs 1802 in both series string 1810 and 1811 are shown as having a larger emissive area than OLEDs 1801 and will thereby have a lower current density for the same current supplied to the OLEDs). These examples are for illustration purposes only, and are not limiting as there are additional instances illustrated of OLEDs that are driven by different current densities in the Figures described herein.

As noted above, any manner of providing a different current density to one OLED (or OLEDs) than that supplied to a second, commonly addressable OLED (or OLEDs) may be used to create brightness variation in the device. In this regard, yet another illustrative example is provided by FIG. 10, where a different current is supplied to each of the OLEDs 1001-1003, which are each shown as having the same size emissive area and are electrically connected in parallel. A plurality of control resistors 1004 and 1005 (shown as having different resistances) are also connected in series with some of the OLEDs (i.e. OLEDs 1001 and 1002). Thus, any of the OLEDs 1001-1003 may comprise the first group of the plurality of OLEDs, and any of the other OLEDs 1001-1003 may comprise the second group of the plurality OLEDs because each may be driven by a different current density.

In some embodiments, in the first device as described above, each of the first group and the second group of the plurality of OLEDs comprises a plurality of OLEDs. In some embodiments, in the first device as described above, at least one of the first group or the second group of the plurality of OLEDs comprises only a single OLED. That is, for instance, there may be any number of OLEDs that are operated at different current densities, which may be designed based on the particular application that the first device is to be used for and/or the particular characteristics desired. Moreover, in some embodiments, a single OLED may have a large emissive area such that the tonal variation provided by the OLED may be visible to an observer. Such devices may thereby require fewer OLEDs to achieve tonal variation in portions of the device. Furthermore, in some embodiments, it may be desirable to have many different OLEDs having substantially the same device structure all (or substantially all) operating at different current densities to provide a continual tonal variation across the device.

In some embodiments, in the first device as described above, each of the plurality of OLEDs has substantially the same device structure. That is, for instance, embodiments may provide that each OLED emits light having a particular chromaticity (such as white light with Duv that is less than 0.010), but having a different emissive area or having a different current density supplied to it so as to create a tonal variation for the device. In this manner, a lighting device that emits light having a single chromaticity may be provided that has tonal variation due to the different brightness of groups of OLEDs therein. This may be preferred in some instances where it is not desired that light having a different chromaticity is emitted, which could be distracting to an observer. This may be particularly the case for embodiments such as lighting panels, where a single chromaticity (e.g. white light with Duv less than 0.010) may be desired.

In some embodiments, in the first device as described above, the organic EL material of each of the plurality of OLEDs is common to substantially all of the plurality of OLEDs. Organic EL material may be "common" to a plurality of OLEDs if it is substantially disposed between the first and second electrodes of each of the plurality of OLEDs. That is, for instance, the EL material layer may be deposited using only a single deposition step, which may reduce the cost and complexity associated with depositing this layer. This may also provide for the chromaticity of the light emissions and the device structures to be more uniform (i.e. the same) in some embodiments.

In some embodiments, in the first device as described above, each of the plurality of OLEDs emits approximately white light. As used herein, "approximately white light" may refer to light that has a Duv value of less than 0.01, where "Duv" is as defined above. This may be desirable, for instance, in embodiments where the first device is a lighting panel or other light source where substantially white light is desired.

In some embodiments, in the first device as described above, each of the OLEDs of the plurality of OLEDs has an emissive area that is approximately within the range of 0.1 $cm^2$ to 100 $cm^2$. In general, it may be desirable that the OLEDs have an emissive area such that the tonal variation of each device may be visible to an observer. However, based on the application that the device is being used for (and in particular, the distance that an observer may be from the device), this preferred emission area size may vary. Also, rather than the tonal variation of each device being observable, some embodiments may provide that the combined tonal variation of a group of OLEDs may be observable, whereas a single OLED tonal variation may not be observable (which may thereby provide a device that is more robust to failure of some of the OLEDs therein). In some embodiments, each of the OLEDs has an emissive area that is greater than approximately 0.5 $cm^2$. This may be preferred for embodiments comprising interior lighting, task lamps, etc. where an observer may be relatively close to the light source. In some embodiments, each of the OLEDs has an emissive area that is greater than approximately 2 $cm^2$. A device having OLEDs with an emissive area of greater than 2 $cm^2$ will likely be visible to most observers in many common applications, such as interior lighting.

In some embodiments, in the first device as described above, the first current density is at least approximately 10% greater than the second current density. In some embodiments, the first current density is at least approximately 20% greater than the second current density. That is, for instance, the difference in current density is designed so as to be greater than the typical differences that may result from the sheet resistance of components (including the anode of the OLEDs) and other imperfections in typical lighting devices that may cause non-uniformity in traditional designs. In some embodiments, the first current density is at least approximately 50% greater than the second current density. In some embodiments, the first current density is at least approximately 100% greater than the second current density. In some embodiments, the first current density is at least between approximately 20% and 100% greater than the second current density. In general, the difference in current density may be chosen based on the intended use of the device and the characteristics and tonal variation that is desired. The greater the current density difference, generally the greater the tonal variation across the device. However, as noted above, the greater the difference in the current density supplied to the devices may result in issues related to differential aging, which may also be considered in selecting the current density difference for the OLEDs.

In some embodiments, in the first devices as described above, the luminance of each of the OLEDs in the first group of the plurality of OLEDs is greater than the luminance of each of the OLEDs in the second group of the plurality of OLEDs. The luminance is a measure of the brightness of the device. Luminance is a photometric (i.e. as perceived by the human eye) measure of luminous intensity per unit area of light traveling in a given direction. As used herein, the luminance is measured at normal incidence. The luminance may vary based on the difference in current density provided to each OLED. In some embodiments, the luminance of each of the OLEDs in the first group of the plurality of OLEDs is at least 20% greater than the luminance of each of the OLEDs in the second group of the plurality of OLEDs. Generally, a variation of at least 20% luminance in the emissions of an OLED should be noticeable to an observer such that the device should have a perceived tonal variation. In some embodiments, the luminance of each of the OLEDs in the first group of the plurality of OLEDs is at least 50% greater than the luminance of each of the OLEDs in the second group of the plurality of OLEDs. Again, the difference in luminance may be chosen based on the application and the desired use of the device such that a desired tonal variation may be created.

In some embodiments, in the first device as described above, the first group and the second group of the plurality of OLEDs are electrically connected in series. As noted above, even OLEDs that are connected in series may be driven at a different current density based on, for instance, the relative sizes of the emissive areas. Moreover, each "group" may comprise one or more OLEDs, and thereby this embodiment may refer to two OLEDs connected in series that each are driven at different current densities. In this regard, in some embodiments the emissive area of each OLED in the first group of the plurality of OLEDs may be different than the emissive area of each OLED in the second group of the plurality of OLEDs. An example of this is shown in FIG. 17, where each of the OLEDs 1701-1704 are connected in series (and thus are driven by the same current), but OLEDs 1701, 1702, and 1704 (e.g. the first group in some embodiments) each have a different emissive area than OLED 1703 (e.g. the second group in some embodiments) and thereby operate at a different current density. In some embodiments, the emissive area of each OLED in the first group is at least 20% larger than the emissive area of each OLED in the second group. This discrepancy in the emissive areas may be sufficient to create an observable tonal variation in at least a portion of the device. In some embodiments, the emissive area of each OLED in the first group is at least 50% larger than the emissive area of each OLED in the second group. In general, the difference in the emissive area may be chosen such that for a desired application, a tonal variation across the device may be noticeable by an observer.

In some embodiments, in the first device as described above where the first group and the second group of the plurality of OLEDs are electrically connected in series, the emissive area of each OLED in the first group of the plurality of OLEDs comprises a first shape and the emissive area of each OLED in the second group of the plurality of OLEDs comprises a second shape that is different than the first shape. The difference in shapes may result in different sized emissive areas, which may provide for each device operating at a different current density, even when driven by the same current. That is, the OLED having a larger emissive area will have the same total current as an OLED having a smaller emissive area, but the OLED having a larger emissive area will have a smaller current density and therefore a lower brightness than the OLED having the smaller emissive area. In addition, in some embodiments, the difference in shapes may be used to create patterns of tonal variation across the device. Any shape may be used, including the shapes shown in the exemplary embodiments in FIGS. 3-8 and described above. Moreover, the shapes may be chosen so as to cover a desired amount of the emissive portions of the first device (e.g. so that the shapes tessellate as described above).

In some embodiments, in the first device as described above where the first group and the second group of the plurality of OLEDs are electrically connected in a first series string; the first device comprises one or more additional series strings that are electrically connected in parallel with the first series string. That is, while in some embodiments the device may comprise a single series string such as that shown in FIG. 17 that creates tonal variation, embodiments may also comprise additional series strings that are connected in parallel to the first series string. In some embodiments, where the first device includes a plurality of series strings, each of the plurality of series strings is substantially the same as the first series string. In this context, "substantially the same" may refer to when each series string comprises the same number of devices (having substantially the same emissive area) and arranged in the same order as the other series strings. This may provide for a desired tonal variation pattern for a device. An example of this is shown in FIG. 18 (which was described above), where OLEDs 1801 and 1802 in both series strings 1810 and 1811 are the same, and each series string 1810 and 1811 are shown as comprising the same number of OLEDs in the same arrangement. Further examples of such embodiments are shown in FIGS. 3-7. Note that in some embodiments, the position of each OLED within each series string does not affect the current density within in each OLED. The same current and therefore the same current density will flow through each OLED regardless of its position. The position of each OLED within each series string does affect the visual appearance of the panel.

In some embodiments, in the first device as described above, where the first group and the second group of the plurality of OLEDs are electrically connected in a first series string, the first device further comprises a plurality of series strings where at least one of the plurality of series strings is different from the first series string. That is, at least one of the series strings that is connected in parallel with the first series string may comprise, for instance, a different number of OLEDs, OLEDs that have different sizes or shapes of emissive areas, the OLEDs may be arranged in a different order than in the other series strings, etc. As noted above changing the position of an OLED within a series string may not affect the brightness of the individual OLED, but it may affect the visual appearance of the panel. Examples of this are shown in FIGS. 19(a) and (b). In particular, FIG. 19(a) shows two series strings connected in parallel, where the first series string 1910 comprises OLEDs 1901 connected in series with OLED 1902 that has a different emissive area than the OLEDs 1901 (four total OLEDs). The second series string 1911 comprises only three OLEDs (1901-1903), each having three different emissive areas. Thus, the voltage drop across each of the OLEDs in series string 1910 may be different than the voltage drop across each of the OLEDs in series string 1911 because of the different number of OLEDs. Moreover, the different size emissive areas of OLEDs 1901, 1902, and 1903 may create a brightness variation between each of these OLEDs, even within the same series string. FIG. 19(b) shows two series strings 1920 and 1921 that comprise the same number of OLEDs; however, the series string 1920 comprises an OLED 1902 that has a larger emissive area than the each of the OLEDs 1901 in series string 1920, or any of the OLEDs 1901 that are electrically connected in series string 1921.

In some embodiments, in the first device as described above, the first device further comprises a bus line and one or more control resistors electrically coupled to the bus line. At least one of the plurality of OLEDs (i.e. the OLEDs that comprise the first and the second group) is electrically connected in series to one of the control resistors. An example of this is shown in FIG. 10, and was described in detail above. In some embodiments, the control resistors that are electrically connected in series with each of the OLEDs in the first group of the plurality of OLEDs has a different resistance than the control resistors electrically connected in series with each of the OLEDs in the second group of the plurality of OLEDs. For instance, with reference to FIG. 10, the first group may comprise OLED 1001 and the second group may comprise OLED 1002, and the resistance of the resistors 1004 and 1005 (which are connected in series to the OLEDs 1001 and 1002 respectively) may be different. This may result in the current that drives OLED 1001 to be different than the current that drives OLED 1002 (even when the OLEDs have the same emissive area). In some embodiments, the resistance of the control resistors that are electrically connected in series with each of the OLEDs in the first group of the plurality of OLEDs is at least 10% greater than the resistance of the control resistors that are electrically connected in series with each of the OLEDs in the second group of the plurality of OLEDs. While it should be understood that any value for the control resistors may be used to achieve a desired tonal variation of the device, a difference of 10% in the resistance value of the control resistors may result in a noticeable difference in brightness between the devices in many embodiments. It should also be understood that instead of, or in addition to, the use of control resistors, the emissive area of each of the OLEDs may also be varied so as to achieve tonal variation across the device. In some embodiments, the first group of OLEDs may be connected to a control resistor, and the second group of OLEDs may not be connected to a control resistor.

In some embodiments, in the first device as described above that further includes a bus line, the first device comprises a plurality of control resistors, where the plurality of control resistors comprises a first control resistor electrically connected to the first group of the plurality of OLEDs and a second control resistor electrically connected to the second group of the plurality of OLEDs. The first and the second control resistors may comprise different resistances. As noted above, the different resistance values may be used to drive OLEDs (even those that have the same emissive area) at different current densities. In some embodiments, the first resistor has a resistance that is at least 1% greater than the resistance of the second resistor. In some embodiments, the first resistor has a resistance that is at least 5% greater than the resistance of the second resistor. In some embodiments, the first resistor has a resistance that is at least 10% greater than the resistance of the second resistor. These values for the control resistors may be chosen to be greater than the typical resistance values created by components (such as bus lines, electrodes of the OLEDs, etc.), and may be chosen based on a desired application so as to create a desired tonal variation across the device. However, embodiments are not so limited, and the resistances of the control resistors may be the same, and other properties that may affect the current density of the OLEDs may be used to create the brightness variation (e.g. the OLEDs may comprise different size emissive areas).

In some embodiments, in the first device as described above that further includes a bus line and a plurality of control resistors electrically coupled to the bus line, where each of the plurality of OLEDs is electrically connected in series to one of the control resistors, the emissive area of each of the OLEDs in the first group is approximately the same as the emissive area of each of the OLEDs in the second group. However, embodiments are not so limited, and, as noted above, in some embodiments, the emissive area of each of the OLEDs in the first group is not the same as the emissive area of each of the OLEDs in the second group. Indeed, each of these factors (the emissive area and the resistance of the control resistors) may be used in some embodiments to control the brightness of each of the OLEDs. In some embodiments, the emissive area of each of the OLEDs in the first group of the plurality of OLEDs is within 5% of the emissive area of each of the OLEDs in the second group of the plurality of OLEDs. That is, for instance, control resistors may be used in such embodiments whereby the OLEDs have the same (or approximately the same) emissive area so as to create different currents to drive the devices and thereby create tonal variation across the device.

In some embodiments, in the first device as described above that further includes a bus line and a plurality of control resistors electrically coupled to the bus line, where each of the plurality of OLEDs is electrically connected in series to one of the control resistors, each of the control resistors has a resistance between 1Ω and 30 kΩ. Again, this rather large range provides for the various different applications that such embodiments may be used for (e.g. from task lamps to large billboard signage). Therefore, currents, emissive areas of the OLEDs, and other factors may vary widely across applications so as to provide for tonal variation. In some embodiments, each of the control resistors has a resistance that is greater than 15Ω. This may be the case for embodiments such as interior lighting, but is not so limited. In addition, a resistance of 15Ω is typically greater than the internal loses associated with the conductivity of components such as the bus line and/or the conductors that may comprise the electrodes of the OLEDs in many embodiments. For example, the resistance of a typical square of ITO of thickness 1200 A is 15Ω. However, in some embodiments each of the control resistors has a resistance that is greater than 25Ω. In some embodiments each of the control resistors has a resistance that is greater than 50Ω. As noted above, the applications as well as the materials used in the device may vary, but generally the control resistors are chosen so as to purposefully create non-uniformity across the OLEDs of the lighting device. In this respect, it is generally preferred that the resistance across the control resistor should result in an appreciable potential drop across the control resistor in comparison to the potential drop across the OLED measured in the absence of a control resistor. In some embodiments, the potential drop across the control resistor may be less than 1% of the potential drop across the OLED measured in the absence of a control resistor. In some embodiments, the potential drop across the control resistor may be less than 5% of the potential drop across the OLED measured in the absence of a control resistor. In some embodiments, the potential drop across the control resistor may be less than 10% of the potential drop across the OLED measured in the absence of a control resistor.

In some embodiments, in the first device as described above that further includes a bus line and a plurality of control resistors electrically coupled to the bus line, where each of the plurality of OLEDs is electrically connected in series to one of the control resistors, each of the control resistors is connected to a fuse. A "fuse" may refer to a component that is a conductor under normal operation, but when an excess current flows through the conductor, it generates enough heat to burn the conductor or otherwise cause the fuse to open. Excess current could be caused by a current surge from the mains, by the application of excess current from the source or by a defect in one of the OLEDs. In some embodiments, each of the control resistors is a fuse. The use of the control resistor and/or fuse can serve to provide for a more robust lighting device that is tolerant to current surges and may continue to operate within an acceptable performance range even if some of the OLEDs fail.

In some embodiments, in the first device as described above, the OLEDs that comprise the first group of the plurality of OLEDs are electrically connected in series, the OLEDs that comprise the second group of the plurality of OLEDs are electrically connected in series, and the first group and the second group of the plurality of OLEDs are electrically connected in parallel. That is, for instance, one or more OLEDs may be driven by a common current density and may be electrically connected in parallel with one or more OLEDs that are also driven by a common current density, but the two current densities are different. An example of this is shown in FIG. 13, where each of the OLEDs 1301 is the same, but a different current drives String A and String B because the number of OLEDs are different. In this regard, in some embodiments, the first group of the plurality of OLEDs and the second group of the plurality of OLEDs include a different number of OLEDs. Examples of this embodiment were described above with reference to FIGS. 13, 14, 19(*a*) and 20. In some embodiments, where the first group and the second group include a different number of OLEDs, the first group of the plurality of OLEDs includes a plurality of OLEDs each having approximately the same emissive area, the second group of the plurality of OLEDs includes a plurality of OLEDs each having approximately the same emissive area, and the emissive areas of the OLEDs in the first and second groups are approximately the same. Again, this embodiment is illustrated in FIG. 13 by the OLEDs 1301. However, this need not be the case, as in some embodiments, the OLEDs on the same series string and/or on different series strings may vary so to achieve a desired tonal variation of a device. Examples of embodiments wherein the emissive area of the OLEDs on the same series string is different was described with reference to FIGS. 14, 19(*a*) and 19(*b*). In some embodiments, where the first group and the second group include a different number of OLEDs, the first group of the plurality of OLEDs includes a plurality of OLEDs each having approximately the same emissive area, the second group of the plurality of OLEDs includes a plurality of OLEDs each having approximately the same emissive area, and the emissive areas of the OLEDs in the first and second groups are different. This is illustrated in FIG. 20, wherein series String C comprises OLEDs 2001 each having the same emissive area, and series String D comprises OLEDs 2002 each having the same emissive area, and the OLEDs 2001 and 2002 are shown as having different emissive areas. It should be understood that any combination of OLED size and shape, as well as any combination of series and parallel connections, may be used to create a desired tonal variation effect across a panel. For instance, FIG. 14 shows an embodiment whereby series String E comprises a different number of OLEDs than series String F, the OLEDs on String E each have the same emissive area 1401, but the OLEDs on String F are shown to have two different emissive areas (OLEDs 1401 and 1402).

In some embodiments, the first device as described above further includes at least one individually addressable OLED that is not a part of the first group or the second group of the plurality of OLEDs. That is, the device may comprise other OLEDs (such as an indicator light or other OLEDs that provide a portion of the light emitted from the device) that may not be commonly addressable with the OLEDs that comprise the first and second group (i.e. that are commonly addressable and that are driven at different current densities).

In some embodiments, the first device as described above further includes at least one commonly addressable OLED that is not a part of the first group or the second group of the plurality of OLEDs. That is, there may be any number of commonly addressable OLEDs that may be driven at the same current density, or a different current density as the OLEDs in either the first group or the second group of the plurality of OLEDs. In this regard, these devices may provide for further tonal variation across the device, including different patterns. Examples are shown at least in FIG. 8 (comprising four OLEDs 801-804 driven at different current densities); FIG. 10 (comprising three OLEDs 1001-1003 driven at different current densities); and FIG. 19(*a*) (comprising five OLEDs (OLEDs 1901 and 1902 in string 1910, and OLEDs 1901-1903 in string 1911) driven at different current densities). In addition, there may be OLEDs that comprise device structures that are not substantially the same as the device structures of the OLEDs in the first or the second group that are also commonly addressable. These other OLEDs may be used, for instance, to provide for a chromaticity variation of the light emitted from the device.

In some embodiments, the first device as described above further includes a plurality of OLEDs electrically connected in parallel and at least one OLED electrically connected in series with the plurality of OLEDs that are electrically connected in parallel. Exemplary illustrations of OLEDs connected in parallel, which are then electrically connected in series with another OLED are shown in FIGS. 21(*a*) and (*b*).

Figure 21A:
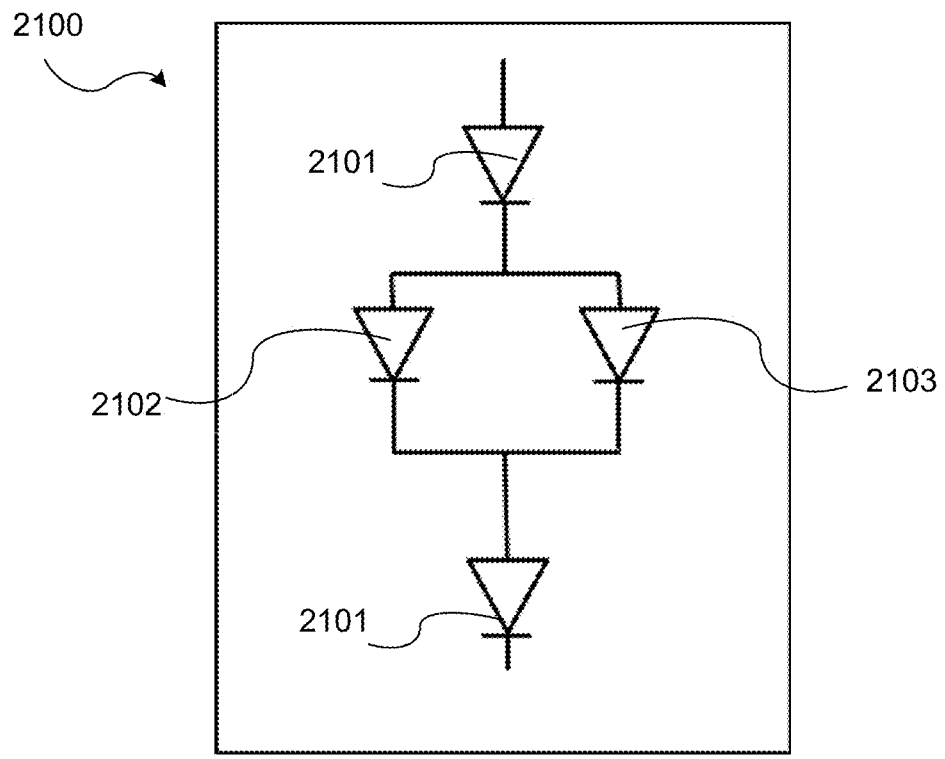
FIGS. 21(a) and (b) show an exemplary configuration of OLEDs electrically connected in series and in parallel in accordance with some embodiments.
Figure 21B:
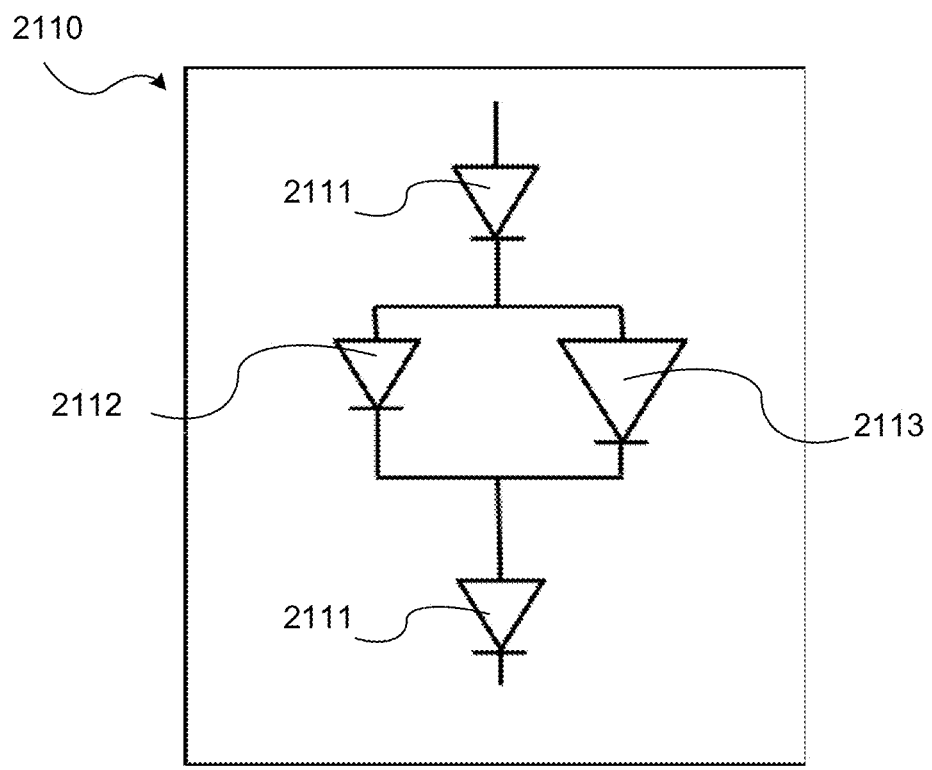

With reference to FIG. 21(*a*), an exemplary embodiment is shown that comprises OLEDs 2102 and 2103 that are shown as electrically connected in parallel. These OLEDs are then electrically connected in series with two OLEDs 2101. As shown, each of the OLEDs 2101-2103 is depicted as having the same emissive area. However, because of the parallel connection between OLEDs 2102 and 2103, these devices will have the same voltage drop but the current supplied by the device 2100 will be divided between these two OLEDs. The exemplary device 2100 therefore will drive OLEDs 2101 at a higher current density than either OLEDs 2102 and 2103 (because the current that flows through OLEDs 2101 is split between OLEDs 2102 and 2103, and each of the OLEDs has the same emissive area). The result is therefore equivalent to the embodiment shown in FIG. 17, where OLEDs 2102 and 2103 essentially have electrical properties similar to a single OLED having a larger emissive area (such as OLED 1703 show in FIG. 17).

The result is that in some embodiments, as shown in FIG. 21(*a*) (where each of the OLEDs are the same size) the OLEDs in parallel (2102 and 2103) will be dimmer than the OLEDs 2101 in series because the OLEDs in parallel have to share the current. The two OLEDs 2102 and 2103 connected in parallel will have the same brightness as each other because they are electrically connected in parallel, and so voltage across each device is the same.

With reference to FIG. 21(*b*), another embodiment showing OLEDs connected in parallel (OLEDs 2112 and 2113) and then connected in series with OLEDs 2111 is shown. As noted above, the two OLEDs 2112 and 2113 electrically connected in parallel will also have the same brightness as each other (even though they are shown as have different size emissive areas) because the voltage across each device is the same. However, each of these OLEDs as shown in the exemplary embodiments in FIG. 21(*b*) will be dimmer than the two OLEDs 2102 and 2103 shown as connected in parallel in FIG. 21(*a*) because total emissive area of the OLEDs 2112 and 2113 is illustrated as being larger, and so the current density driving these OLEDs is lower. Likewise, for the same applied voltage, the OLEDs 2111 electrically connected in series with the parallel connection of OLEDs 2112 and 2113 will be brighter than the OLEDs 2101 shown in FIG. 21(*a*) because the emissive area of the OLEDs connected in parallel is larger. Essentially, the embodiment shown in FIG. 21(*b*) is equivalent to making the large OLED in FIG. 17 (OLED 1703) even larger.

Figure 26B:
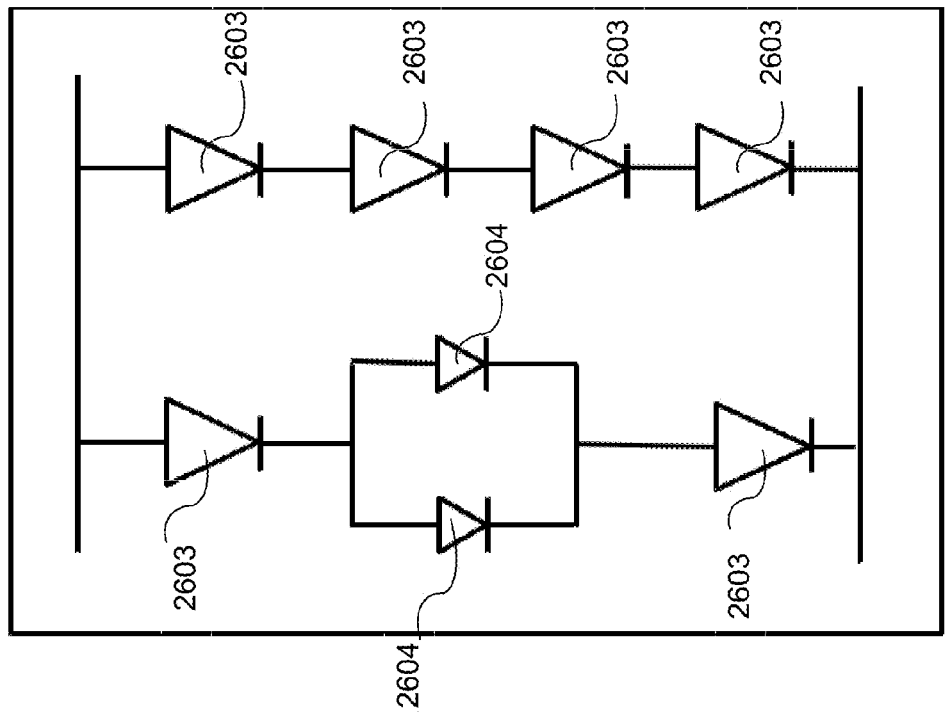
FIGS. 26(a) and (b) show exemplary configurations of OLEDs electrically connected in series and in parallel in accordance with some embodiments.
Figure 26A:
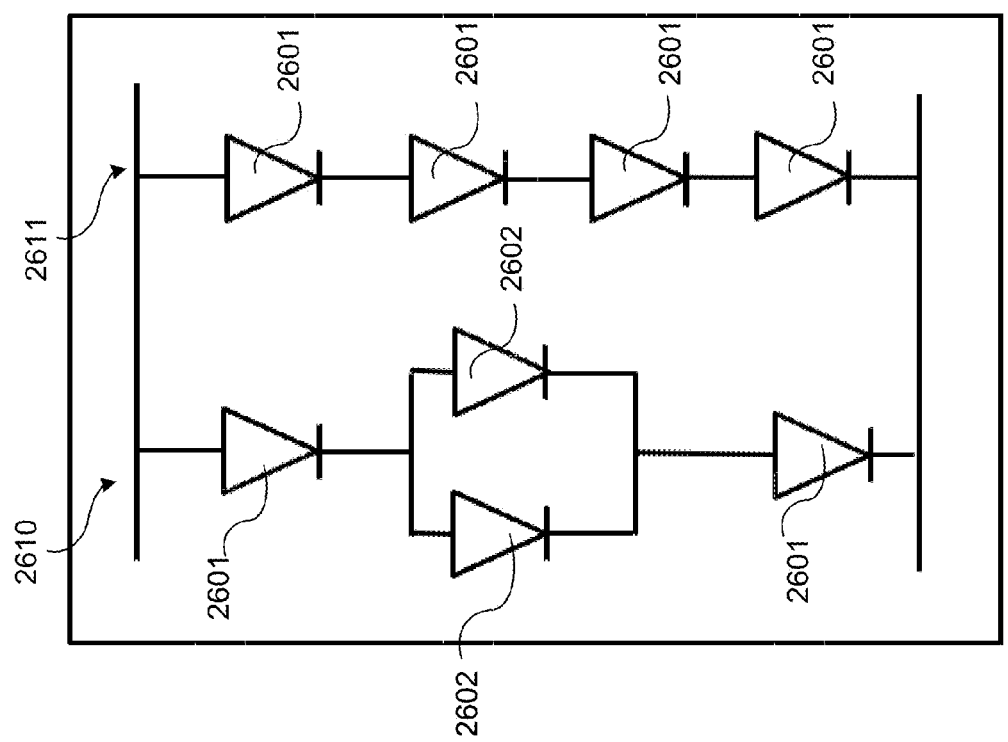

With reference to FIG. 26(*a*) another exemplary embodiment is shown that comprises OLEDs 2602 electrically connected in parallel, and this parallel connection of OLEDs is then electrically connected in series with OLEDs 2601. This embodiment as shown is equivalent to the embodiment shown in FIG. 14, even though the total number of OLED in each series string is not the same (that is, there are four OLEDs in series string 2610, in comparison to only three OLEDs in String F of FIG. 14). This is because the two OLEDs 2602 in parallel in FIG. 26(a) are equivalent to a single OLED having a larger emissive area in respect to the series connection (as shown, each of the OLEDs 2601 and 2602 have the same emissive area, so electrically connecting OLEDs 2602 in parallel is equivalent to having an OLED with an emissive area that is larger than the OLEDs 2601). In this regard, FIG. 26(b) illustrates an embodiment wherein the OLEDs 2604 that are electrically connected in parallel have an emissive area that is smaller than the OLEDs 2603. If, for example, the OLEDs 2604 are configured to have an emissive area that is half of the size of the OLEDs 2603, then the parallel connection of 2604 is equivalent to having a single OLED 2603 connected in series. The result in this exemplary embodiment may then be equivalent to that shown in FIG. 13.

Figure 27:
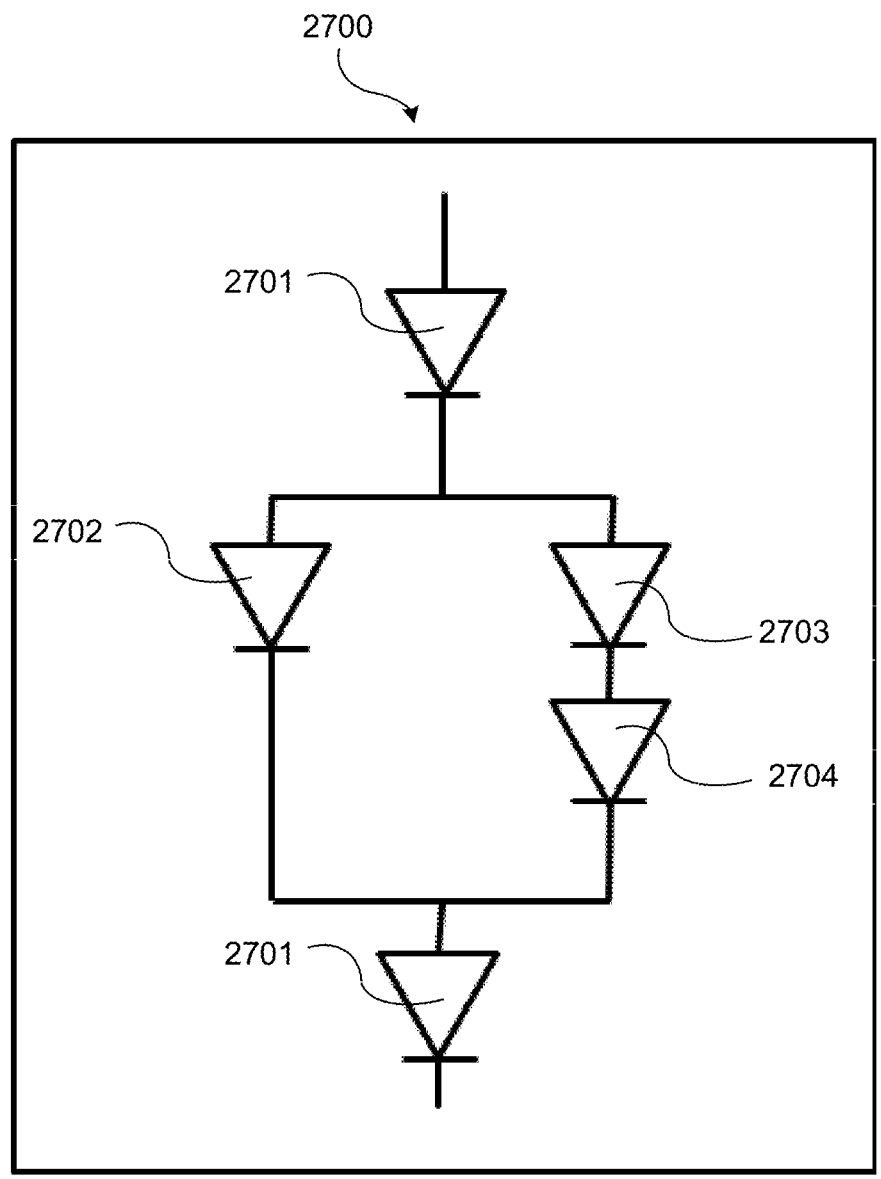
FIG. 27 shows an exemplary configuration of OLEDs electrically connected in series and in parallel in accordance with some embodiments.

With reference to FIG. 27, another exemplary embodiment is shown comprising OLEDs that are connected in series (OLEDs 2703 and 2704), which are connected in parallel with OLED 2702, and this group of three OLEDs is connected in series with two OLEDs 2701, where OLEDs 2701-2704 have equal sized emissive areas. This embodiment may be considered as a combination of the embodiments shown in FIGS. 13 and 17. As shown, with each OLED illustrated as comprising the same emissive area, it is expected that there will be three different brightnesses for the OLEDs. That is, for instance, OLEDs 2701 will be driven by a first current that flows through the entire electrical branch 2700. This current will split at the parallel connection, and be divided between OLED 2702 and OLEDs 2703 and 2704. The voltage drop across OLED 2702 will be the same as the voltage drop across the combination of OLEDs 2703 and 2704 because OLED 2702 is electrically connected in parallel with the series connection of OLEDs 2703 and 2704. Therefore, as illustrated in this exemplary embodiment, the OLEDs 2701 will be the brightest (i.e. driven at the highest current density), followed by OLED 2702, and OLEDs 2703 and 2704 will have same brightness (because they are electrically connected in series) but will be the dimmest.

In some embodiments, in the first device as described above, each of the plurality of OLEDs comprises an emissive area and the emissive area of the plurality OLEDs is disposed over at least 30% of a surface of the substrate. In some embodiments, the emissive area of the plurality OLEDs is disposed over at least 50% of a surface of the substrate. It may be preferred in some embodiments, that the emissive area of the plurality of OLEDs covers a significant portion of the substrate so that the first device may emit a higher amount of light per unit area of the substrate. This may lead to devices having smaller substrates (and thereby the device itself may be smaller). This may be preferred, for instance in embodiments where the first device is a lighting device such as a lamp, where it may be preferred that the device emit as much light per unit area of the substrate as possible. In this regard, in some embodiments, the OLEDs in the first group of the plurality of OLEDs may be tessellated with the OLEDs in the second group of the plurality of OLEDs. Such exemplary designs are shown in FIGS. 3-7. Such exemplary device designs may reduce the amount of area of the substrate that does not comprise an emissive area of an OLED, and thereby increase the light emissions per unit area of the substrate.

It should be understood that the examples provided above were for illustration purposes only, and are not meant to be limiting. Indeed, each of these exemplary embodiments was shown to illustrate some of the principles and combinations that may be possible to provide for variable brightness across an OLED device. As noted above, any combination of OLEDs electrically connected in series or in parallel, of OLEDs electrically connected to different electrical components, and/or of OLEDs comprising different electrical properties such as the size or shape of the emissive area, may be used.

Reduction to Practice and Electrical Model of an Exemplary Device

In addition to the above descriptions and simulations of some of the embodiments of the exemplary devices, the inventors have also fabricated an exemplary device in accordance some of the aspects described above. It should be understood that this device and description are for illustration purposes only, and is not meant to be limiting.

Figure 22:
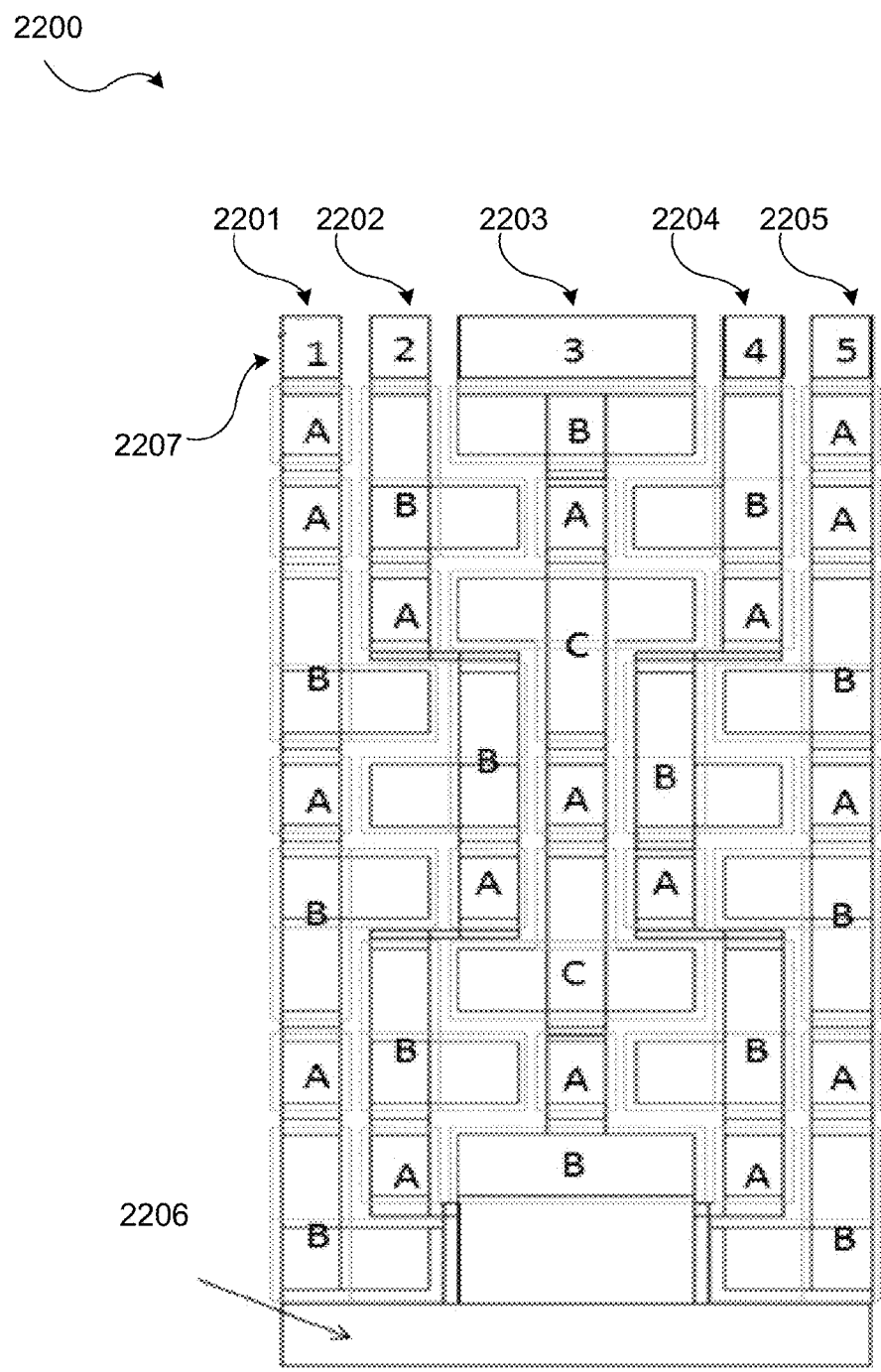
FIG. 22 shows an exemplary lighting panel design that was designed and fabricated in accordance with some embodiments.
Figure 23A:
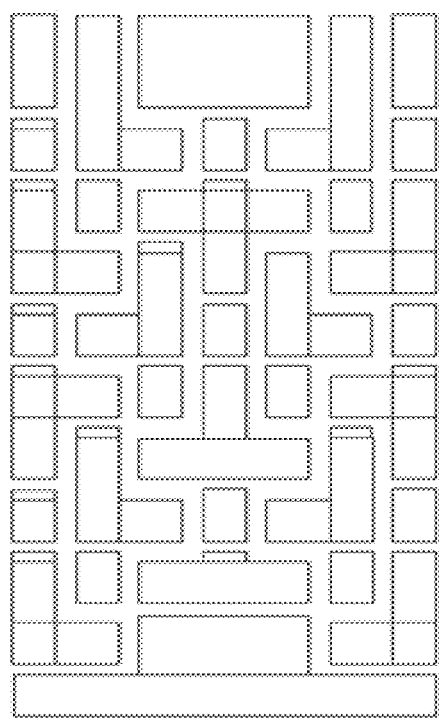
FIG. 23(a) shows a diagram of the anode layer for the exemplary lighting panel design shown in FIG. 22.
Figure 23B:
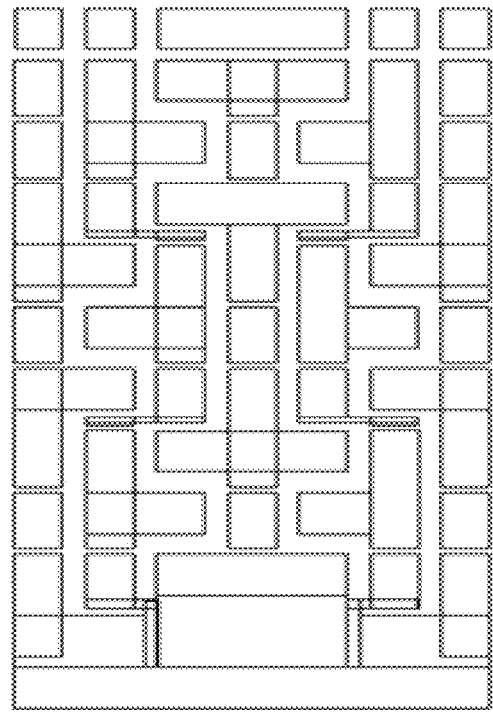
FIG. 23(b) shows a diagram of the cathode layer for the exemplary lighting panel design shown in FIG. 22.
Figure 23C:
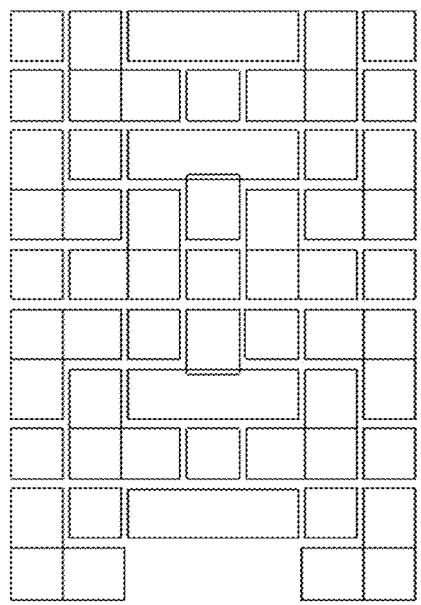
FIG. 23(c) shows a diagram of the organic layer for the exemplary lighting panel design shown in FIG. 22.

In this regard, an exemplary 15 cm×7.5 cm OLED light panel with controlled brightness variation was designed and fabricated. The panel design is shown in FIG. 22. The panel comprises five strings of OLEDs, where the OLEDs in each string are connected in series. The first string 2201 is equivalent to fifth string 2205; the second string 2202 is equivalent to fourth string 2204; and the third string 2203 is unique from the other strings. By "equivalent" it is meant that the strings comprise OLEDs that have substantially the same device structures and emissive areas arranged in the same manner. All of the strings share a common cathode contact 2206, with five individually addressable anode contacts 2207 (labeled as 1, 2, 3, 4, and 5) in FIG. 22. The first string 2201 and fifth string 2205 comprise seven OLED pixels, with two different emissive areas labeled as 'A' and 'B.' The second string 2202 and fourth string 2204 comprise six OLED pixels, with two different emissive areas labeled as 'A' and 'B.' The third string 2203 comprises seven OLED pixels with three different emissive areas labeled as 'A,' 'B,' and 'C.' In each case, the area of the OLEDs labeled as 'A'=0.48 cm$^2$, the area of the OLEDs labeled as 'B'=1.92 cm$^2$ and the area of the OLEDs labeled as 'C'=2.64 cm$^2$. Each of the OLEDs A, B, and C comprise substantially the same device structure. The layouts of the anode, cathode and organic layers that were used to achieve this design are shown in FIG. 23. The layout of anode layer is shown in FIG. 23(a), the layout of the cathode layer is shown in FIG. 23(b), and the layout of the organic layer is shown in FIG. 23(c).

The inventors have also developed an electrical model to simulate the luminance of each OLED pixel for the exemplary panel design described above. The model assumes a plurality of OLEDs are electrically connected in series strings, and that the series strings are electrically connected in parallel. The model can be adapted for any number of OLED pixels, any number of different emissive areas, and any number of strings connected in parallel. The inputs for the model are: (1) current-voltage-luminance (JVL) curves for a small area OLED test pixel of equivalent device structure to that used for each of the OLEDs (i.e. OLEDs having emissive area 'A,' 'B,' and 'C' in this exemplary design) used in the large area OLED panel; (2) voltage applied across the anode and cathode contacts of the OLED panel 2200; (3) number of OLED pixels within each series string; and (4) emissive area of each OLED pixel within each series string. Potential drops across the large area OLED panel electrodes are neglected in this simple model for illustration purposes.

The model works by calculating the distribution of current within each OLED pixel in each series string. The first stage of the model is to fit functions to the JVL curves of the equivalent small area OLED test pixel. The fitted functions are denoted:

$$J = f[V] \tag{1}$$

$$L = g[V] \tag{2}$$

In this work, a $4^{th}$ order polynomial was used to fit the data, such that:

$$J = a_1 + a_2 V + a_3 V^2 + a_4 V^3 + a_5 V^4 \quad (3)$$

$$L = b_1 + b_2 V + b_3 V^2 + b_4 V^3 + b_5 V^4 \quad (4)$$

The JVL data measured for the small area OLED test pixel are given in columns 1-3 of Table 4 below. Also shown in columns 4-5 of Table 4 are $4^{th}$ order polynomial fits to the J vs. V and L vs. V curves for the OLED test pixel. The fitted data closely matches the measured pixel data at each of the voltages.

TABLE 4

JVL data for an equivalent small area OLED text pixel, and data from $4^{th}$ order polynomial fitting to the data.

| Voltage (V) [V] Pixel Data | Current Density (J) [mA/cm²] Pixel Data | Luminance [L] [cd/m²] Pixel Data | Current Density (J) [mA/cm²] Polynomial Fit | Luminance (L) [cd/m²] Polynomial Fit |
|---|---|---|---|---|
| 3.201 | 0.049 | 22 | 0.069 | 32 |
| 3.356 | 0.128 | 58 | 0.145 | 65 |
| 3.510 | 0.265 | 118 | 0.268 | 119 |
| 3.665 | 0.471 | 209 | 0.461 | 204 |
| 3.819 | 0.763 | 335 | 0.744 | 327 |
| 3.974 | 1.160 | 505 | 1.141 | 497 |
| 4.128 | 1.680 | 725 | 1.668 | 720 |
| 4.281 | 2.350 | 1000 | 2.345 | 1002 |
| 4.435 | 3.200 | 1350 | 3.202 | 1352 |
| 4.588 | 4.240 | 1770 | 4.250 | 1772 |
| 4.741 | 5.500 | 2260 | 5.514 | 2269 |
| 4.893 | 6.990 | 2840 | 7.008 | 2844 |
| 5.045 | 8.730 | 3500 | 8.759 | 3504 |
| 5.195 | 10.800 | 4250 | 10.762 | 4243 |
| 5.346 | 13.100 | 5080 | 13.074 | 5077 |
| 5.496 | 15.700 | 6000 | 15.688 | 5999 |
| 5.645 | 18.600 | 7010 | 18.617 | 7008 |
| 5.793 | 21.900 | 8110 | 21.878 | 8105 |
| 5.941 | 25.500 | 9290 | 25.508 | 9297 |

Each of the series strings are connected in parallel, so the total voltage across each series string is the same, and is given by:

$$V_0 = \sum_{m=1}^{M_n} V_{n,m} \quad (5)$$

Where $V_{n,m}$ is the voltage across the mth OLED pixel in the nth series string, and $M_n$ is the number of OLED pixels in nth series string. The same current must flow through all the OLED pixels in a given series string and is given by:

$$J_{n,1} A_{n,1} = J_{n,2} A_{n,2} = \ldots = J_{n,M_n} A_{n,M_n}$$

$$A_{n,1} f[V_{n,1}] = A_{n,2} f[V_{n,2}] = \ldots = A_{M_n} f[V_{n,M_n}]$$

$$A_{n,1}(a + bV_1 + cV_1^2 + \ldots) = A_{n,2}(a + bV_2 + cV_2^2 + \ldots) = \ldots = A_{n,M_n}(a + bV_{m_n} + cV_{M_n}^2 + \ldots) \quad (6)$$

Where $A_{n,m}$ is the emissive area of the mth OLED pixel in the nth series string. A numerical solver can be used to calculate the values $V_{n,m}$ in equations (5) and (6) for a particular panel design. These OLED pixel voltages can then be substituted into equation (3) to determine the current density of each OLED pixel, and into equation (4) to determine the luminance of each OLED pixel. The current along each series string is then given by:

$$I_n = J_{n,m} A_{n,m} \quad (7)$$

If there are N series strings connected in parallel, then the total current $I_0$ flowing through the panel is:

$$I_0 = \sum_{n=1}^{N} I_n \quad (8)$$

Where $I_n$ is the current flowing along the nth series string.

In the work described herein, the solver function of Microsoft Excel™ was used to solve equations (5) and (6). Table 5 below lists the simulation results for the OLED pixels in each string for the exemplary panel design shown in FIG. 22. Simulation results for the fourth string 2204 and the fifth string 2205 are not included because, as noted above, these strings are equivalent to the second 2202 and first 2201 strings, respectively. As shown, The exemplary electrical model predicts there will be seven different luminance levels on the panel. The greatest expected difference in luminance is approximately 14× between the OLED pixel A in the second string 2202 and OLED pixel C in the third string 2203.

TABLE 5

Simulated luminance of the different OLED pixels for the exemplary panel design in FIG. 22. The simulation assumes an input Voltage V = 30 V.

| | $V_{in}$ = 30 V | | | | | | |
|---|---|---|---|---|---|---|---|
| | String 2201 | | String 2202 | | String 2203 | | |
| | Current I [mA] | | | | | | |
| | 1.915 | | 7.447 | | 2.488 | | |
| Pixel | A | B | A | B | A | B | C |
| Area [cm²] | 0.48 | 1.92 | 0.48 | 1.92 | 0.48 | 1.92 | 2.64 |
| Current Density [mA/cm²] | 4.01 | 1.00 | 15.25 | 3.81 | 5.24 | 1.31 | 0.95 |
| Luminance [cd/m²] | 1,678 | 438 | 5,846 | 1,598 | 2,163 | 569 | 417 |
| Normalized Luminance | 0.29 | 0.07 | 1.00 | 0.27 | 0.37 | 0.10 | 0.07 |

Figure 24:
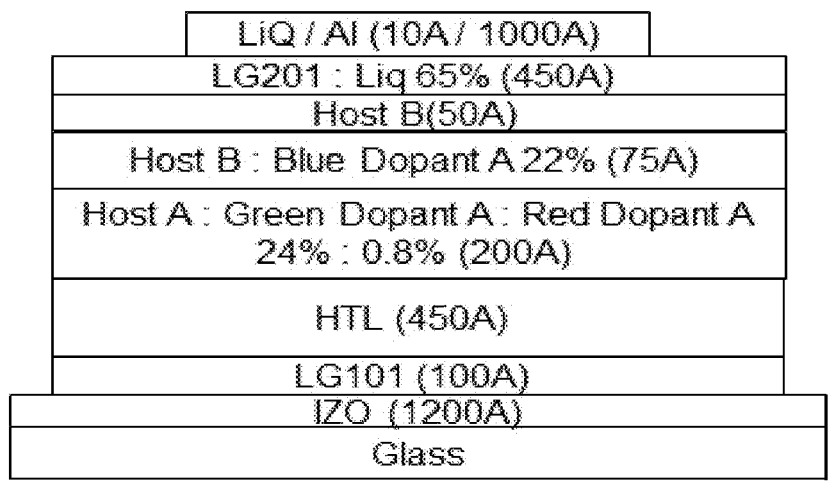
FIG. 24 shows an exemplary organic light emitting device.

To verify the functionality of some of the embodiments disclosed herein and to show the validity of the electrical model described above, as noted above, a 15 cm×7.5 cm OLED panel with controlled brightness variation was fabricated using the panel design shown in FIG. 22. At the same time, a small area test pixel device was fabricated having substantially the same device structure as the OLEDs utilized in the panel. The details of the OLED stack are as follows: An anode layer of 1200 Å thickness IZO was deposited by sputtering onto a 0.7 mm thickness soda lime glass substrate. For the exemplary panel, the anode layout is shown in FIG. 23(a). This was followed by deposition of the organic layers, which were deposited by vacuum thermal evaporation (VTE). For the exemplary panel, the layout of the organic layer is shown in FIG. 23(c). The organic stack comprised: a 100 Å thickness hole injection layer (HIL) of LG101 (purchased from LG Chemical Co., Korea); a 450 Å thickness hole transport layer (HTL) of NPD; a 200 Å thickness first emissive layer (EML) comprising Host A with 24% wt. Green Dopant A and 0.8% wt. Red Dopant A; a 75 Å thickness second emissive layer comprising Host B with 22% wt. Blue Dopant A; a 50 Å thickness hole blocking layer (BL) of Host B; a 450 Å thickness electron transport layer (ETL) of LG201 (purchased from LG Chemical Co., Korea) doped with 65% wt. Liq; and a 10 Å thickness electron injection layer (EIL) of Liq. A cathode of 1000 Å thickness Al was then deposited by VTE onto the organic stack. For the exemplary panel, the cathode layout is shown in FIG. 23(b). The OLED stack is shown in FIG. 24.

Figure 25:
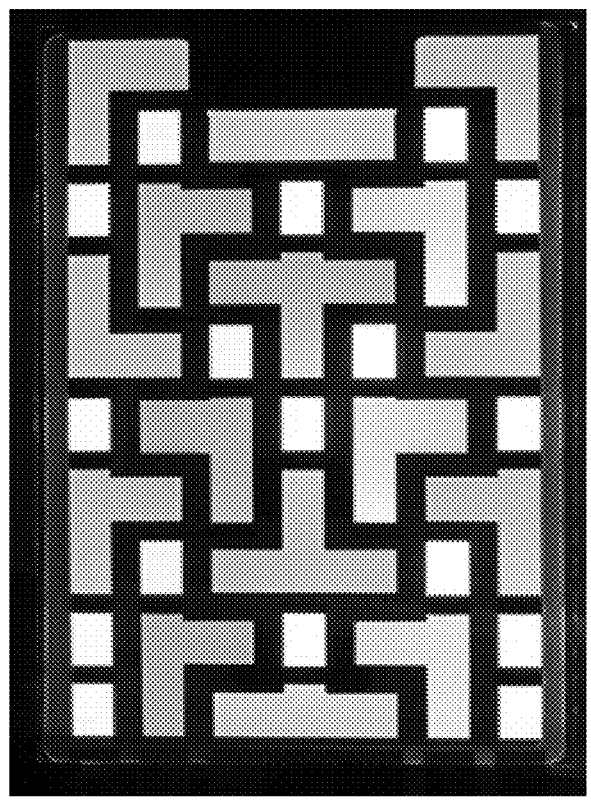
FIG. 25 is a photograph taken of the exemplary device having the panel layout shown in FIG. 22 when illuminated.

FIG. 25 shows a photograph of the finished exemplary OLED panel while illuminated. The different luminance levels of the OLED pixels are very clear. Operating at J=10 mA/cm², the electroluminescence spectra of the equivalent small area OLED test pixel was measured at normal incidence using a PR705 spectrophotometer. The OLED test pixel emitted white light with CIE 1931 (x, y)=(0.472, 0.418) when operating at current density J=10 mA/cm². Operating at the same current density, the OLED pixels on the large area OLED panel emitted white light with CIE 1931 (x, y)=(0.478, 0.434). While the white emission from the panel and equivalent OLED test pixel are similar, they are not identical. The slight difference in chromaticity can be attributed to run-to-run variation in device fabrication.

To verify the accuracy of the electrical model, the OLED panel was driven at V=30 V using a Keithley 2420-C SourceMeter, and the luminance of the different OLED pixels was measured at normal incidence using a PR705 spectrophotometer. Table 6 lists the measured current and luminance for the different OLED pixels on the strings 2201-2203 in the exemplary panel shown in FIG. 22. For the irregular shaped OLED pixels B, luminance was measured at three different locations on the pixel and an average luminance was then calculated.

TABLE 6

Measured luminance of the different OLED pixels for the exemplary panel design in FIG. 22. The panel was driven at an input Voltage V = 30 V.

| | $V_{in}$ = 30 V | | | | | | |
|---|---|---|---|---|---|---|---|
| | String 2201 | | String 2202 | | String 2203 | | |
| | | | Current I [mA] | | | | |
| | 1.389 | | 3.970 | | 1.812 | | |
| Pixel | A | B | A | B | A | B | C |
| Area [cm²] | 0.48 | 1.92 | 0.48 | 1.92 | 0.48 | 1.92 | 2.64 |
| Current Density [mA/cm²] | 2.89 | 0.72 | 8.27 | 2.07 | 3.775 | 0.94 | 0.686 |
| Luminance [cd/m²] | 1,481 | 408 | 4,071 | 1,150 | 1,926 | 526 | 418 |
| Normalized Luminance | 0.36 | 0.10 | 1.00 | 0.28 | 0.32 | 0.13 | 0.10 |

The different luminance levels of the different OLED pixels is very clearly shown in the results in Table 6, with a maximum variation of approximately 10× between OLED pixel A in the second string 2202 and OLED pixel C in the first string 2201. For each of the OLED pixels in the exemplary device, the measured luminances are lower than the luminances predicted by the electrical model (shown in Table 5). This difference may be attributed to the slight difference in emission chromaticity of the devices (e.g. difference resulting from the normal fabrication process of the OLED devices) and to potential drops arising from resistive loss in distributing charge across a large area panel (e.g. in the relatively high resistance transparent electrodes, etc). This causes the potential across the organic stack to be slightly lower for the OLED pixels in the exemplary large area OLED panel than for an equivalent small area OLED test pixel. This reduces the current density flowing through the OLED pixels in the panel, which in turn reduces the luminance. This is particularly noticeable for the second string 2202, where the narrow contact bridges may increase the potential drop. Nevertheless, the correlation between the experimental model and exemplary panel fabrication is still very strong, as shown by the final rows of Tables 5 and Table 6, which give normalized luminance relative to the brightest OLED pixel on the panel.

It is understood that the various embodiments described herein are by way of example only, and are not intended to limit the scope of the invention. For example, many of the materials and structures described herein may be substituted with other materials and structures without deviating from the spirit of the invention. The present invention as claimed may therefore include variations from the particular examples and preferred embodiments described herein, as will be apparent to one of skill in the art after reading this disclosure. It is understood that various theories as to why the invention works are not intended to be limiting.

A recitation of "a", "an" or "the" is intended to mean "one or more" unless specifically indicated to the contrary.

What is claimed is:

1. A first device comprising:
   a substrate;
   a plurality of OLEDs disposed on the substrate; wherein each OLED further comprises:
   a first electrode;

a second electrode; and
an organic electroluminescent (EL) material disposed between the first and the second electrodes;
wherein each of the plurality of OLEDs is commonly addressable;
wherein the plurality of OLEDs comprises a first group and a second group;
wherein each of the OLEDs in the first group of the plurality of OLEDs is patterned and electrically connected such that each OLED in the first group is driven at a first current density;
wherein each of the OLEDs in the second group of the plurality of OLEDs is patterned and electrically connected such that each OLED in the second group is driven at a second current density that is different from the first current density;
wherein at least one of the OLEDs in the first group of the plurality of OLEDs emits light having a first point on the CIE 1976 (L*, u*, v*) color space chromaticity diagram;
wherein at least one of the OLEDs in the second group of the plurality of OLEDS emits light having a second point on the CIE 1976 (L*, u*, v*) color space chromaticity diagram; and
wherein the difference between the first point and the second point has a duv value that is less than approximately 0.10.

2. The device of claim 1, wherein the difference between the first point and the second point has a duv value that is less than approximately 0.05.

3. The device of claim 1, wherein at least one of the OLEDs in the first group has substantially the same device structure as at least one of the OLEDs in the second group.

4. The device of claim 1, wherein the first group and the second group of the plurality of OLEDs each comprise a plurality of OLEDs.

5. The device of claim 1, wherein at least one of the first group or the second group of the plurality of OLEDs comprises only a single OLED.

6. The device of claim 1, wherein each of the plurality of OLEDs has substantially the same device structure.

7. The device of claim 1, wherein the organic EL material of each of the plurality of OLEDs is common to substantially all of the plurality of OLEDs.

8. The device of claim 1, wherein each of the plurality of OLEDs emits approximately white light having Duv<0.010.

9. The device of claim 1, wherein each of the OLEDs of the plurality of OLEDs has an emissive area that is approximately within the range of 0.1 cm$^2$ to 100 cm$^2$.

10. The device of claim 9, wherein each of the OLEDs has an emissive area that is greater than approximately 0.5 cm$^2$.

11. The device of claim 9, wherein each of the OLEDs has an emissive area that is greater than approximately 2 cm$^2$.

12. The device of claim 1, wherein the first current density is at least approximately 20% greater than the second current density.

13. The device of claim 12, wherein the first current density is at least approximately 50% greater than the second current density.

14. The device of claim 13, wherein the first current density is at least approximately 100% greater than the second current density.

15. The device of claim 1, wherein the first current density is at least between approximately 20% and 100% greater than the second current density.

16. The device of claim 1, wherein the luminance of each of the OLEDs in the first group of the plurality of OLEDs is greater than the luminance of each of the OLEDs in the second group of the plurality of OLEDs.

17. The device of claim 16, wherein the luminance of each of the OLEDs in the first group of the plurality of OLEDs is at least 20% greater than the luminance of each of the OLEDs in the second group of the plurality of OLEDs.

18. The device of claim 17, wherein the luminance of each of the OLEDs in the first group of the plurality of OLEDs is at least 50% greater than the luminance of each of the OLEDs in the second group of the plurality of OLEDs.

19. The device of claim 1, wherein the first group and the second group of the plurality of OLEDs are electrically connected in series.

20. The device of claim 19, wherein each OLED comprises an emissive area; and
wherein the emissive area of each OLED in the first group of the plurality of OLEDs is different than the emissive area of each OLED in the second group of the plurality of OLEDs.

21. The device of claim 20, wherein the emissive area of each OLED in the first group is at least 20% larger than the emissive area of each OLED in the second group.

22. The device of claim 20, wherein the emissive area of each OLED in the first group is at least 50% larger than the emissive area of each OLED in the second group.

23. The device of claim 20,
wherein the emissive area of each OLED in the first group of the plurality of OLEDs comprises a first shape; and
wherein the emissive area of each OLED in the second group of the plurality of OLEDs comprises a second shape that is different than the first shape.

24. The device of claim 19, wherein the first group and the second group of the plurality of OLEDs are electrically connected in a first series string; and wherein the first device comprises one or more series strings that are electrically connected in parallel with the first series string.

25. The device of claim 24, further comprising a plurality of series strings, wherein each of the plurality of series strings are substantially the same as the first series string.

26. The device of claim 24, further comprising a plurality of series strings, wherein at least one of the plurality of series strings is different than the first series string.

27. The device of claim 24, wherein the first series string is connected in parallel with a second series string; and wherein the second series string comprises a plurality of OLEDs having substantially the same emissive area.

28. The device of claim 24, wherein the first series string is connected in parallel with a second series string; wherein the second series string comprises a plurality of OLEDs; and wherein at least two of the plurality of OLEDs in the second series string have different emissive areas.

29. The device of claim 1, further comprising:
a bus line; and
one or more control resistors electrically coupled to the bus line;
wherein at least one of the plurality of OLEDs is electrically connected in series to one of the control resistors.

30. The device of claim 29, wherein the control resistors electrically connected in series with each of the OLEDs in the first group of the plurality of OLEDs has a different resistance than the control resistors electrically connected in series with each of the OLEDs in the second group of the plurality of OLEDs.

31. The device of claim 30, wherein the resistance of the control resistors electrically connected in series with each of the OLEDs in the first group of the plurality of OLEDs is at least 10% greater than the resistance of the control resistors electrically connected in series with each of the OLEDs in the second group of the plurality of OLEDs.

32. The device of claim 29,
wherein the first device comprises a plurality of control resistors that comprises a first control resistor electrically connected to the first group of the plurality of OLEDs and a second control resistor electrically connected to the second group of the plurality of OLEDs; and
wherein the first and the second control resistors comprise different resistances.

33. The device of claim 32, wherein the first resistor has a resistance that is at least 1% greater than the resistance of the second resistor.

34. The device of claim 32, wherein the first resistor has a resistance that is at least 5% greater than the resistance of the second resistor.

35. The device of claim 32, wherein the first resistor has a resistance that is at least 10% greater than the resistance of the second resistor.

36. The device of claim 32, wherein each of the plurality of OLEDs has an emissive area; and
wherein the emissive area of each of the OLEDs in the first group is approximately the same as the emissive area of each of the OLEDs in the second group.

37. The device of claim 32, wherein the emissive area of each of the OLEDs in the first group of the plurality of OLEDs is within 5% of the emissive area of each of the OLEDs in the second group of the plurality of OLEDs.

38. The device of claim 29, wherein each of the of the control resistors has a resistance between 1Ω and 30 kΩ.

39. The device of claim 29, wherein the each of the of the control resistors has a resistance that is greater than 15Ω.

40. The device of claim 29, wherein the each of the of the control resistors has a resistance that is greater than 25Ω.

41. The device of claim 29, wherein the each of the of the control resistors has a resistance that is greater than 50Ω.

42. The device of claim 29, wherein each of the control resistors is connected to a fuse.

43. The device of claim 29, wherein each of the control resistors is a fuse.

44. The device of claim 1,
wherein the OLEDs comprising the first group of the plurality of OLEDs are electrically connected in series;
wherein the OLEDs comprising the second group of the plurality of OLEDs are electrically connected in series; and
wherein the first group and second group of the plurality of OLEDs are electrically connected in parallel.

45. The device of claim 44,
wherein the first group of the plurality of OLEDs and the second group of the plurality of OLEDs comprise a different number of OLEDs.

46. The device of claim 45,
wherein the first group of the plurality of OLEDs comprises a plurality of OLEDs each having approximately the same emissive area;
wherein the second group of the plurality of OLEDs comprises a plurality of OLEDs each having approximately the same emissive area; and
wherein the emissive area of each of the OLEDs in the first and second groups is approximately the same.

47. The device of claim 44,
wherein the first group of the plurality of OLEDs comprises a plurality of OLEDs each having approximately the same emissive area;
wherein the second group of the plurality of OLEDs comprises a plurality of OLEDs each having approximately the same emissive area; and
wherein the emissive areas of each of the OLEDs in the first and second groups is different.

48. The device of claim 1, wherein the first device further comprises at least one individually addressable OLED that is not a part of the first group or the second group of the plurality of OLEDs.

49. The device of claim 1, further comprising:
a plurality of OLEDs electrically connected in parallel; and
at least one OLED electrically connected in series with the plurality of OLEDs that are electrically connected in parallel.

50. The device of claim 49,
wherein the OLED electrically connected in series with the plurality of OLEDs that are electrically connected in parallel is in the first group of the plurality of OLEDs; and
wherein at least one of the plurality of OLEDs electrically connected in parallel is in the second group of the plurality of OLEDs.

51. The device of claim 49, wherein the emissive area of each of the plurality of OLEDs that are electrically connected in parallel is approximately the same.

52. The device of claim 49, wherein the emissive area of at least one OLED of the plurality of OLEDs that are electrically connected in parallel is different from at least one other OLED of the plurality of OLEDs that are electrically connected in parallel.

53. The device of claim 1,
wherein each of the plurality of OLEDs comprises an emissive area;
and wherein the emissive area of the plurality OLEDs is disposed over at least 30% of a surface of the substrate.

54. The device of claim 53, wherein the emissive area of the plurality OLEDs is disposed over at least 50% of a surface of the substrate 55. The device of claim 1, wherein the OLEDs in the first group of the plurality of OLEDs are tessellated with the OLEDs in the second group of the plurality of OLEDs.

* * * * *